United States Patent [19]

Nakagawa et al.

[11] Patent Number: 4,888,062
[45] Date of Patent: Dec. 19, 1989

[54] PIN JUNCTION PHOTOVOLTAIC ELEMENT HAVING I-TYPE SEMICONDUCTOR LAYER COMPRISING NON-SINGLE CRYSTAL MATERIAL CONTAINING AT LEAST ZN, SE AND H IN AN AMOUNT OF 1 TO 4 ATOMIC %

[75] Inventors: Katsumi Nakagawa, Nagahama; Masahiro Kanai, Tokyo; Shunichi Ishihara; Kozo Arao, both of Hikone; Yasushi Fujioka, Nagahama; Akira Sakai, Nagahama; Tsutomu Murakami, Nagahama, all of Japan

[73] Assignee: Canon Kabushiki Kaisha, Tokyo, Japan

[21] Appl. No.: 236,792

[22] Filed: Aug. 26, 1988

[30] Foreign Application Priority Data

Aug. 31, 1987 [JP] Japan .................. 62-217492
Oct. 5, 1987 [JP] Japan .................. 62-249856

[51] Int. Cl.$^4$ .................................. H01L 31/06
[52] U.S. Cl. ........................ 136/258; 136/260; 136/264; 136/265; 357/16; 357/30; 357/58; 357/59; 357/61
[58] Field of Search ............. 136/258 PC, 258 AM, 136/260, 264, 265; 357/30 B, 30 E, 30 J, 30 K, 16, 61, 63, 59 D, 58

[56] References Cited

U.S. PATENT DOCUMENTS 4,596,645 6/1986 Stirn .................. 204/192.25

Primary Examiner—Aaron Weisstuch
Attorney, Agent, or Firm—Fitzpatrick, Cella, Harper & Scinto

[57] ABSTRACT

An improved pin junction photovoltaic element which generates photoelectromotive force by the junction of a p-type semiconductor layer, an i-type semiconductor layer and an n-type semiconductor layer, characterized in that at least said i-type semiconductor layer comprises a member selected from the group consisting of a ZnSe:H deposited film containing the hydrogen atoms in an amount of 1 to 4 atomic % and crystal grain domains in a proportion of 65 to 85 vol % per unit volume and a $ZnSe_{1-x}Te_x$:H deposited film containing the hydrogen atoms in an amount of 1 to 4 atomic % and crystal grain domains in a proportion of 65 to 85 vol % per unit volume and also containing the selenium atoms and the tellurium atoms in a Se/Te quantitative ratio of 1:9 to 3:7.

The pin junction photovoltaic element exhibits an improved photoelectric conversion efficiency for short-wavelength light and has a high open-circuit voltage. The pin junction photovoltaic element does not exhibit any undesirable light-induced fatigue even upon continuous use for a long period of time.

8 Claims, 23 Drawing Sheets

PIN JUNCTION PHOTOVOLTAIC ELEMENT HAVING I-TYPE SEMICONDUCTOR LAYER COMPRISING NON-SINGLE CRYSTAL MATERIAL CONTAINING AT LEAST ZN, SE AND H IN AN AMOUNT OF 1 TO 4 ATOMIC %

FIELD OF THE INVENTION

The present invention relates to an improved photovoltaic element which is usable as a power source for electric appliances and also as a power generator. More particularly, it relates to an improved pin junction photovoltaic element which exhibits a high photoelectric conversion efficiency, particularly for short-wavelength light.

BACKGROUND OF THE INVENTION

There have been proposed a variety of pin junction photovoltaic elements for solar cells and for power sources in various electric appliances. Such photovoltaic elements are formed by ion implantation or thermal diffusion of an impurity into a single crystal substrate of silicon (Si) or gallium arsenide (GaAs), or by epitaxial growth of an impurity-doped layer on said single crystal substrate. However, there is a disadvantage for these photovoltaic elements that their production cost unavoidably becomes high because of: using said single crystal substrate. Because of this, they have not yet gained general acceptance for use as solar cells or as a power source in electric appliances.

Recently, there has been proposed a photovoltaic element in which there is utilized a pin junction of amorphous silcon (hereinafter referred to as "A-Si") deposited film formed on an inexpensive non-single crystal substrate of glass, metal, ceramics or synthetic resin by way of the glow discharge decomposition method. This photovoltaic element has a nearly satisfactory performance and is of low production cost and because of this, it has been recognized as usable as a power source for some kinds of appliances such as electronic calculators and wrist watches.

However, for this photovoltaic element, there is a disadvantage that the output voltage is low because the band gap of the A-Si film constituting the element is about 1.7 eV, which is not large enough. There is another disadvantage that its photoelectric conversion efficiency is low for a light source such as fluorescent light which contains short-wavelength light in a dominant proportion, so that its application is limited to appliances with very small power consumption.

There is a further disadvantage for said photovoltaic element that the constituent A-Si film is often affected by the so-called Staebler-Wronski effect, in which the film characteristics are deteriorated upon continuous irradiation with intense light for a long period of time.

For a photovoltaic element to be utilized as a power supplying solar cell, it is necessary to convert efficiently and continuously the light energy of sunlight into electric energy, and hense, it is desired to have such a layer structure that permits photoelectric conversion for sunlight over as broad a spectrum range as possible.

Now, in the case of a photovoltaic element which is made using a semiconductor material having a small band gap energy, the wavelength region of light to be absorbed by the layer is extended from the short wavelength side to the long wavelength side. However, in this case, it is the long-wavelength component of sunlight alone that contributes to photoelectric conversion, and the energy of the short-wavelength component is not utilized for photoelectric conversion. This is because the amount of energy to be outputted by the photoelectric conversion is decided by the band gap energy of the semiconductor material as used.

On the other hand, in the case of photovoltaic element which is made using a semiconductor material having a large band gap energy, the wavelength component which is absorbed by the layer and comes to contribute to photoelectric conversion is the short wavelength light having an energy exceeding the band gap energy of the semiconductor material, and the long-wavelength component is not utilized for photoelectric conversion.

In a photovoltaic element, the maximum voltage or open circuit voltage (Vox) to be outputted is determined by the band gap energy values of the semi-conductor materials utilized. In view of this, in order to obtain a high Voc, semiconductor materials having a large band gap energy are desired to be used.

Therefore, there is eventually a limit for the photoelectric conversion efficiency for a photovoltaic element prepared by using the sole semiconductor material.

The foregoing led to the idea of forming a plurality of photovoltaic elements using a plurality of semiconductor materials each having a different band gap energy, so that the individual photovoltaic elements become responsible for utilizing the different wavelength regions of sunlight. This idea was expected to contribute to an improvement in the photoelectric conversion efficiency.

However, there is a disadvantage for the solar cell having such a structure as mentioned above in that overall high photoelectric conversion is possible only in the case where the individual photovoltaic elements have good characteristics, because it is of such structure that a plurality of photovoltaic elements are stacked to form an electrically serial structure.

Unfortunately, for the photovoltaic element having the foregoing structure, there has not yet been realized any desirable one wherein the respective constitutent elements as stacked have satisfactory values of band gap energy and satisfactory characteristics as desired and provides a high Voc as the photovoltaic element.

There have been proposed direct transition-type semiconductor films having a wide band gap, such as ZnSe (having a band gap of 2.67 eV) and ZnTe (having a band gap of 2.26 eV) and mixed crystals thereof $ZnSe_{1-x}Te_x$ (where 0,x,1). Public attention has been focused on these semiconductor films. These semiconductor films are, in general, formed on a single crystal substrate by way of epitaxial growth. The as-grown film of ZnSe exhibits n-type conductivity and the as-grown film of ZnTe exhibits p-type conductivity. However, for any of these films, it is generally recognized that it is difficult for the film to exhibit opposite type conductivity. Further, in order to carry out the epitaxial growth for the film formation, it is required to use a specific single crystal substrate and to maintain the substrate at elevated temperature. And in this film formation, the deposition rate is low. Because of this, it is impossible to perform epitaxial growth on a commercially available substrate which is inexpensive and low heat-resistant such as glass and synthetic resin. These factors make it difficult to develop practically applicable semiconductor films using the foregoing commercially available substrates.

Even in the case where a semiconductor film should be fortunately formed on such commercially available substrate, the film will be such that is usable only in very limited applications.

There have been various proposals to form a direct transition-type semiconductor film on a non-single crystal substrate such as glass, metal, ceramics and synthetic resin. However, under any of such proposals, it is difficult to obtain a desired direct transition-type semiconductor film having satisfactory electrical characteristics because the resulting film is accompanied with defects of various kinds which make the film poor in electrical characteristics and on account of this, it is difficult for the film to be controlled by doping it with an impurity.

In the meantime, an amorphous film comprised of Zn and Se elements can be found in prior art references. As such prior art references, there are U.S. Pat. No. 4,217,374 (hereinafter, called "literature 1") and U.S. Pat. No. 4,226,88 (hereinafter, called "literature 2"). And ZnSe compound is described in Japanese Patent Laid-open No. 189649/1986 (hereinafter, called "literature 3") and Japanese Patent Laid-open No. 189650/1986 (hereinafter, called "literature 4").

Now, literature 1 discloses amorphous semiconductor films containing selenium (Se) or tellurium (Te), and zinc (Zn), hydrogen (H) and lithium (Li); but the principal subject is an amorphous selenium semiconductor film or an amorphous tellurium semiconductor film, and the Zn described therein is merely an additive, as are Li and H. And as for the Zn and the Li likewise in the case of the H, they are used for reducing the local state density in the band gap without changing the inherent characteristics of the film. In other words, the incorporation of Zn into the amorphous Se or the amorphous Te in literature 1 is not intended to positively form a ZnSe compound or ZnTe compound. Incidentally, literature 1 mentions nothing about the formation of ZnSe compound, ZnTe compound, $ZnSe_{1-x}Te_x$ compound, ZnSe crystal grains, ZnTe crystal grains or $ZnSe_{1-x}Te_x$ crystal grains. And as for the addition of Li, it should be noted that it is not added as a dopant.

Literature 2 does not mention amorphous semiconductor films containing Se or Te, and Zn, and H. However, it deals mainly with amorphous silicon, and it defines Se and Te as elements which form compounds with said silicon. As for the Zn, it si defined as an element which sensitizes the photoconductivity and reduces the local state density in the energy gap. In other words, the additions of Zn and Se are not intended to form a ZnSe compound, ZnTe compound or $ZnSe_{1-x}Te_x$ compound. Incidentally, literature 2 mentions nothing about the formation of a ZnSe compound, ZnTe compound, $ZnSe_{1-x}Te_x$ compound, ZnSe crystal grains, ZnTe crystal grains or $ZnSe_{1-x}Te_x$ crystal grains.

Literature 3 and literature 4 are concerned with the deposition of a ZnSe film by the HR-CVD method (hydrogen radical assisted CVD method). This is, they disclose methods of improving the deposition rate and the productivity of a deposited film; and they merely mention deposited films of non-doped ZnSe.

Against this background, there is an increased social demand to provide an inexpensive photovoltaic element having a high photoelectric conversion efficiency, particularly, for short-wavelength light which may be practically usable as a solar cell and also as a power source in various electric appliances.

SUMMARY OF THE INVENTION

The present invention is aimed at solving the aforementioned problems relating to photovoltaic elements for use in solar cells and other appliances and satisfying the foregoing social demand.

It is therefore an object of the present invention to provide an improved pin junction photovoltaic element usable in devices typified by a solar cell with the use of an improved functional deposited film which may be desirably formed even on a commercially available inexpensive non-single crystal substrate of glass, metal, ceramics or synthetic resin and which may form a desired pin junction with other films to be formed on such substrate.

Another object of the present invention is to provide an improved pin junction photovoltaic element which provides a high photoelectric conversion particularly for short-wavelength light and which is usable in devices typified by a solar cell. cl BRIEF DESCRIPTION OF THE DRAWINGS FIG. 1(A) is a schematic representation showing a typical layer structure of the pin junction photovoltaic element according to the present invention.

DETAILED DESCRIPTION OF THE INVENTION

Figure 1A:
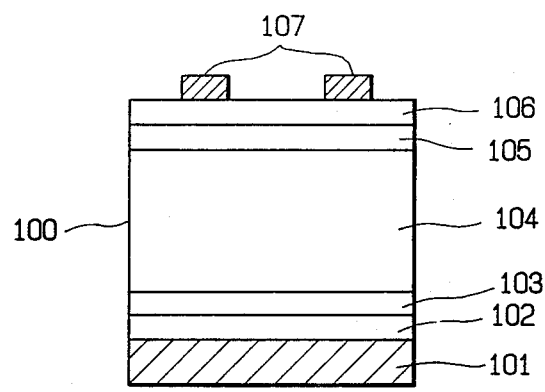
Fig.1(B) is a schematic representation showing another typical layer structure of the pin junction photovoltaic element according to the present invention.
Fig.1(C) is a schematic representation showing the layer structure of a conventional A-Si based photovoltaic element prepared in a Comparative Example.

The present inventors have made extensive studies for overcoming the foregoing problems not only of the known ZnSe films but also the known $ZnSe_{1-x}Te_x$ films for use in various devices such as solar cells and attaining the objects as described above and as a result, have accomplished the present invention based on the findings obtained through various experiments as below described.

That is, as a result of preparing a ZnSe deposited amorphous film in which a specific amount of hydrogen atoms was incorporated and the proportion of crystal grain domains per unit volume controlled to a specific value (this deposited film is hereinafter referred to as "ZnSe:H film"), the present inventors have found that (a) the ZnSe:H film may be formed in a desired state even on a non-single crystal substrate of glass, metal, ceramics or synthetic resin: (b) the ZnSe:H film formed on such non-single crystal substrate is accompanied with very few defects: (c) it can be easily and efficiently doped with a dopant of p-type or n-type: and (d) when doped with a p-type dopant, there is afforded a desirable p-type ZnSe:H semiconductor film having a wealth of many practically applicable semiconductor characteristics.

Then, as a result of preparing a $ZnSe_{1-x}Te_x$ deposited amorphous film in which the quantitative ratio of Se to Te was controlled to a specific value, a specific amount of hydrogen atoms being incorporated and the proportion of crystal grain domains per unit volume being controlled to a specific value (this deposited film is hereinafter referred to as "$ZnSe_{1-x}Te_x$:H film"), the present inventors have found that (e) the $ZnSe_{1-x}Te_x$:H film may be formed in a desired state even on a non-single crystal substrate of glass, metal, ceramics or synthetic resin: (f) the $ZnSe_{1-x}Te_x$:H film formed on such non-single crystal substrate is accompanied with very few defects: (g) it can be easily and efficiently doped with a dopant of p-type or n-type: and (h) when doped with a p-type dopant, there is afforded a desirable p-type $ZnSe_{1-x}Te_x$:H semiconductor film having a wealth of many practically applicable semiconductor characteristics.

The present inventors have further found that in the case of using one or more of the foregoing ZnSe:H film and the foregoing $ZnSe_{1-x}Te_x$:H film as a member for the pin junction in the preparation of a pin junction photovoltaic element, there is afforded a pin junction photovoltaic element which efficiently and stably generates a desired photoelectromotive force.

The present invention has been completed on the basis of these findings, and it provides pin junction photovoltaic elements as are below mentioned;

(1) a pin junction photovoltaic element which generates photoelectromotive force by the junction of a p-type semiconductor layer, an i-type semiconductor layer and an n-type semiconductor layer, characterized in that at least said i-type semiconductor layer, comprises a deposited film comprised of zinc atoms, selenium atoms and at least hydrogen atoms: said deposited film contains said hydrogen atoms in an amount of 1 to 4 atomic %: and said deposited film contains crystal grain domains in proportion of 65 to 85 vol % per unit volume;

(2) the pin junction photovoltaic element as defined in the above (1), wherein said p-type semiconductor layer or/and said n-type semiconductor layer comprises a deposited film comprised of zinc atoms, selenium atoms and at least hydrogen atoms and which contains a dopant of p-type or n-type: said deposited film contains said hydrogen atoms in an amount of 1 to 4 atomic %: and said deposited film contains crystal grain domains in a proportion of 65 to 85 vol % per unit volume;

(3) the pin junction photovoltaic element as defined in the above (2), wherein said p-type dopant is a member selected from the group consisting of Group I elements and Group V elements of the Periodic Table;

(4) the pin junction photovoltaic element as defined in the above (3), wherein said member is lithium;

(5) pin junction photovoltaic element which generates photoelectromotive force by the junction of a p-type semiconductor layer, an i-type semiconductor layer and an n-type semiconductor layer, characterized in that at least said i-type semiconductor layer, comprises a deposited film comprised of zinc atoms, selenium atoms, tellurium atoms and at least hydrogen atoms: the quantitative ratio of said selenium atoms to said tellurium atoms in said deposited film is in the range from 1:9 to 3:7 in terms of number of atoms: said deposited film contains said hydrogen atoms in an amount of 1 to 4 atomic %: and said deposited film contains crystal grain domains in a proportion of 65 to 85 vol % per unit volume;

(6) the pin junction photovoltaic element as defined in the above (5), wherein said p-type semiconductor layer or/and said n-type semiconductor layer comprises a deposited film comprised of zinc atoms, selenium atoms, tellurium atoms and at least hydrogen atoms and which contains a dopant of p-type or n-type: the quantitative ratio of said selenium atoms to said tellurium atoms in said deposited film is in the range from 1:9 to 3:7 in terms of number of atoms: said deposited film contains said hydrogen atoms in an amount of 1 to 4 atomic %: and said deposited film contains crystal grain domains in a proportion of 65 to 85 vol % per unit volume;

(7) the pin junction photovoltaic element as defined in the above (6), wherein said p-type dopant is a member selected from the group consisting of Group I elements and Group V elements of the Periodic Table; and (8) the pin junction photovoltaic element as defined in the above (7), wherein said member is lithium.

The experiments carried out by the present inventors will be detailed in the following.

Experiment A: Observations on the proportion of crystal grain domains as formed in a ZnSe deposited film when hydrogen atoms are introduced thereinto (1) Preparation of samples (i) There were provided two kinds of substrates; (a) a round silicon wafer of 0.5 mm in thickness and 1 inch in diameter (having a resistivity ($\rho$) of about $10^{-1}$ $\Omega$-cm), on which is formed an $SiO_2$ film of about 500 Å in thickness, by way of a known thermal oxidation treatment in an oxygen gas stream at 1000° C. and (b) a square quartz glass of 2.5 cm by 2.5 cm in size.

Figure 2:
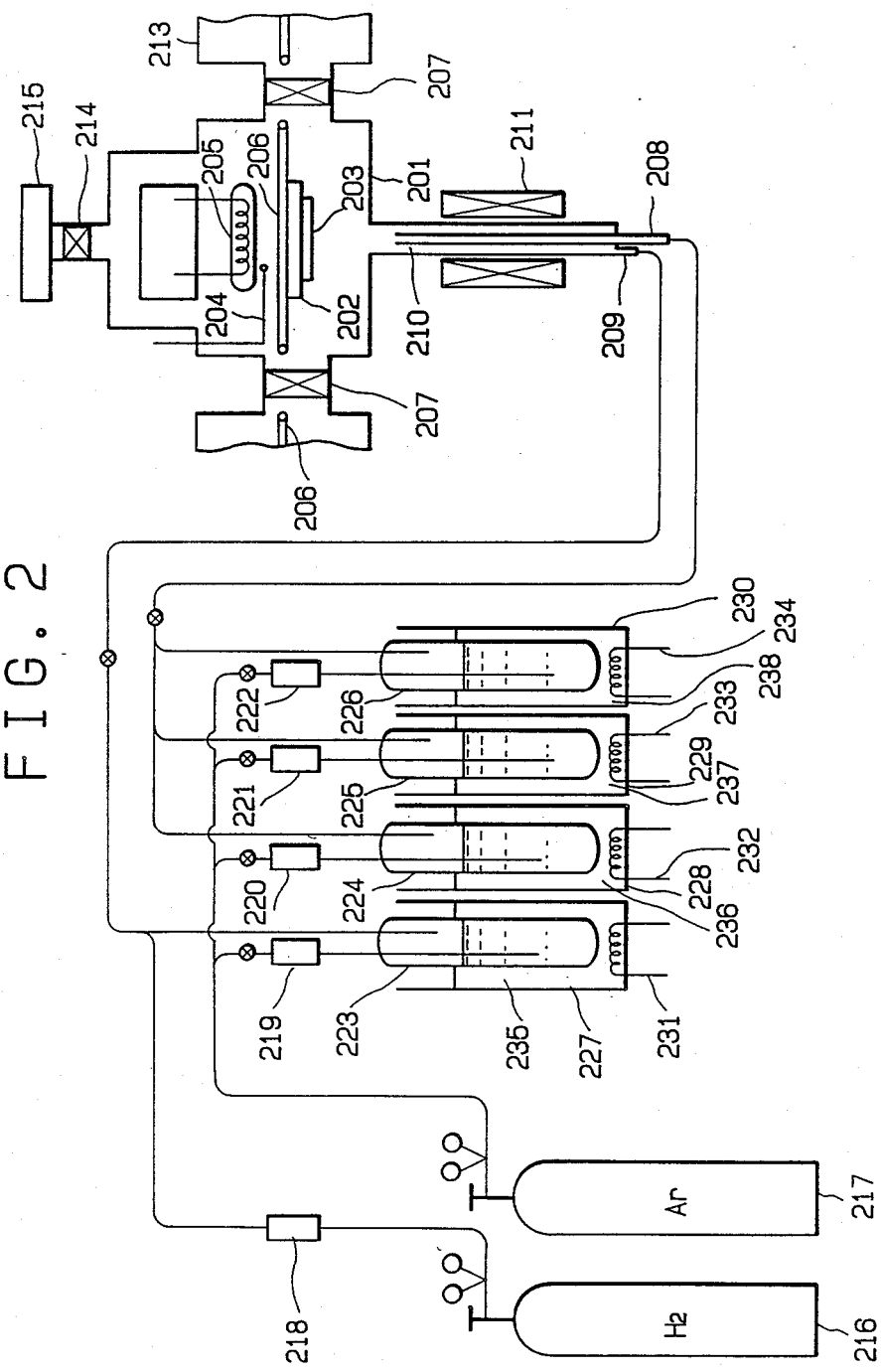
FIG. 2 is a schematic diagram showing the apparatus for forming a deposited film according to process (1) of the present invention.

(ii) The above-mentioned two substrates were placed side by side on the substrate holder 202 of the known apparatus as shown in FIG. 2. On every substrate was formed a ZnSe:H film under the conditions shown in Table 1. Thus, there were prepared samples Nos. 1–12 [on substrates (a)] and samples Nos. 1'–12' [on substrates (b)].

(iii) Each of samples Nos. 1–12 (deposited on silicon wafers) was cut in half. Each of the cut halves was cut to a 5 mm square size which matches the holder of a known transmission electron microscope (TEM). The cut piece was fixed to a glass plate, measuring 50 mm by 50 mm and 1 mm thick, by the aid of wax, with the deposited film in contact with the glass surface so that the deposited film is visible through the opposite wide of the glass plate.

(iv) The exposed part comprising silicon single crystal wafer of the sample as prepared in (iii) was etched with an aqueous solution containing HF, $HNO_3$, and $CH_3COOH$. The etching rate was properly controlled by changing the concentration of HF in the etching solution. Etching was continued until the silicon single crystal wafer was completely removed. In this case, the progress of etching was confirmed by observing the light passing through the deposited film.

(v) After etching, the wax was removed by the aid of an organic solvent (toluene), and the deposited film was separated from the glass plate, followed by rinsing and air drying. Thus there was obtained a film specimen composed of an $SiO_2$ film and a ZnSe:H film thereon.

(2) Examination of the film specimens prepared in (1)

Each film specimen of samples Nos. 1–12 formed on silicon wafers in the above step (1) was examined by fixing it to the sample holder of the TEM (acceleration voltage: 200 KeV) to form a transmission image and observing the resultant transmission image. As a result, it was found for the resultant transmission image that there is a lattice image with very few lattice defects in the part of the ZnSe:H film where crystal grain domains exist. It was also found that the lattice images are uniformly distributed throughout the ZnSe:H film.

The lattice image was utilized to determine crystal grain domains present in a certain area of the film specimen. Thus the proportion in terms of vol % of the crystal grain domains present in the deposited film was calculated.

For the reference purposes, the direction of the crystal grain and the size of the crystal grain domain were measured by the aid of X-ray diffraction.

(3) Determination of the amount of hydrogen (H) in the deposited film (i) Each of samples Nos. 1'–12' deposited on quartz substrates in the above step (1)-(i) was cut in half. Each of the cut halves was placed in a vacuum chamber and heated therein from room temperature to 1000° C. During the heating period, the amount of hydrogen (H) released from the specimen was determined by means of a mass spectrometer. The resulting data were compared with those of the standard sample prepared by implanting a known amount of hydrogen into a hydrogen-free sample.

(ii) Each deposited film of samples Nos. 1–12 used for the TEM observation was examined for the distribution of Zn atoms and Se atoms by the aid of an X-ray microanalyzer ("XMA" for short), made by Shimazu Seisakusho Ltd., and was also subjected to elemental analysis. The results obtained were as shown in Table 2.

The data obtained for all of samples Nos. 1–12 indicate that Zn atoms and Se atoms are uniformly distributed in the deposited film, and Zn atoms and Se atoms constitute the deposited film at a stoichiometric ratio close to 1:1.

(4) Results

Figure 5:
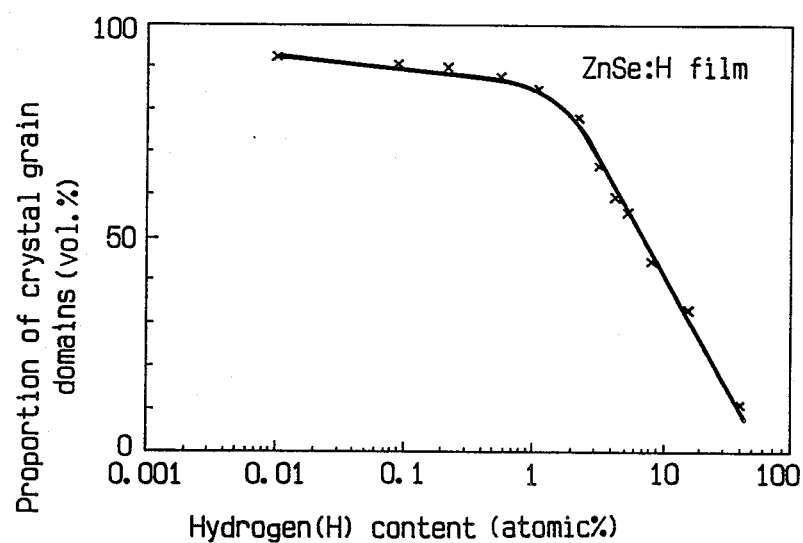
FIG. 5 is a graph showing the interrelation between the proportion of crystal grain domains and the content of hydrogen (H) in the films in Experiments A(2) and A(3).

The results of the measurements in the above steps (2) and (3) are graphically shown in FIG. 5. It was found from the results shown in FIG. 5 that as the content (atomic %) of hydrogen atoms (H) in the ZnSe:H film increases, the proportion of the crystal grain domains per unit volume in the deposited film decreases. And with the content of hydrogen atoms in the range of 0.1 to 10 atomic %, the proportion of crystal grain domains per unit volume in the film ranges from 90 to 40 vol %.

In the sample preparation in the above step (1), when the flow rate of hydrogen gas was controlled to a value lower than 0.05 sccm, the resulting deposited film became such that it was composed mainly of Zn; and with a flow rate in excess of 2 slm, no film was deposited.

Experiment B: Observations of the interrelations among the electrical characteristics, the content of hydrogen atoms and the proportion of crystal grain domains per unit volume for the deposited film.

The deposited film formed on the quartz substrate in the above A-(1)-(ii) was examined for dark conductivity. The examination was carried out using the remaining cut halves of samples Nos. 1'–12'. Prior to measurements, a comb-shaped aluminum electrode was formed on each specimen by vacuum deposition. The results obtained were as shown in FIG. 6.

Figure 6:
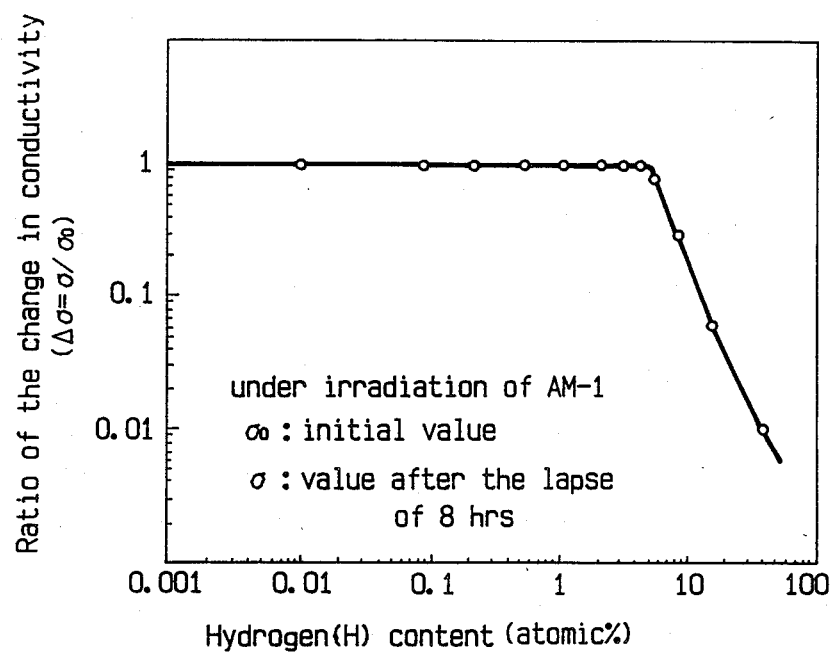
FIG. 6 is a graph showing the interrelation between the content of hydrogen (H) and the change of conductivity of the films in Experiment B.

From the results shown in FIG. 6, the following was found with respect to the ratio of the change in the dark conductivity ($\sigma$) after irradiation with AM-1 light for 8 hours versus the initial value ($\sigma_o$). that is, $\Delta\sigma=\sigma/\sigma_o$.

That is, t varies depending on the content of hydrogen atoms (H) in the film. With 4 atomic % or less, almost no change occurs, and with 8 atomic % or more, a significant change occurs.

Then, the interrelation between the drift mobility of holes and the hydrogen content for the deposited film was examined using the remaining cut halves of samples Nos. 1–12 prepared in the above A-(1)-(ii). Prior to measurements, each specimen was provided with an aluminum semitransparent film by vacuum deposition. The specimen was irradiated with UV light pulses of about 1 nsec while a pulse voltage was being applied across the aluminum film and the silicon wafer with the aluminum film being negative. The drift mobility was measured by way of the known time-of-flight method. The results obtained were as shown in FIG. 7.

Figure 7:
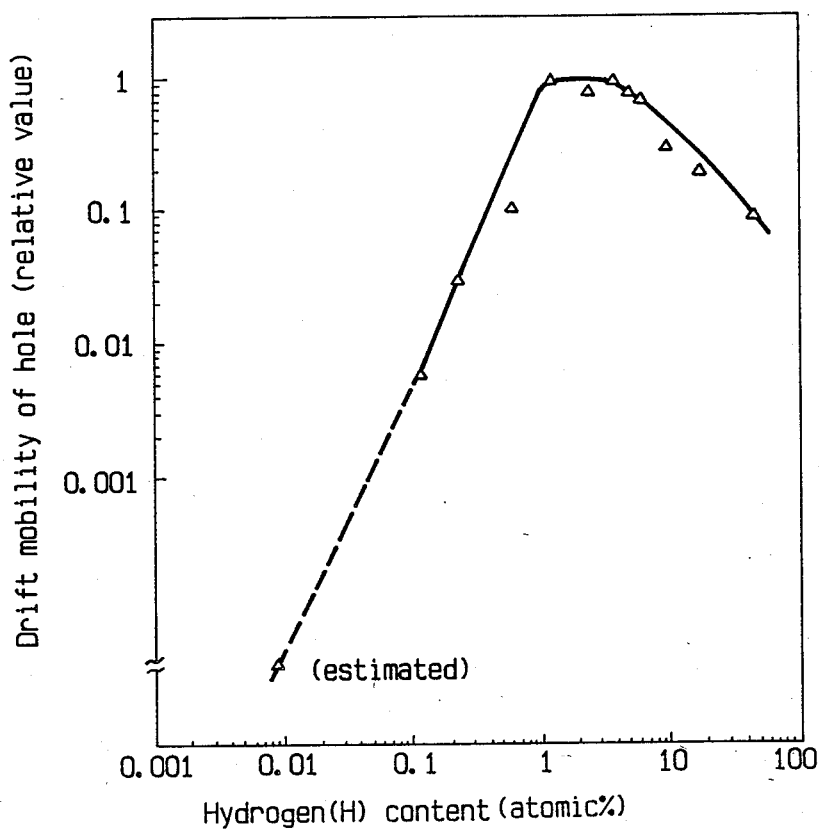
FIG. 7 is a graph showing the interrelation between the content of hydrogen (H) and the drift mobility of holes of the films in Experiment B.

From the results shown in FIG. 7, the following was found. That is, with a hydrogen content of less than 0.5 atomic %, the drift mobility of holes is very small. With hydrogen content in the range from 1 to 8 atomic %, the drift mobility of holes is very high. And with a hydrogen content in excess of 8 atomic %, the drift mobility of holes gradually decreases.

These findings suggest that the content of hydrogen atoms in the deposited film should be 8 atomic % or less, preferably 4 atomic % or less, from the viewpoint of change in
by the irradiation of light, and 0.5 atomic % or more, preferably 1 atomic % of more, from the viewpoint of the mobility of holes.

As a result of studies shown in FIG. 5, it was recognized that the proportion of the crystal grain domains per unit volume is in the range from 65 to 85 vol % for the deposited film which contains 1 to 4 atomic % of hydrogen atoms.

It is concluded from the foregoing that the electrical characteristics of a ZnSe:H deposited film depend largely on the content of hydrogen atoms (H) therein and also on the proportion of crystal grain domains per unit volume therein, and in order for the deposited film to have desired electrical characteristics suitable for use in solar cell or in other devices, it is necessary that the hydrogen content be in the range from 1 to 4 atomic % and the proportion of crystal grain domains per unit volume be in the range from 65 to 85 vol %.

Experiment C: Observations of the interrelations among the doping properties, the content of hydrogen atoms and the proportion of crystal grain domains per unit volume for the deposited film (1) The procedures of Experiment A were repeated, except that $LiC_3H_7$ ($1.0 \times 10^{-10}$ mol/min) was added to the raw material gas (A) in Table 1, to thereby form a ZnSe:H:Li deposited film on a silicon wafer (with an $SiO_2$ film formed thereon) and on a quartz glass substrate. Thus there were prepared samples Nos. 13–24 (on silicon wafer) and samples Nos. 13'–24' (on quartz glass).

(2) Each of samples Nos. 13'–24' (deposited on quartz glass substrates) was cut in half. One half was used for the measurement of dark conductivity after the formation of a comb-shaped aluminum electrode by vacuum deposition. The other half was used for the measurement of the content of hydrogen (H) in the same manner as in Experiment A.

Figure 8:
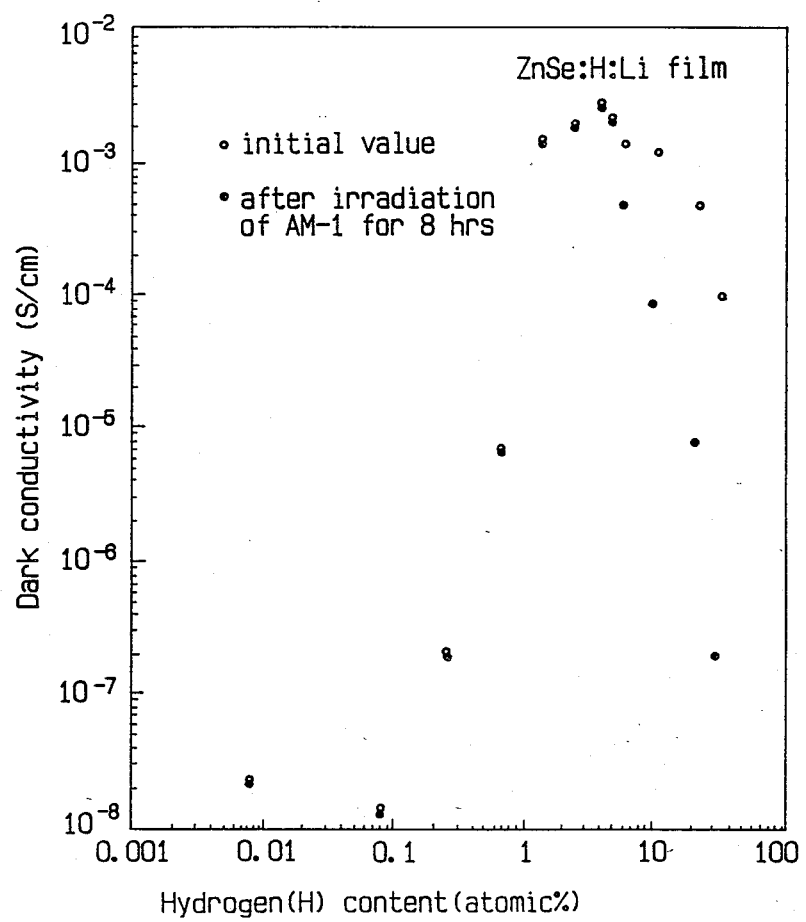
FIG. 8 is a graph showing the interrelation between the the content of hydrogen (H) and the dark conductivity of the films in Experiment C.

The results of measurements were as shown in FIG. 8. In the figure, white circles ( ) represent the dark conductivity of the ZnSe:H:Li film which was not irradiated with light more intense than the room light. Black circles ( ) represent the dark conductivity of the ZnSe:H:Li film which was measured after continuous irradiation with AM-1 light (100 mW/cm$^2$) for 8 l hours.

The specimens, with a comb-shaped aluminum electrode formed thereon by vacuum deposition, were examined for conductivity type by the aid of thermoelectromotive force. It was found that the specimens containing more than 0.25 atomic % of hydrogen atoms exhibit p-type conductivity, and other specimens containing less than 0.08 atomic % of hydrogen atoms exhibit weak n-type conductivity.

Figure 9:
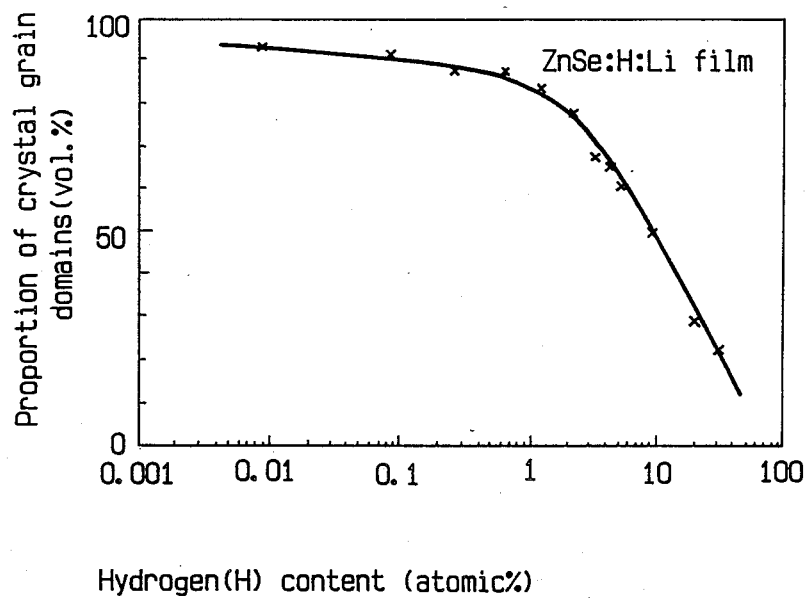
FIG. 9 is a graph showing the interrelation between the content of hydrogen (H) and the proportion of crystal grain domains of the films in Experiment C.

(3) Samples Nos. 13–24 were examined for the proportion of crystal grain domains per unit volume in the same manner as in Experiment A. The results obtained were as shown in FIG. 9. It was found that the interrelation between the proportion of crystal grain domains per unit volume and the content of hydrogen (H) is almost identical with that of an undoped film.

(4) From what is shown in FIGS. 8 and 9, it is recognized that films capable of being efficiently doped with a dopant contain more than 15 vol % of non-crystal grain domains per unit volume. In other words, for the films to be doped efficiently, it is necessary that the films contain more than 15 vol % of non-crystal grain domains per unit volume.

The foregoing suggests that the deposited film should contain a certain amount of non-crystal grains. With too small an amount of non-crystal grains, the resulting deposited film will be such that it lacks structural flexibility and is insufficient for structural relief at the crystal grain boundaries, and because of this, it is accompanied with defects due to dangling bonds for example. When such a film is doped with a proper dopant, the dopant does not enter the crystal grains bu agglomerates at the crystal grain boundaries. Even though the dopant should be introduced into the film, the resulting film will be such that the valence electron and the dark conductivity can not be controlled as desired.

On the other hand, in the case of a film containing 15 vol % or more of non-crystal grains in the crystal grain boundaries or in the intercrystal space, with the dangling bond terminated with hydrogen atoms (H), the structure is flexible and the defects at the crystal grain boundaries are few. Therefore, said film is by far superior in the displacement due to the addition of a dopant, that is, the doping efficiency, to the deposited film which does not contain non-crystal grain domains. Incidentally, with non-crystal grain domains being less than 15 vol % per unit volume, the deposited film is easily peeled off from the substrate on account of insufficient flexibility in the structure.

The foregoing suggests that the deposited film should contain more than 15 vol % of non-crystal grain domains per unit volume.

(5) The procedures of the above (1) were repeated to prepare samples Nos. 25–36, samples Nos. 37–48, and samples Nos. 49–60 (on $SiO_2$ film) and also to prepare samples Nos 25'–36', samples Nos. 37'–48', and samples Nos. 49'–60' (on quartz substrate).

Figure 10:
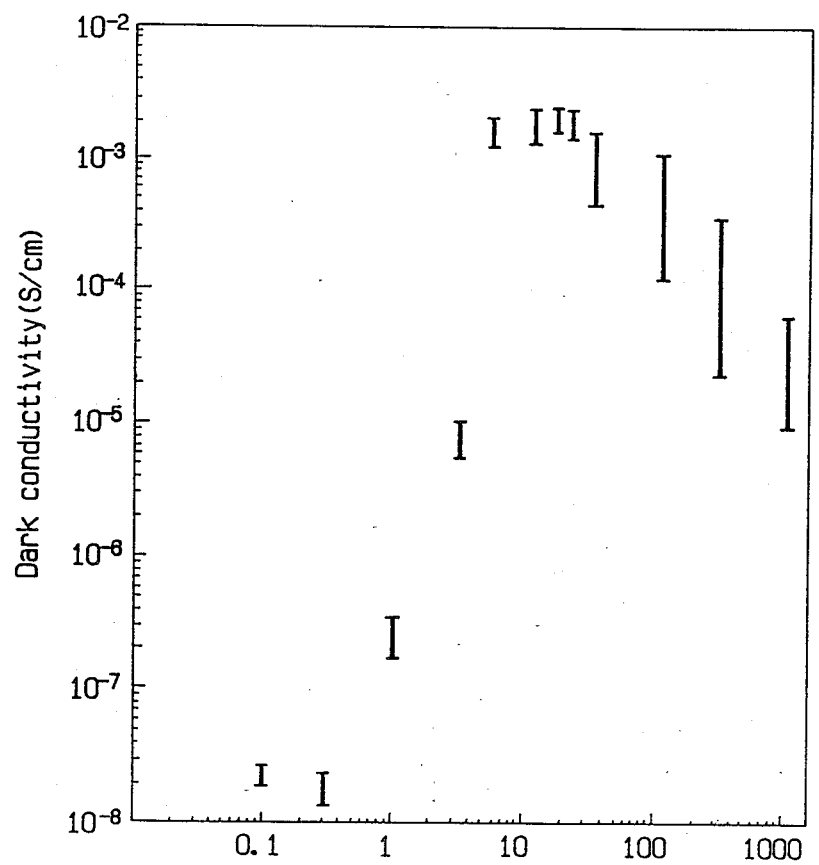
FIG. 10 is a graph showing the interrelation between the dark conductivity and the flow rate of hydrogen gas at the time of film formation in Experiment C.

Each of samples Nos. 25–60 which were not irradiated with intense, light was examined for dark conductivity in the same manner as mentioned above. The results are shown in FIG. 10. As FIG. 10 illustrates, it was found that the value of dark conductivity greatly varies depending on the film forming conditions, and that the degree of variation is great in the case where the flow rate of hydrogen gas is high.

On the other hand, as for samples Nos. 25'–60', it was found that they are almost uniform in the content of hydrogen (H) and also in the proportion of crystal grain domains per unit volume.

In the case of samples Nos. 25'–60', those which were prepared with a hydrogen flow rate higher than 30 sccm gave greatly varied values of dark conductivity. In such cases the content of hydrogen (H) was more than 4 atomic % and the proportion of crystal grain domains per unit volume was less than 65 vol %.

The foregoing suggests that where the proportion of non-crystal grain domains per unit volume exceeds 35 vol %, the crystal grains are electrically separated from one another and the conduction is determined by the non-crystal grain domains, which leads to lowering the dark conductivity. This narrows the application areas of the resulting deposited film. In addition, the control of valence electron and the change of dark conductivity with dopant greatly differ from the crystal grain domains to the non-crystal grain domains; therefore, it is difficult to obtain the desired control of valence electron and the desired change of dark conductivity. That is, in the case where dopants enter the non-crystal grain domains, but not the crystal grain domains, the resulting deposited film greatly varies in its characteristics. This makes it difficult to obtain the desired dark conductivity.

The dark conductivity greatly varies as shown in FIG. 8 in the case where the deposited film is irradiated with intense light. This may be elucidated as follows: In the case where the proportion of the non-crystal grain domains per unit volume exceeds 35 vol %, the content of hydrogen (H) is significantly high. This brings about a situation in which the hydrogen atoms will be easily released from the film with the progressive lapse of time and environmental changes. The release of hydrogen atoms causes deterioration of the characteristics of the film.

The foregoing suggests the following. That is, in order for the ZnSe:H film to be of a stable film quality and to be reproducible, it is necessary that the content of hydrogen atoms (H) be 4 atomic % or less and the proportion of crystal grain domains per unit volume be 65 vol % or more.

(6) The procedures in the above (1) were repeated to form ZnSe:H films and ZnSe:H:Li films on quartz glass substrates under varied film forming conditions. The samples thus prepared were examined for the interrelation between the content of hydrogen (H) and the proportion of crystal grain domains per unit volume, and the interrelation between the content of hydrogen (H) and the electrical characteristics (such as the ratio of change in conductivity under irradiation with AM-1 light, the drift mobility of holes, and the dark conductivity) in the same manner as mentioned above. It was found that the content of hydrogen (H) and the proportion of crystal grain domains per unit volume almost coincide with those specified in the abovementioned experiments, and that there is a close correlation between the content of hydrogen (H) in the film and the electrical characteristics of the film. Thus it was found that the optimum content of hydrogen (H) is in the range from 1 to 4 atomic %. It was also found that the proportion of crystal grain domains per unit volume in the film which satisfies said specific content of hydrogen (H) in the film is preferably 65 to 85 vol % and more preferably, 70 to 80 vol %.

Experiment D: Observations on the proportion of crystal grain domains as formed in a $ZnSe_{1-x}Te_x$ deposited film when hydrogen atoms are introduced there into (1) Preparation of samples (i) There were provided two kinds of substrates; (a) a round silicon wafer of 0.5 mm in thickness and 1 inch in diameter (having a resistivity ($\rho$) of about $10^{-1}\Omega$-cm). on which is formed an $SiO_2$ film of about 5000 Å in thickness, by way of a known thermal oxidation treatment in an oxygen gas stream at 1000° C. and (b) a square quartz glass of 2.5 cm by 2.5 cm in size.

(ii) The above-mentioned two substrates were placed side by side on the substrate holder 202 of the known apparatus as shown in FIG. 2. On every substrate was formed a $ZnSe_{1-x}Te_x$:H film under the conditions shown in Table 3. Thus, there were obtained samples Nos. 1–12 [on substrates (a)], and samples Nos. 1'–12' [on substrates (b)].

(iii) Each of samples Nos. 1–12 (deposited on silicon wafers) was cut in half. Each of the cut halves was cut to a 5 mm square size which matches the holder of the known transmission electron microscope (TEM). The cut piece was fixed to a glass plate, measuring 50 mm by 50 mm and 1 mm thick, by the aid of wax, with the deposited film in contact with the glass surface so that the deposited film is visible through the opposite side of the glass plate.

(iv) The exposed part comprising silicon single crystal wafer of the sample as prepared in (iii) was etched with an aqueous solution containing HF, $HNO_3$, and $CH_3COOH$. The etching rate was properly controlled by changing the concentration of HF in the etching solution. Etching was continued until the silicon single crystal wafer was completely removed. In this case, the progress of etching was confirmed by observing the light passing through the deposited film.

(v) After etching, the wax was removed by the aid of an organic solvent (toluene), and the deposited film was separated from the glass plate, followed by rinsing and air drying. Thus there was obtained a film specimen composed of an $SiO_2$ film and a $ZnSe_{1-x}Te_x$:H film thereon.

(2) Examination of the film specimens prepared in (1)

Each film specimen of samples Nos. 1–12 formed on silicon wafers in the above step (1) was examined by fixing it to the sample holder of the TEM (acceleration voltage: 200 KeV) to form a transmission image and observing the resultant transmission image. As a result, it was found for the resultant transmission image that there is a lattice image with very few lattice defects in the part of the $ZnSe_{1-x}Te_x$:H film where crystal grain domains exist. It was also found that the lattice images are uniformly distributed throughout the $ZnSe_{1-x}Te_x$:H film.

The lattice image was utilized to determine crystal grain domains present in a certain area of the film specimen. Thus the proportion in terms of vol % of the crystal grain domains present in the deposited film was calculated.

For the reference purposes, the direction of the crystal grains and the size of the crystal grain domains were measured by the aid of X-ray diffraction.

(3) Determination of the amount of hydrogen (H) in the deposited film (i) Each of samples Nos. 1'–12' deposited on quartz substrates in the above-mentioned step (1)-(i) was cut in half. Each of the cut halves was placed in a vacuum chamber and heated therein from room temperature to 1000° C. During the heating period, the amount of hydrogen (H) released from the specimen was determined by means of a mass spectrometer. The resulting data were compared with those of the standard sample prepared by implanting a known amount of hydrogen into a hydrogen-free sample.

(ii) Each deposited film of samples Nos. 1–12 used for the TEM observation was examined for the distribution of Zn atoms, Se atoms, and Te atoms by the aid of the foregoing X-ray microanalyzer (XMA) add was also subjected to elemental analysis. The results obtained were as shown in Table 4.

The above analysis was carried out on the assumption that the matrix is comprised of Zn, Se, and Te, and hydrogen (H) and others in the film were excluded from calculations.

The data obtained for all of samples Nos. 1-12 indicate that Zn atoms, Se atoms, and Te atoms are uniformly distributed in the entire layer region of the deposited film and that the ratio of Zn atoms versus the sum of Se atoms and Te atoms is stoichiometrically about 1:1, and the ratio of Se atoms to Te atoms is 2:8.

(4) Results

Figure 11:
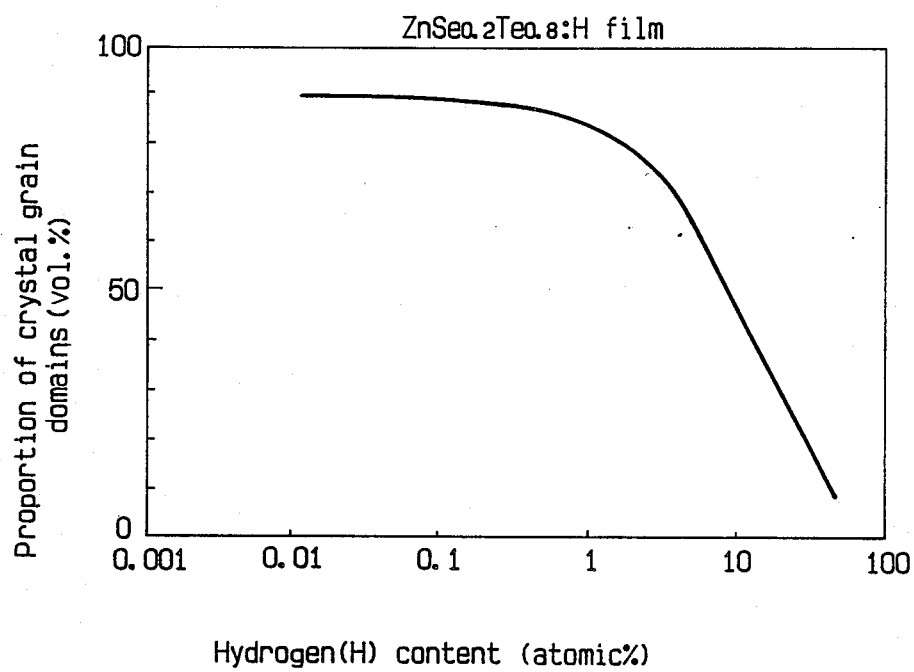
FIG. 11 is a graph showing the interrelation between the content of hydrogen (H) and the proportion of crystal grain domains of the films in Experiments D(2) and D(3). .

The results of the measurements in the above steps (2) and (3) are graphically shown in FIG. 11. It was found from the results shown FIG. 11 that as the content (atomic %) of hydrogen atoms (H) in the $ZnSe_{1-x}Te_x$:H film increases, the proportion of crystal grain domains per unit volume in the deposited film decreases. And with the content of hydrogen atoms in the range of 0.1 to 10 atomic %, the proportion of crystal grain domains per unit volume in the film ranges from 90 to 40 vol %.

In the sample preparation in the above step (1), when the flow rate of hydrogen gas was controlled to a value lower than 0.05 sccm, the resulting deposited film was composed mainly of Zn; and with a flow rate in excess of 2 slm, no film was deposited.

Experiment E: Observations on the interrelation among electrical characteristics, the content of hydrogen atoms and the proportion of crystal grain domains per unit volume for the deposited film The deposited film formed on the quartz substrate in the above step (1)-(ii) was examined for dark conductivity. The examination was carried out using the remaining cut halves of samples Nos. 1'-12'. Prior to measurements, a comb-shaped aluminum electrode was formed on each specimen by vacuum deposition. The results obtained were as shown in FIG. 12.

Figure 12:
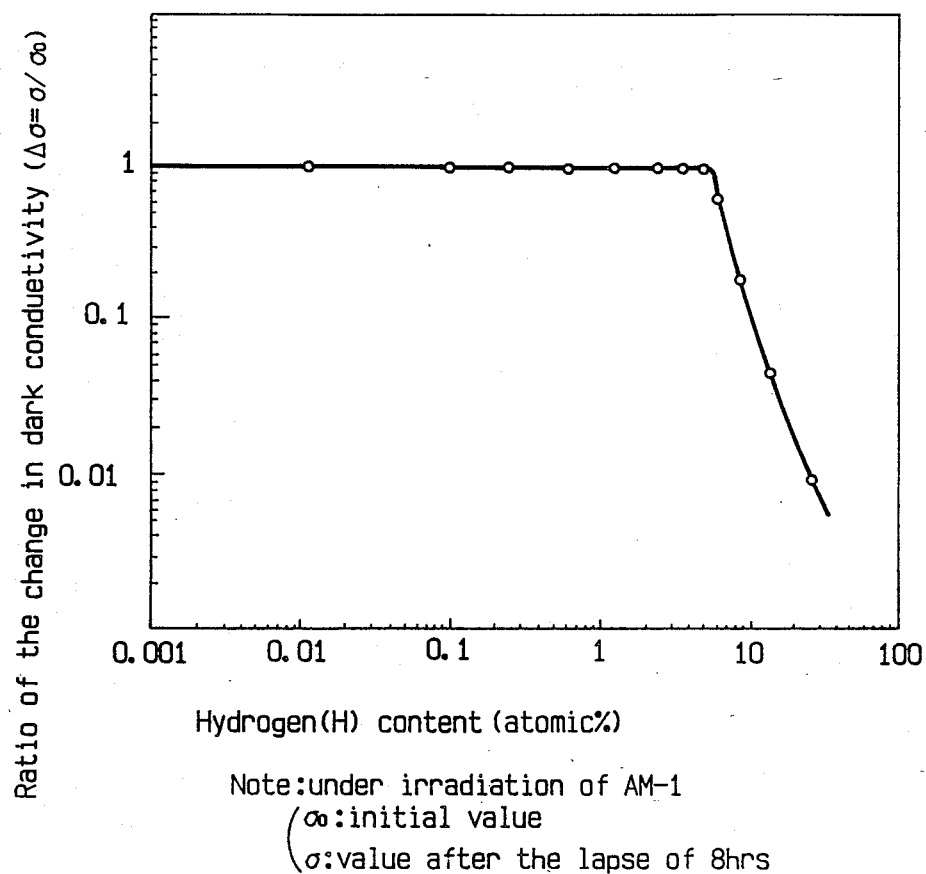
FIG. 12 is a graph showing the interrelation between the content of hydrogen (H) and the change of conductivity of the films in Experiment E.

From the results shown in FIG. 12, the following was found with respect to the ratio of the change in dark conductivity ($\sigma$) after irradiation with AM-1.5 for 8 hours versus the initial value ($\sigma_o$), that is, $\Delta\sigma = \sigma/\sigma^o$.

That is, it varies depending on the content of hydrogen atoms (H) in the film. With 4 atomic % or less, almost no change occurs, and with 8 atomic % and above, a significant change occurs.

Then, the interrelation between the drift mobility of holes and the hydrogen content for the deposited film was examined using the remaining cut halves of samples Nos. 1-12 prepared in the above step (i)-(ii). Prior to measurement, each specimen was provided with an aluminum semitransparent film by vacuum deposition. The specimen was irradiated with UV light pulses of about 1 nsec such that a pulse voltage was applied across the aluminum film and the silicon wafer, with the aluminum film being negative. The drift mobility was measured by the known time-of-flight method. The results obtained were as shown in FIG. 13.

Figure 13:
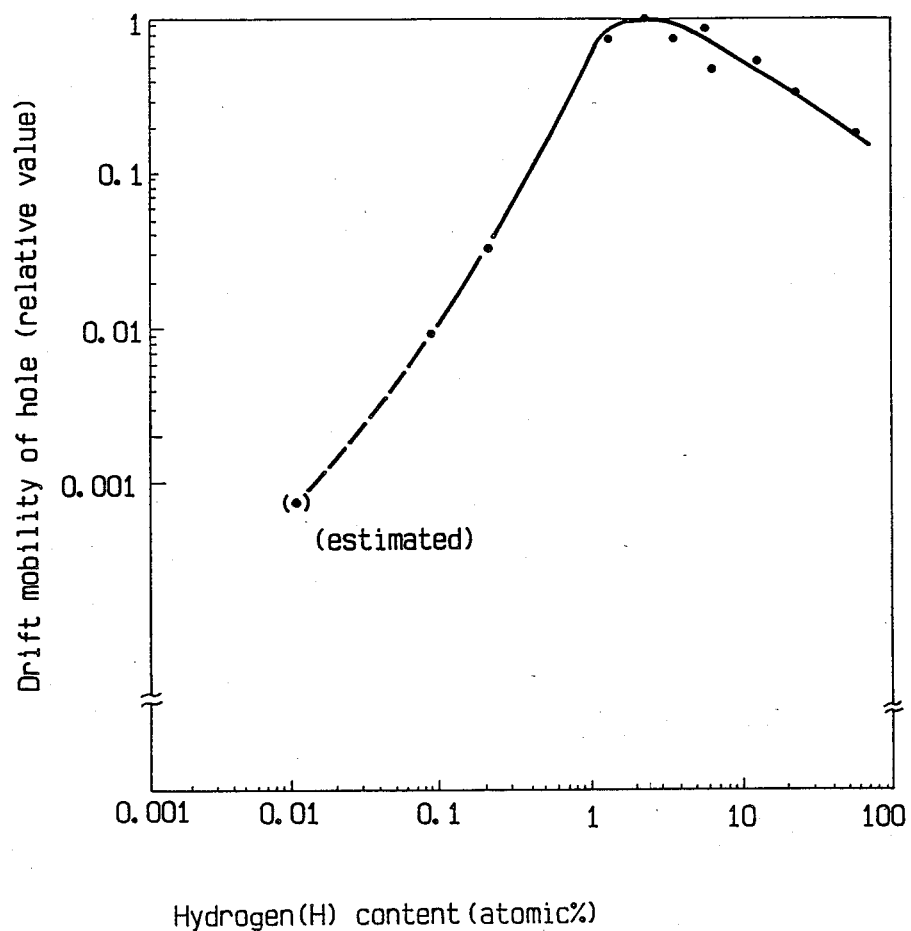
FIG. 13 is a graph showing the interrelation between the content of hydrogen (H) and the drift mobility of holes of the films in Experiment E.

From the results shown in FIG. 13, the following were found. That is, with a hydrogen content of less than 0.5 atomic %, the drift mobility of holes is very small. With a hydrogen content in the range from 1 to 8 atomic %, the drift mobility of holes is very high. And with a hydrogen content in excess of 8 atomic %, the drift mobility of holes gradually decreases.

These findings suggest that the content of hydrogen atoms in the deposited film should be 8 atomic % or less, preferably 4 atomic % or less, from the viewpoint of change in characteristics induced by the irradiation of light, and 0.5 atomic % or more preferably 1 atomic % of more, from the viewpoint of the mobility of holes.

As a result of the above mentioned studies with due regards to that shown in FIG. 11, it was recognized that the proportion of the crystal grain domains per unit volume is in the range from 65 to 85 vol % for the $ZnSe_{1-x}Te_x$:H deposited film which contains 1 to 4 atomic % of hydrogen atoms.

It is concluded from the foregoing that the electrical characteristics of a $ZnSe_{1-x}Te_x$:H deposited film depend largely on the content of hydrogen atoms (H) and also on the proportion of crystal grain domains per unit volume in the film, and in order for the deposited film have desired electrical characteristics suitable for use as solar cell or in other devices, it is necessary that the hydrogen content be in the range from 1 to 4 atomic % and the proportion of crystal grain domains per unit volume be in the range from 65 to 85 vol %.

Experiment F: Observations on the interrelations among the doping properties, the content of hydrogen atoms and the proportion of crystal grain domains per unit volume for the deposited film (1) The procedures in Experiment D were repeated, except that $LiC_3H_7$ ($1.0 \times 10^{-10}$ mol/min) was added to the raw material gas (A) in Table 3, to thereby form a $ZnSe_{1-x}Te_x$:H:Li film on a silicon wafer (with an $SiO_2$ film formed thereon) and also on a quartz glass substrate. Thus there were prepared samples Nos. 13-24 (on silicon wafer) and samples Nos. 13'-24' (on quartz glass).

(2) Each of samples Nos. 13'-24' (deposited on quartz glass substrates) was cut in half. One half was used for the measurement of dark conductivity after the formation of a comb-shaped aluminum electrode by vacuum deposition. The other half was used for the measurement of the content of hydrogen (H) in the same manner as in Experiment A.

Figure 14:
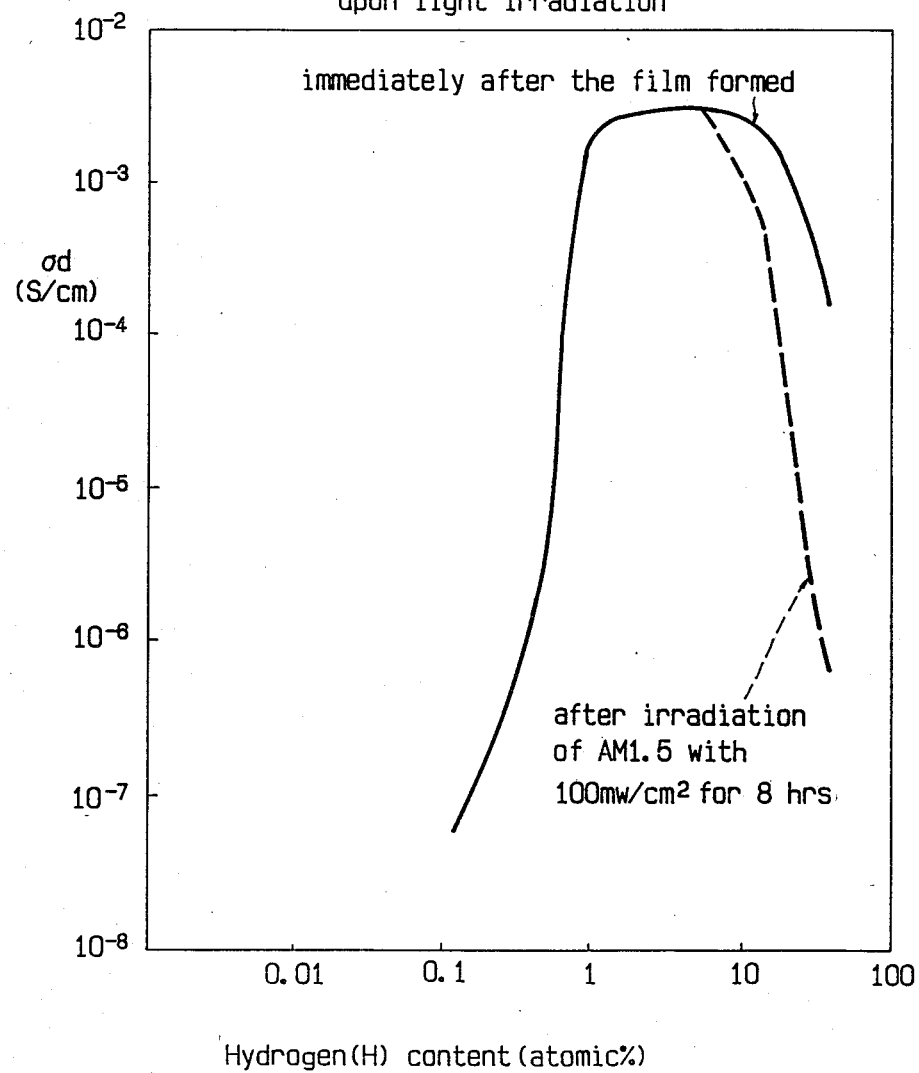
FIG. 14 is a graph showing the interrelation between the content of hydrogen (H) and the dark conductivity of the films in Experiment F.

The results of measurements were as shown in FIG. 14. In the figure, the solid line represents the dark conductivity of the $ZnSe_{1-x}Te_x$:H:Li film which was not irradiated with light more intense than room light. The broken line represents the dark conductivity of the $ZnSe_{1-x}Te_x$:H:Li film which was measured after continuous irradiation with AM-1.5 light (100 mW/cm2) for 8 hours.

The specimens, with a comb-shaped aluminum electrode formed thereon by vacuum deposition, were examined for conductivity type by the aid of thermoelectromotive force. It was found that the specimens containing more than 0.25 atomic % of hydrogen atoms exhibit p-type conductivity, and other specimens containing less than 0.08 atomic % of hydrogen atoms exhibit weak n-type conductivity.

Figure 15:
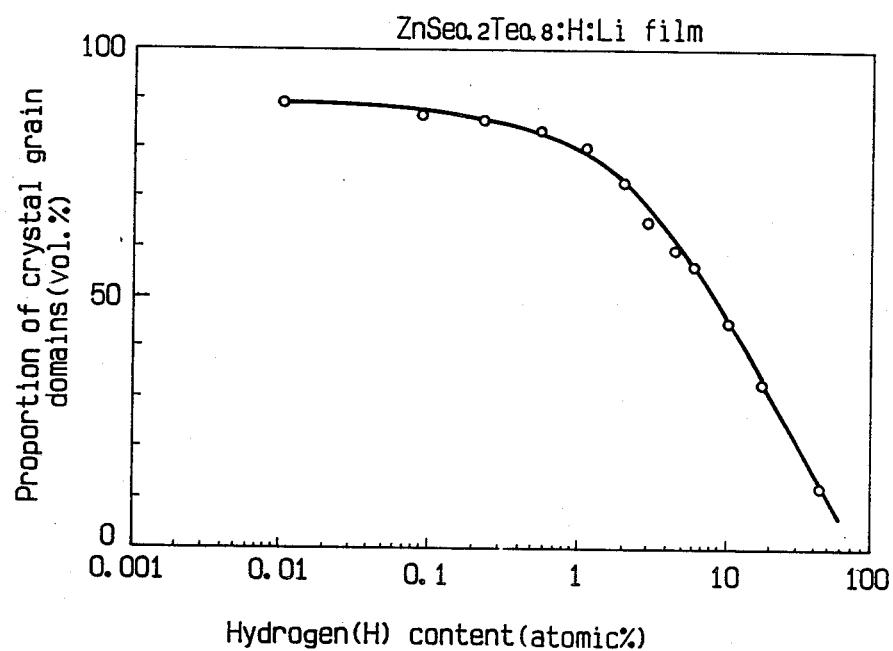
FIG. 15 is a graph showing the interrelation between the content of hydrogen (H) and the proportion of crystal grain domains of the films in Experiment F.

(3) Samples Nos. 13-24 were examined for the proportion of crystal grain domains per unit volume in the same manner as in Experiment A. The results obtained were as shown in FIG. 15. It was found that the interrelation between the proportion of crystal grain domains per unit volume and the content of hydrogen (H) is almost identical with that of an undoped film.

(4) From what is shown in FIGS. 14 and 15, it is recognized that films capable of being efficiently doped with a dopant contain more than 15 vol % of non=-crystal grain domains per unit volume. In other words, for the film to be doped efficiently, it is necessary that the film contain more than 15 vol % of non crystal grain domains per unit volume.

The foregoing suggests that the deposited film should contain a certain amount of non-crystal grains. With too small an amount of non-crystal grains, the resulting deposited film will be such that lacks structural flexibility and has insufficient structural relief at the crystal grain boundaries, and because of this, it is accompanied with defects such as dangling bonds. When such film is doped with a dopant, the dopant does not enter the crystal grains but agglomerates at the crystal grain boundaries. Even though the dopant should be introduced into the film, the resulting film will be such that the valence electrons and the dark conductivity cannot be controlled as desired.

On the other hand, in the case of a film containing 15 vol % or more of non-crystal grains in the crystal grain bonds terminated with hydrogen atoms (H), the structure is flexible and the defects at the crystal grain boundaries are few. Therefore, said film is by far superior in doping efficiency due to the addition of a dopant, compared to a desposited film which does contain non-crystal grain domains. Incidentially, when the non-crystal grain domains are less than 15 vol % per unit volume, the deposited film is easily peeled off from the substrate on account of its insufficient flexibility.

The foregoing suggests that the deposited film should contain more than 15 vol % of non-crystal grain domains per unit volume.

(5) The procedures of the above (1) were repeated to prepare samples Nos. 25-36, samples Nos. 37-48, and samples Nos. 49-60 (on $SiO_2$ film) and also to prepare samples Nos. 25'-36', samples Nos. 37'-48', and samples Nos. 49'-60' (on quartz substrate)

Figure 16:
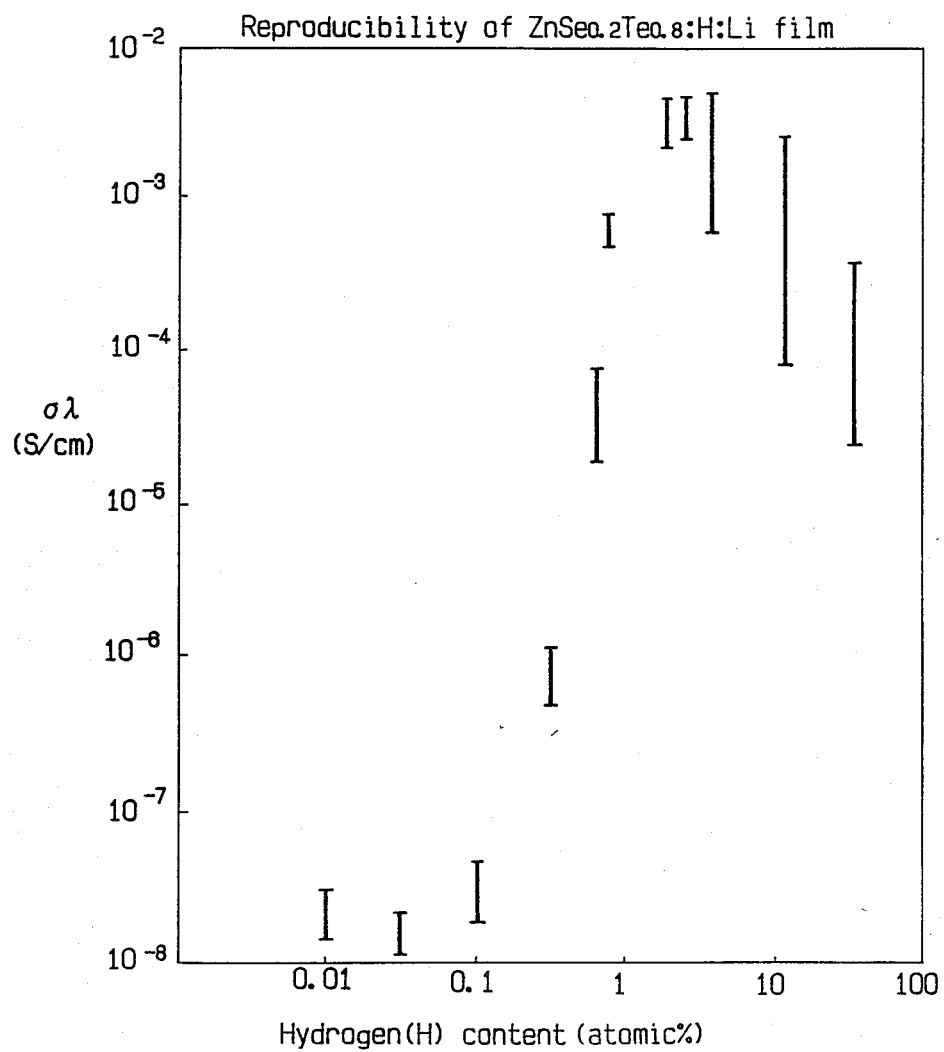
FIG. 16 is a graph showing the interrelation between the content of hydrogen (H) and the dark conductivity of the films in Experiment F.

Each of samples Nos. 25-60 which were not irradiated with intense light was examined for dark conductivity in the same manner as mentioned above. The results are shown in FIG. 16. As FIG. 16 illustrates, it was found that the value of dark conductivity greatly varies depending on the film forming conditions, and that the degree of variation is great in the case where the flow rate of hydrogen gas is high.

On the other hand, as for samples Nos. 25'-60', it was found that they are almost uniform in the content of hydrogen atoms (H) and also in the proportion of crystal grain domains per unit volume.

In the case of samples Nos. 25'-60', those which were prepared with a hydrogen flow rate higher than 30 sccm gave greatly varied values of dark conductivity. In such cases, the content of hydrogen (H) was more than 4 atomic % and the proportion of crystal grain domains per unit volume was less than 65 vol %.

The foregoing suggests that where the proportion of non-crystal grain domains per unit volume exceeds 35 vol %, the crystal grains are electrically separated from one another and the conduction is determined by the non-crystal grain domains, which leads to a lowering of the dark conductivity. This narrows the application areas of the resulting deposited films. In addition, the control of valence electrons and the change of dark conductivity with use of a dopant greatly differ from the crystal grain domains to the non-crystal grain domains; therefore, it is difficult to obtain the desired control of valence electron and the desired change of dark conductivity. That is, in the case where dopants enter the non-crystal grain domains, but not the crystal grain domains, the resulting deposited film greatly varies in its characteristics. This makes it difficult to obtain the dark conductivity as desired.

The dark conductivity greatly varies as shown in FIG. 14 in the case where the deposited film is irradiated with intense light. This may be elucidated in the following way: in the case where the proportion of the non-crystal grain domains per unit volume exceeds 35 vol %, the content of hydrogen (H) is significantly high. This brings about a situation in which the hydrogen atoms will be easily released from the film with progressive change of time and environmental changes. The release of hydrogen atoms causes deterioration of the characteristics of the film.

The foregoing suggests the following. That is, in order for the $ZnSe_{1-x}Te_x$:H film to be of a stable film quality and to be reproducible, it is necessary that the content of hydrogen atom (H) be 4 atomic % or less and the proportion of the crystal grain domains per unit volume be 65 vol % or more.

(6) The procedures in the above (1) were repeated to form $ZnSe_{1-x}Te_x$:H films and $ZnSe_{1-x}Te_x$:H:Li films on quartz glass substrates under varied film forming conditions. Thus prepared samples were examined for the interrelation between the content of hydrogen (H) and the proportion of crystal grain domains per unit volume, and the interrelation between the content of hydrogen (H) and the electrical characteristics (such as the ratio of change in conductivity under irradiation with AM-1, the drift mobility of holes, and the dark conductivity) in the same manner as mentioned above. It was found that the content of hydrogen (H) and the proportion of crystal grain domains per unit volume almost coincide with those specified in the above-mentioned experiments, and that there is a close correlation between the content of hydrogen atoms in the film and the electrical characteristics of the film. Thus it was found that the optimum content of hydrogen (H) is in the range from 1 to 4 atomic %. It was also found that the proportion of crystal grain domains per unit volume in the film which satisfies the specific content of hydrogen atoms in the film is preferably 65 to 85 vol % and more preferably, 70 to 80 vol %.

Experiment G: Observations on the conductivity of $ZnSe_{1-x}Te_x$ film in relation to the content of hydrogen atoms (H) in the film with X (the Se/Te ratio) as a parameter (1) Preparation of samples (i) A square quartz glass of 2.5 cm by 2.5 cm in size was used as the substrate.

(ii) The substrate was firmly attached onto the substrate holder 202 of the known apparatus as shown in FIG. 2. On the substrate was formed a $ZnSe_{1-x}Te_x$:H film ($0 \leq x \leq 1$) under the conditions shown in Table 5. Thus there were obtained 132 kinds of samples designated by the combination of two letters L-N, L representing the flow rate of hydrogen (12 different values) and N representing the ratio of the flow rate of DESe to the flow rate of DETe (11 different values).

(2) Determinations of the content of hydrogen (H) and the composition ratios of Zn, Se and Te in the deposited film (i) Each of samples Nos. 1—1-12-11 deposited on quartz substrates in the above-mentioned step (1)-(i) was cut in half. Each of the cut halves was placed in a vacuum chamber and heated therein from room temperature to 1000° C. During the heating period, the amount of hydrogen (H) released from the specimen was determined by means of a mass spectrometer. The resulting data were compared with those of the standard sample prepared by implanting a known amount of hydrogen into a hydrogen-free sample.

(ii) Each of the remaining cut halves of the samples was examined for the distributions of Zn atoms, Se atoms, and Te atoms by the aid of an X-ray microanalyzer ("XMA" for short), made by Shimadzu Seisakusho Ltd., and was also subjected to elemental composition analysis.

The data obtained indicate that Zn atoms, Se atoms, and Te atoms are uniformly distributed in the deposited film and that the ratio of Zn atoms to the sum of Se atoms and Te atoms [Zn:(Se+Te)] is stoichiometrically about 1:1.

Then, it was confirmed that there may be prepared a desired $ZnSe_{1-x}Te_x:H$ deposited film in which the atomic ratio of Se to Te is approximately $(1-x):x$ by controlling the flow rate of DESe to $1.5 \times 10_{-5} \times (1-x)$ mo./min. and the flow rate of DETe to $1.0 \times 10_{-5} \times x$ mol/min. respectively.

(3) Measurement of the photoconductivity in relation to the content of hydrogen (H) for the deposited film Prior to measurement, there was formed a comb-shaped electrode (0.2 mm gap) on each of the film samples formed on quartz glass substrates, which was used for the measurement in the above (2)-(ii), by the known vacuum depositing technique.

Then, with 10 volts applied under light irradiation with AM-1.5, a current was measured to examine the photoconductivity ($\delta p$) in relation to the content of hydrogen (H) for the $ZnSe_{1-x}Te_x:H$ deposited film.

Figure 17:
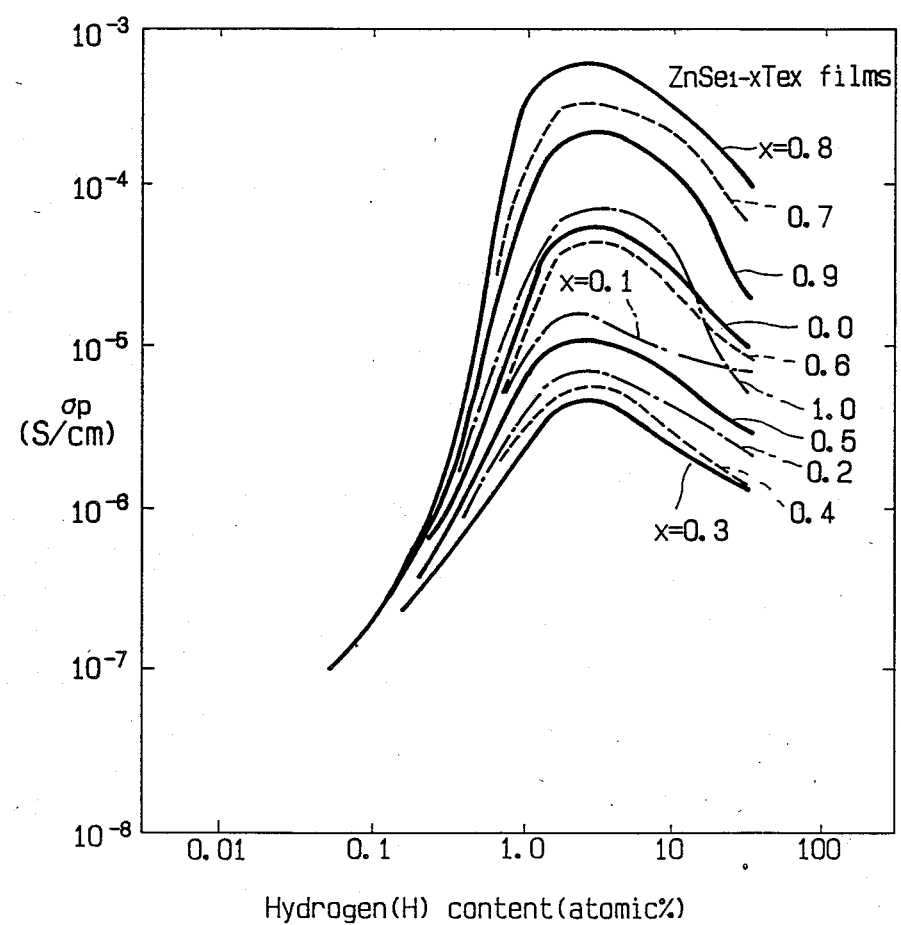
FIG. 17 is a graph showing the interrelation between the content of hydrogen (H) and the dark conductivity of the films in Experiment G.
Figure 18:
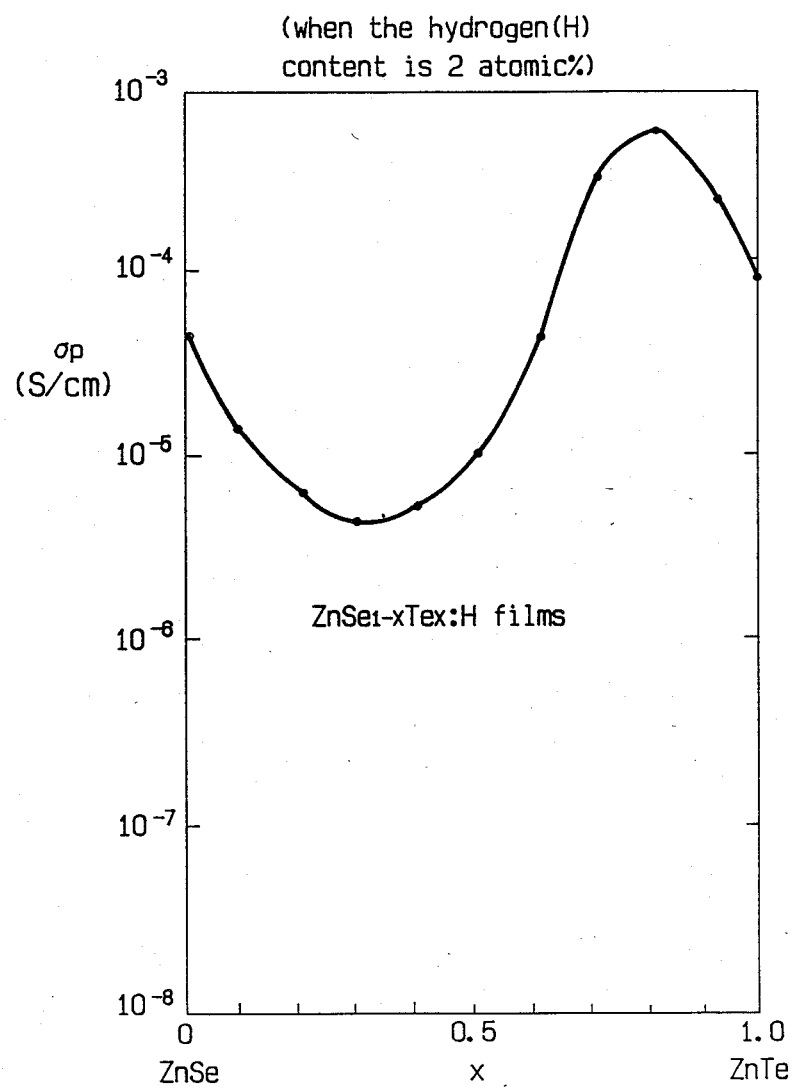
FIG. 18 is a graph showing the interrelation between the quantitative ratio of Se to Te (Se/Te) and the dark conductivity of the films formed in Experiment G.

The results obtained are shown in terms of the dependency of $\delta p$ upon the content of hydrogen (H), with x being the parameter in FIG. 17. FIG. 18 illustrates the dependency of $\delta p$ upon x for the $ZnSe_{1-x}Te_x:H$ deposited films containing 2 atomic % or more or less than said amount of hydrogen atoms.

These experimental results indicate that there may be afforded a $ZnSe_{1-x}Te_x:H$ deposited film of exhibiting an outstanding $\delta p$ when the content of hydrogen (H) is in the range from 1 to 10 atomic % and the value of the x is $0.7 \leq x \leq 0.9$, that is, the quantitative ratio of Se to Te is between 3:7 and 1:9, and said $ZnSe_{1-x}Te_x:H$ deposited film exhibits desired characteristics suited for use as an i-type semiconductor layer in a pin type photovoltaic element.

Experiment H: Observations on the dependency of the dark conductivity upon the content of hydrogen (H) with x being the parameter for the i-type doped $ZnSe_{1-x}Te_x:H$ deposited film (1) Preparation of samples There were prepared a predetermined number of samples by repeating the procedures of Experiment D-(1), except that $LiC_3H_7$ with a flow rate of $1.0 \times 10^{-10}$ mol/min was added to the raw material gas (A) in Table 5.

(2) Measurements of the content of hydrogen (H) and compositional ratios of Zn, Se and Te Each deposited film sample was analyzed to determine the content of hydrogen (H) and to examine compositional ratios of Zn atoms, Se atoms and Te atoms in the film in the same manner as in the foregoing Experiment D.

As a result, it was found that Zn atoms, Se atoms and Te atoms are uniformly distributed in the deposited film and that the quantitative ratio of Zn atoms to the sum of Se atoms and Te atoms [Zn:(Se+Te)] is about 1:1, which satisfies the stoichiometrical relationship.

Then, it was confirmed that there may be prepared a desired p-type doped $ZnSe_{1-x}Te_x:H$ deposited film in which the atomic ratio of Se to Te is approximately $(1-x):x$ by controlling the flow rate of DESe to $1.5 \times 10^{-5}x(1-X)$ mol/min. and the flow rate of DETe to $1.0 \times 10^{-5} \times x$ mol/min. respectively.

(3) Measurement of dark conductivity

Each deposited film sample on a quartz glass substrate used for the measurements in the above (2), was examined for its dark conductivity. Prior to measurement, a comb-shaped aluminum electrode (0.2 mm gap) was formed on said deposited film sample by way of vacuum deposition. With 10 volts applied, a current was measured in the dark to determine the conductivity ($\delta p$) of the $ZnSe_{1-x}Te_x:H$ deposited film.

Figure 19:
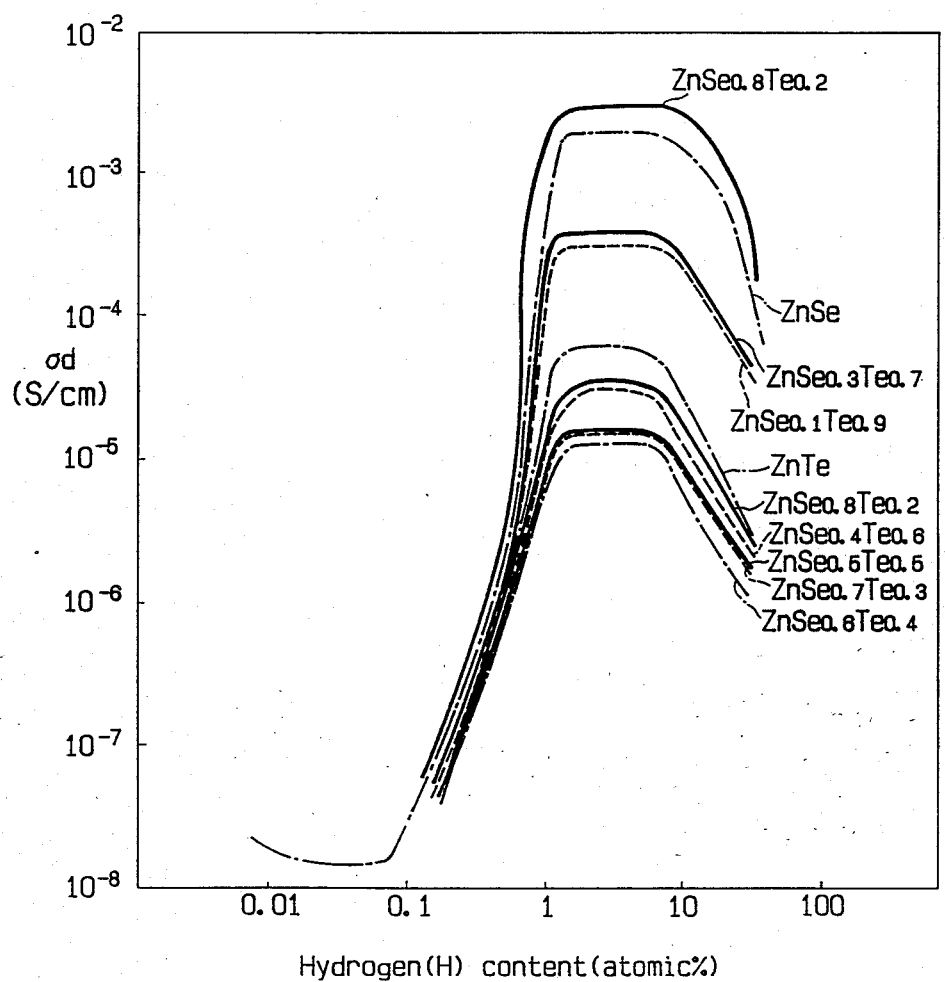
FIG. 19 is a graph showing the interrelation between the content of hydrogen (H) and the dark conductivity of the films with the quantitative ratio of Se to Te (Se/Te) in a p-type doped film as a parameter in Experiment H.

The results obtained are shown in terms of the dependency of $\delta p$ upon the content of hydrogen (H) with x being the parameter in FIG. 19.

The deposited film samples were examined for conduction type by way of measuring the thermoelectromotive force. As a result, it was found that those deposited film samples containing more than 0.25 atomic % of hydrogen atoms exhibit p-type conductivity.

Figure 20:
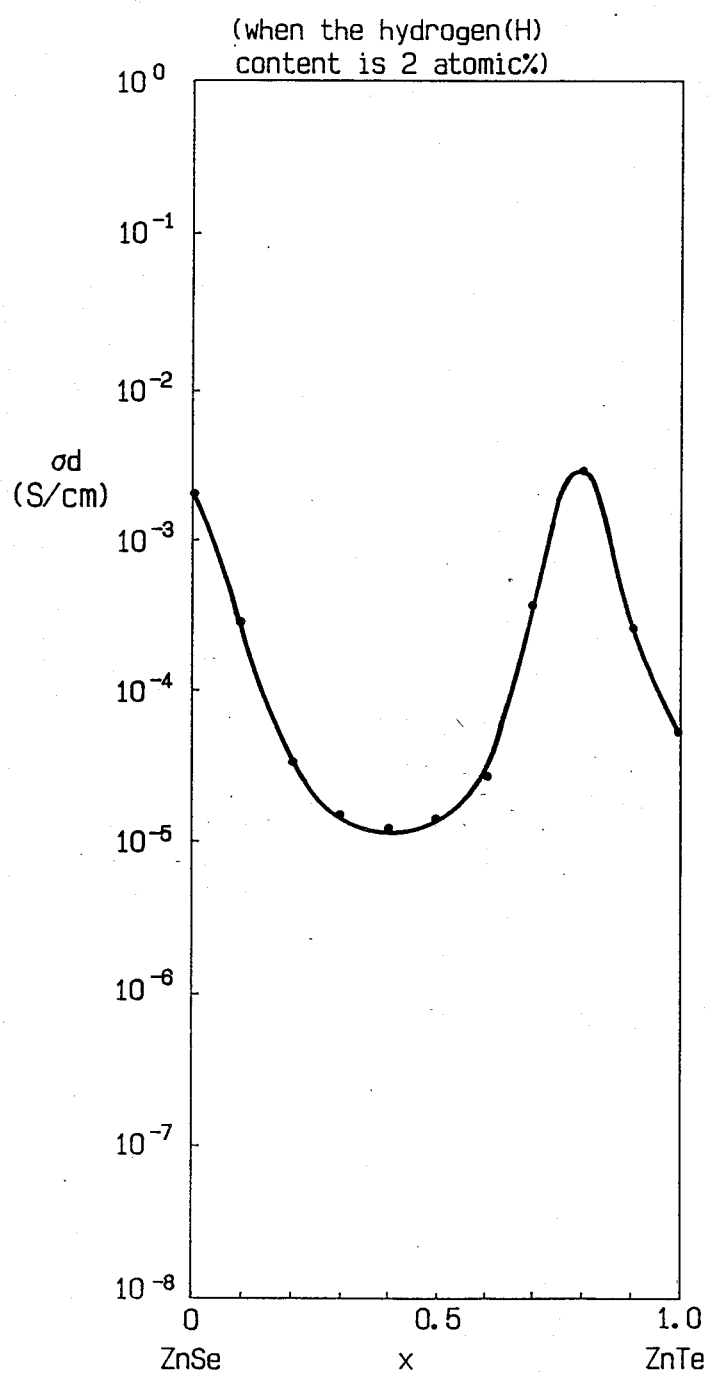
FIG. 20 is a graph showing the interrelation between the quantitative ratio of Se to Te (Se/Te) and the dark conductivity of the p-type doped films in Experiment H.

Shown in FIG. 20 is the dependency of $\delta p$ upon x for the $ZnSe_{1-x}Te_x:H$ deposited films containing 2 atomic % or more or less than said amount of hydrogen atoms.

These experimental results indicate that there may be afforded a desired $ZnSe_{1-x}Te_xH$ deposited film exhibiting excellent p-type conductivity when the content of hydrogen (H) is in the range from 1 to 10 atomic % and the value of x is $0 \leq x \leq 1$ or $0.7 \leq x \leq 0.9$, that is, the quantitative ratio of Se to Te is between 1:0 and 9:1 or between 3:7 and 1:9.

Experimental I: Observation on n-type doped $ZnSe_{1-x}Te_x:H$ deposited film (1) Preparation of samples There were prepared a predetermined number of samples by repeating the procedures of Experiment D-(1), except that $(C_2H_5)_3Al$(TE al) with a flow rate of $5 \times 10^{-11}$ mol/min. was added to the raw material gas (a) in Table 5.

(2) Measurements of the content of hydrogen (H) and compositional ratios of Zn, Se and Te Each deposited film sample was analyzed to determine the content of hydrogen (H) and to examine compositional ratios of Zn atoms, Se atoms and Te atoms in the film in the same manner as in the foregoing Experiment D.

As a result, it was found that Zn atoms, Se atoms and Te atoms are uniformly distributed in the deposited film and that the quantitative ratio of Zn atoms to the sum of Se atoms and Te atoms [Zn:(Se+Te)] is about 1:1, which satisfies the stoichiometrical relationship.

Then, it was confirmed that there may be prepared a desired n-type doped $ZnSe_{1-x}Te_xH$ deposited film in which the atomic ratio of Se to Te is approximately $(1-x):s$ by controlling the flow rate of DETe to $1.0 \times 10^{-5}xx$ mol/min. respectively.

(3) Measurement of dark conductivity

Each deposited film sample on a quartz glass substrate used for the measurements in the above (2), was examined for its dark conductivity.

Prior to measurement, a comb-shaped aluminum electrode (0.2 mm gap) was formed on said deposited film sample by way of vacuum deposition.

With 10 volts applied, a current was measured in the dark to determine the conductivity ($\delta p$) of the n-type doped ZnSe$_{1-x}$T$_e$:H deposited film.

Then, every deposited film sample was examined for conduction type by way of measuring the thermoelectromotive force.

The results obtained indicate that all the deposited film samples are of n-type conduction and that those deposited film samples containing 1 to 10 atomic % of hydrogen atoms exhibit an outstanding value of $\delta p$.

Figure 21:
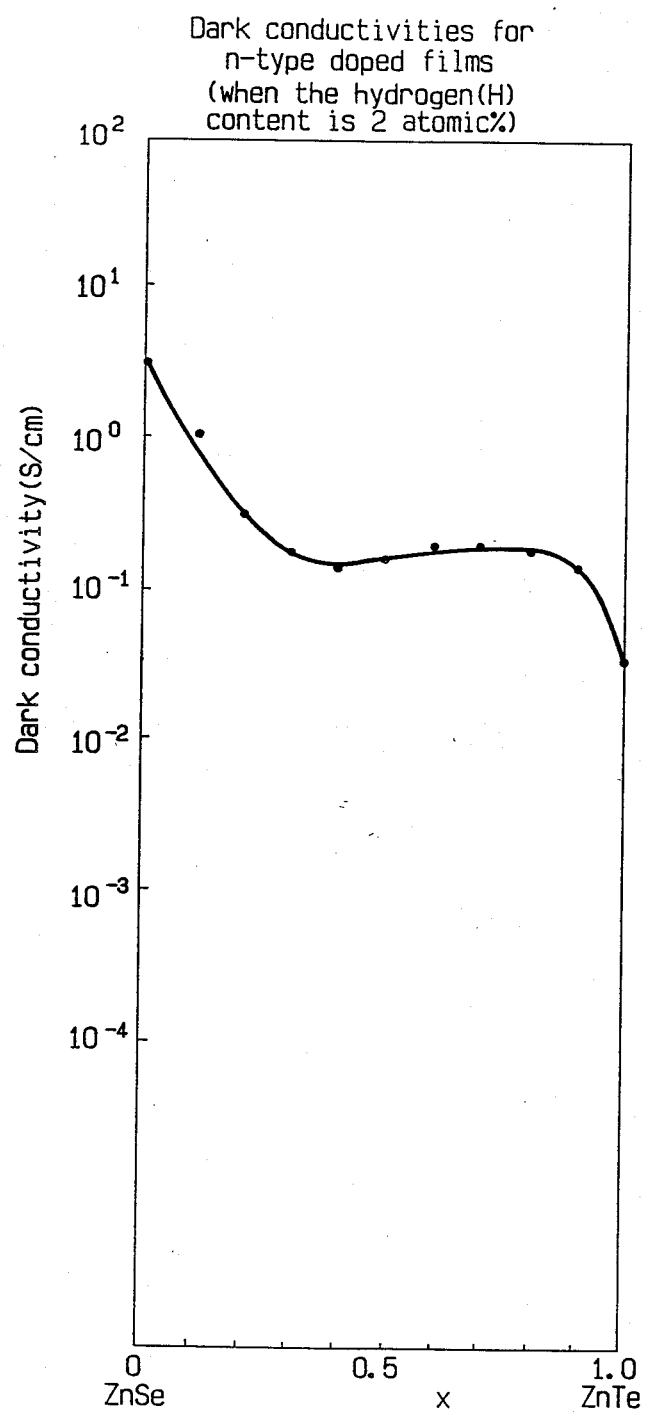
FIG. 21 is a graph showing the interrelation between the quantitative ratio of Se to Te (Se/Te) and the dark conductivity of the n-type doped films in Experiment I.

In FIG. 21, there are shown the results of examining the pendency of $\delta p$ upon x for the n-type doped ZnSe$_{1-x}$T$_e$:H deposited film containing 2 atomic % of hydrogen atoms. As FIG. 21 illustrates, there may be afforded a desired n-type doped ZnSe$_{1-x}$T$_e$:H deposited film exhibiting an excellent conductivity for all quantitative ratios of Se to Te.

Experiment J: Dependency of the optical band gap upon the quantitative ratio of Se to Te in ZnSe$_{1-x}$T$_e$:H deposited film (1) Preparation of samples ZnSe$_{1-x}$T$_e$:H films, with the Se:Te quantitative ratio varied, were prepared on quartz glass substrates in the same manner as in Experiment G except that the flow rate of hydrogen gas was fixed at 15 sccm and the doping gas was not used in Table 5.

(2) Compositional analysis of samples

In accordance with the method in Experiment G-(2), the samples were examined for the content of hydrogen (H), distributed states of Zn atoms, Se atoms and Te atoms and compositional ratios of these atoms. As a result, it was found for every sample that Zn atoms, Se atoms and Te atoms are all uniformly distributed in the film and that the compositional ratio of Zn atoms to the sum of Se atoms and Te atoms is about 1:1, which satisfies the stoichiometrical relationship.

It was then confirmed that there may be afforded a desired ZnSe$_{1-x}$Te$_x$:H deposited film in which the atomic ratio of Se to Te is approximately $(1-x)$:x by controlling the flow rate of DESe to $1.5 \times 10^{-5}x(1-x)$ mol/min. and the flow rate of DETe to $1.0 \times 10^{-5}xx$ mol/min. respectively.

(3) Measurement of optical band gap

The samples were examined for the variation of absorption coefficient as a function of the wavelength of light, using a spectrophotometer. The optical band gap of each sample was obtained from the absorption edge.

Figure 22:
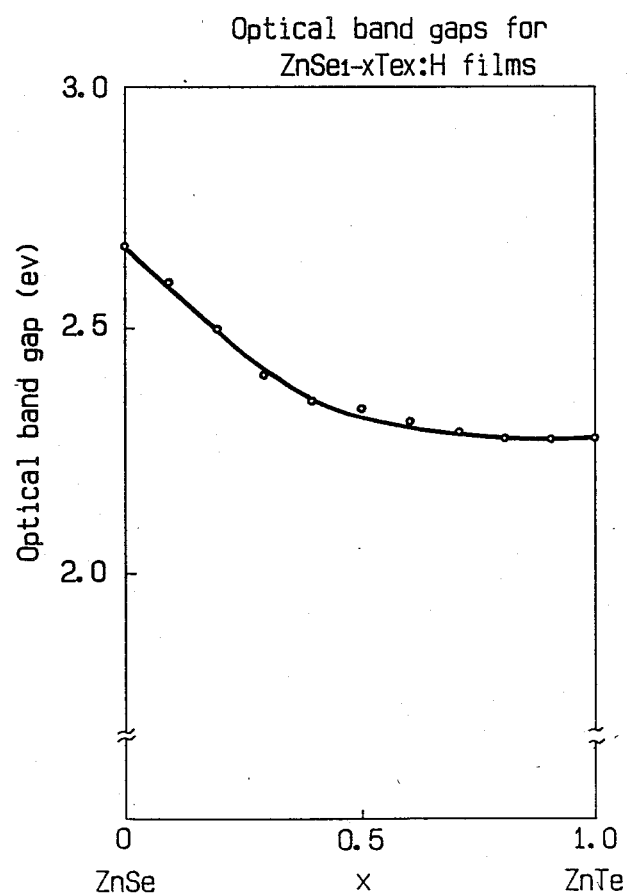
FIG. 22 is a graph showing the interrelation between the quantitative ratio of Se to Te (Se/Te) and the optical band gap of the films in Experiment J.

FIG. 22 shows the optical band gap of ZnSe$_{1-x}$Te$_x$:H films (containing 2 atomic % of hydrogen) plotted against the Se:Te quantitative ratio. It is recognized that in the case of films having the Se:Te quantitative ratio greater than 7:3, the optical band gap is in the range from 2.3 to 2.2 eV.

Experiment K: Observations of the proportion of crystal grain domains formed in non-doped ZnSe$_{1-x}$T$_e$:H films and doped ZnSe$_{1-x}$T$_e$:H:M films (where M denotes a dopant of p-type or n-type)

(1) Preparation of samples

In the same manner as in Experiment G, there were prepared sample films on silicon wafers (with SiO$_2$ film formed thereon by way of thermal oxidation method) and also on quartz glass substrates wherein the flow rate of H$_2$ gas was fixed at 15 SCCM in Table 5.

Incidentally, in the preparation of p-type ZnSe$_{1-x}$T$_e$:H:Li films, LiC$_3$H$_7$ was used, and in the preparation of n-type ZnSe$_{1-x}$T$_e$:HAl films, TEAl [(C$_2$H$_{43}$Al] was used, respectively, as an additive to the raw material gas (A). In the preparation of non-doped ZnSe$_{1-x}$T$_e$:H films, no doping raw material gas was not used.

(2) Analysis of samples

In the same manner as in Experiment D, the resultant samples were examined for the content of hydrogen (H), distributed states of Zn atoms, Se atoms and Te atoms, and compositional ratios of these atoms.

As a result, it was found that every sample (deposited film) contains about 2 atomic % of hydrogen atoms. It was also found that for any of the samples, Zn atoms, Se atoms and Te atoms are uniformly distributed in the film and the compositional ratio of Zn atoms to the sum of Se atoms and Te atoms is about 1:1, which satisfies the stoichiometrical relationship.

Then, it was confirmed that there may be afforded a desired non doped ZnSe$_{1-x}$T$_e$:H film or a desired doped ZnSe$_{1-x}$T$_e$:H:M film in which the atomic ratio of Se to Te is approximately $(1-x)$:x by controlling the flow rate of DESe to $1.5 \times 10^{-5}x(1-x)$ mol/min. and the flow rate of DETe to $1.0 \times 10^{-5} \times x$ mol/min., respectively.

(3) Evaluation of the proportion of crystal grain domains

The proportion of crystal grain domains per unit volume in each sample was evaluated by observing the lattice image by the foregoing TEM in accordance with the procedures in Experiment D.

On the basis of the results in the above (2) and (3), the dependency of the proportion of crystal grain domains per unit volume upon the x value (the ratio of Te) was examined for each of the non-doped sample films, the p-type doped sample films and the n-type doped sample films.

Figure 23:
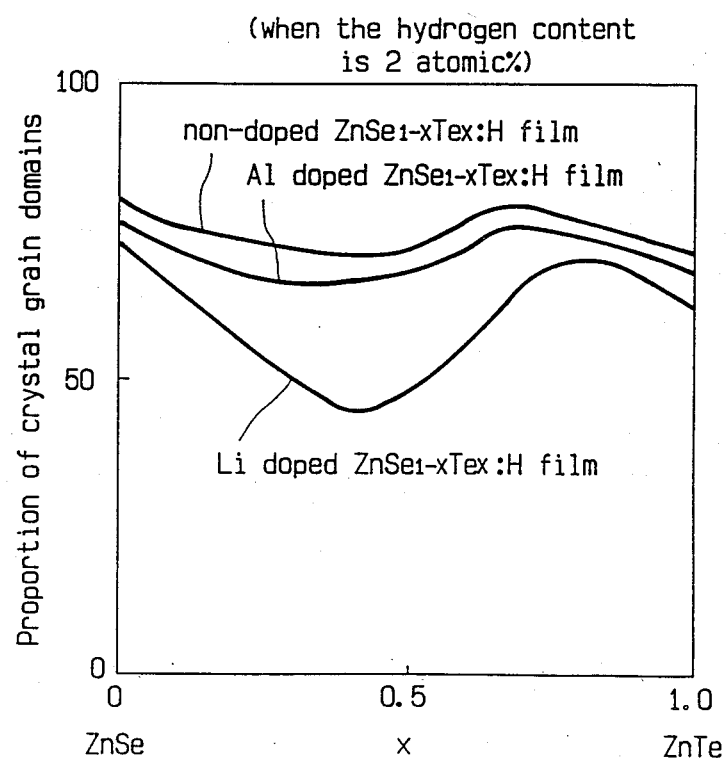
FIG. 23 is a graph showing the interrelation between the quantitative ratio of Se to Te (Se/Te) and the proportion of crystal grains domains of the films in Experiment K.

The results obtained are graphically shown in FIG. 23.

The present invention has been completed based on the foregoing experimental findings.

As mentioned above, one aspect of the present invention is to provide a pin junction photovoltaic element in which at least its constituent i-type semiconductor layer comprises an outstanding functional deposited film constituted with a material represented by ZnSe:H comprised of zinc atoms (Zn), selenium atoms (Se) and at least hydrogen atoms (H), with the content of said hydrogen atoms being in the range from 1 to 4 atomic % and the proportion of crystal grain domains per unit volume being in the range from 65 to 85 vol %.

Another aspect of the present invention is to provide a pin junction photovoltaic element in which at least its constituent i-type semiconductor layer comprises an outstanding functional deposited film constituted with a material represented by ZnSe$_{1-x}$Te$_x$:H comprised of zinc atoms (Zn), selenium atoms (Se), tellurium atoms (Te), and at least hydrogen atoms (H), with the quantitative ratio of said Se to said Te being between 3:7 and 1:9, the amount of said H being in the range from 1 to 4 atomic %, and the proportion of crystal grain domains per unit volume being in the range from 65 to 85 vol %.

The functional deposited films according to the present invention mentioned above are expected to find use in broad application areas. The film may be deposited on a plane or cylindrical substrate according to the intended application, or may also be deposited on a film formed on such substrate.

The ZnSe$_{1-x}$T$_e$:H film according to the present invention contains uniformly distributed Zn atoms and Se atoms in stoichiometric amounts and also contains hydrogen atoms in an amount of 1 to 4 atomic with terminated dangling bonds of Zn atoms and/or Se atoms present in a free state, and it contains crystal grain domains and the noncrystal grain domains. The crystal grain domains are uniformly distributed in the film, and the proportion of the crystal grain domains per unit volume is in the range from 65 to 85 vol %. Thus the $ZnSe_{1-x}Te:H:M$ film has excellent uniformity of structure and homogeneity of composition.

The $ZnSe_{1-x}Te:H$ film according to the present invention is a deposited film having excellent uniformity of structure an homogeneity of composition which contains Zn atoms, se atoms and Te atoms in stoichiometric amounts respectively in a state of being uniformly distributed and also contains 1 to 4 atomic % of hydrogen atoms in a state of terminated dangling bonds of at least one of said Zn, Se and Te atoms or present in a free state: the compositional ratio of said Zn atoms to the sum of said Se atoms and Te atoms being stoichiometric: the quantitative ratio of said Se atoms to said Te atoms being in the range from 3:7 to 1:9 terms in number of atoms: containing crystal grain domains and noncrystal grain domains: and said crystal grain domains being contained in an amount of 65 to 85 vol % by proportion per unit volume distributed in the film.

And, in the ZnSe:H and $ZnSe_{1-x}Te:H$ films according to the present invention, the stress that occurs relaxed in a desired state, and it has outstanding electrical and mechanical characteristics and also has good adhesion to the substrate on which it is to be deposited and to other films on or under which it is to be deposited.

Incidentally, for the known ZnSe and $ZnSe_{1-x}Te:H$ films, it is difficult to incorporate a dopant there into in a desired state and because of this, it is difficult to make these films to be of desired conduction type.

However, according to the present invention, as above describe, the foregoing ZnSe:H and $ZnSe_{1-x}Te:H$ films are such that the dangling bounds are reduced to a desired low level and that permits easy and effective incorporation of a dopant there into. In view of this, according to the present invention, there are provided a p-type $ZnSe:H:M_p$ film and $ZnSe_{1-x}Te:H:M_p$ film (where $M_p$ represents a p-type dopant). Both films have outstanding p-type semiconductor characteristics, a desired state in which the stress is relaxed as mentioned above, very good electrical and mechanical characteristics, and good adhesion not only to the substrate but also to other films.

The $ZnSe:H:M_p$ film and $ZnSe_{1-x}Te:H:M_p$ film contain a p-type dopant selected from the group consisting of Group IA elements (i.e., Li, Na, K, and Rb), Group IB elements (i.e., Cu and Ag) and Group V-A elements (i.e., P, As, And Sb). Among these elements, Li and P are most desired.

The amount of the p-type dopant to be contained from the viewpoint of using the resulting $ZnSe:H:M_p$ or $ZnSe_{1-x}Te:H:M_p$ film as the p-type semiconductor layer in forming the pin junction is preferably from 50 to $1\times 10^4$ atomic ppm, more preferably from $5\times 10^2$ to $1\times 10^4$ atomic ppm, and most preferably, from $1\times 10^3$ to $5\times 10^3$ atomic ppm.

In addition, according to the present invention, there are provided n-type $ZnSe:H:M_n$ and $ZnSe_{1-x}Te:H:M_n$ films (where $M_n$ represents an n-type dopant). As well as said p-type films, these $ZnSe:H:M_n$ and $ZnSe_{1-x}Te:H:M_n$ films have outstanding n-type semiconductor characteristics, a desired state in which the stress is relaxed as mentioned above, very good electrical and mechanical characteristics, and good adhesion not only to the substrate but also to other films.

As the n-type dopant ($M_n$), there can be mentioned Group III B elements such as B, Al, Ga and In, Group IV B elements such as Si, Ge, C and Sn, and Group VII B elements such as F, Cl, Br and I. Among these elements, Al, Ga, In and B are most desired.

The amount of the n-type dopant to be contained from the viewpoint of using the resulting $ZnSe:H:M_n$ film or $ZnSe_{1-x}Te:H:M_n$ film as the n-type semiconductor layer in forming the pin junction is preferably from 50 to $1\times 10^4$ atomic ppm, more preferably from $5\times 10^2$ to $1\times 10^4$ atomic ppm, and most preferably, from $1\times 10^3$ to $5\times 10^3$ atomic ppm.

As mentioned above, the functional deposited film to be used in the present invention is characterized by (i) the content of hydrogen atoms being in a specific range and (ii) the proportion of crystal grain domains per unit volume being also in a specific range. As for the hydrogen content, when it is less than 1 atomic %, the resulting deposited film becomes unsatisfactory on account of na excessive amount of dangling bonds. In the case when it exceeds 4 atomic %, the resulting deposited film becomes unsatisfactory because of occurrence of lattic disturbances, generation of voids and an increase of defects. With respect to the proportion of crystal grain domains per unit volume, in the case where it is less than 65 vol %, the absolute amount of crystal grains, one of the factors contributing to promotion of the electrical properties, is reduced. And, in the case where it is in excess of 85 vol %, crystal grains are directly bonded to each other to cause formation of the so-called grain boundaries resulting in occurrence of defects due to lattice mismatch etc. Therefore, in any case, there cannot be obtained a desired deposited film having the characteristics as desired.

Any of the ZxSe:H, ZnSe:H:M, $ZnSe_{1-x}Te:H$ and $ZnSe_{1-x}Te:H:M_n$ films (where M donates a p-type dopant or an n-type dopant) to be used contains a specific amount of hydrogen atoms and a specific proportion of crystal grain domains per unit volume and is specific in composition and structure as above described and because of this, defects in the film are significantly reduced and it greatly surpasses any of the known ZnSe, $ZnSe_{1-x}Te$ and $ZnSe_{1-x}Te:H:M_n$ electrical conductivity. This situation can be apparently recognized in the case of the $ZnSe_{1-x}Te:H:M_p$ film. That is, as FIG. 20 illustrates, it is understood that in the case of doping a p-type dopant, when the value x (the ratio of Te) is in the range of $0 \leq x \leq 1.0$ or in the range of $0.7 \leq x \leq 1.0$, there is afforded a large value of δd (dark conductivity) and an improvement in the doping efficiency is brought about. And as FIG. 23 illustrates, it understood that when the value x (the ratio to Te) is in any of the foregoing ranges, the proportion of crystal grain domains per unit volume stays in the range of more than 65 vol % and the doping efficiency may be optimized by controlling the aforesaid proportion with the content of hydrogen atoms. As for the non-doped $ZnSe_{1-x}Te_x:H$ film, as FIG. 23 illustrates, it is understood that although the proportion of crystal grain domains per unit volume is high over the entire range of the value x, the photoconductivity (Δp) is significantly high when the value x is in the range of $0.7 \leq x \leq 0.9$ and because of this, a non-doped $ZnSe_{1-x}Te_x:H$ film in which the value x (the ratio of Te) is in said range is suitable for use as the i-type semiconductor layer in the preparation of a pin junction photovoltaic element.

This situation is considered to be due to that not only the proportion of crystal grain domains per unit volume but also the distribution of localized levels in band gap are changed upon changing the value x.

In addition, as for the foregoing non-doped ZnSe:H film and non-doped ZnSe$_{1-x}$Te$_x$:H films, the band gap of the former is about 2.67 eV which is effective for the absorption of short-wavelength light and the band gap of the latter is from about 2.3 to 2.4 eV which is also effective for the absorption of short-wavelength light. This also suggests that any of these films are suitable for use as the i-type semiconductor layer in the preparation of a pin junction photovoltaic element having a high photoelectric conversion efficiency for short-wavelength light.

The object of the present invention is to provide a photovoltaic element of layered structure having a pin junction. The pin junction is formed so as to provide a high open-circuit voltage (Voc) using materials having large band gap. In the photovoltaic element having the pin junction, that is, the pin junction photovoltaic element according to the present invention, there is used the foregoing ZnSe:H film or ZnSe$_{1-x}$Te$_x$:H:M$_p$ film having an improved electrical conductivity as its i-type semiconductor layer, and as its p-type and n-type semiconductor layers, there are used selected semiconductive deposited films having approximately the same band gap as the i-type semiconductor layer comprising said ZnSe:H film or ZnSe$_{1-x}$Te$_x$:H film or ZnSe$_{1-x}$Te$_x$:H film and which have good electrical conductivity.

In a preferred embodiment, there is used a member selected from the foregoing ZnSe:H:M film and ZnSe$_{1-x}$Te$_x$:H film as the p-type semiconductor layer or the n-type semiconductor layer.

In the case where the p-type semiconductor layer is made of a member selected from the foregoing ZnSe:H:M$_p$ film and ZnSe$_{1-x}$Te$_x$:H:M$_p$ film, the resulting pin junction photovoltaic element becomes a desired one since either said film constituting the p-type semiconductor layer is of a wide band gap and has excellent characteristics which are hardly found in the known p-type semiconductive deposited films.

However, as the p-type semiconductor layer or the n-type semiconductor layer in the pin junction photovoltaic element according to the present invention, other semiconductive deposited films having p-type conduction or n-type conduction than those mentioned above may be used.

As such semiconductive films having n-type conduction, there can be mentioned ZnO, ZnS, ZnSe films. And as such semiconductive films having p-type conduction, there can be mentioned ZnTe and CdTe films. As is well known, these deposited films are made n-type or p-type by the addition of a corresponding dopant of n-type or p-type.

Examples of the n-type dopant for the ZnS deposited film are Cl, Br and Al, and for the ZnSe deposited film are Br, Ga and Al. Examples of the p-type dopant for the ZnTe deposited film are Cu, Ag and P, and for the CdTe deposited film are Li, Sb and P.

The pin junction photovoltaic element according to the present invention provides a high Voc as well as a high photoelectric conversion efficiency because of use of the foregoing non-doped ZnSe:H film or ZnSe$_{1-x}$Te$_x$:H film as the i-type semiconductor layer in a junction with an appropriate p-type semiconductor layer and an appropriate n-type semiconductor layer.

The thus structured pin junction photovoltaic element according to the present invention is high in the transmission of short-wavelength light and provides selective absorption and a high photoelectric conversion efficiency for short-wavelength light mainly because of the use of the foregoing non-doped ZnSe:H film or ZnSe$_{1-x}$Te$_x$:H film as the i-type semiconductor layer which are free from problems caused by film defects which are found in the known pin junction photovoltaic elements.

This feature makes it possible for the photovoltaic element according to the present invention to be used as a solar cell where it achieves more efficient photoelectric conversion than conventional ones made of amorphous silicon material even when used under a light source such as white-light fluorescent lamp which emits light having a large quantity of short-wavelength light in its spectral components. In addition, the photovoltaic element according to the present invention also exhibits significant effects when used as a solar cell under sunlight. For instance, when it is employed as the light incident cell in a solar cell of tandem type or triple type, the resulting device has a structure that permits efficient transmission of long-wavelength light into the lower cell and provides a significant improvement in the photoelectric conversion efficiency for short-wavelength light. Because of this, it functions to efficiently convert almost all the entire sunlight spectra into electricity. In addition, it can be continuously used for a long period of time without occurrence of problems relating to light-induced fatigue which is often found in the conventional solar cells of tandem type or triple type.

The following describes typical examples of the pin junction photovoltaic element to be provided according to the present invention in which at least the i-type layer comprises the foregoing ZnSe:H film or the foregoing ZnSe$_{1-x}$Te$_x$:H film.

The following description, however, is not intended to limit the scope of the present invention.

Figure 1B:
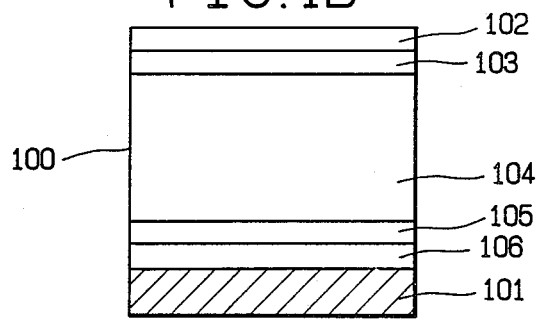

FIG. 1(A) and FIG. 1(B) schematically show typical embodiments of the pin junction photovoltaic element according to the present invention which has a layer structure based on the foregoing functional deposited film containing at least zinc atoms, selenium atoms and hydrogen atoms.

FIG. 1(A) is a schematic cross-sectional view of a first representative embodiment of the pin junction photovoltaic element according to the present invention. In FIG. 1(A), there is shown a pin junction photovoltaic element 100 having a structure comprising electrode 102, n-type semiconductor layer 103, i-type semiconductor layer 104, p-type semiconductor layer 105, transparent electrode 106 and collecting electrode 107 disposed in this order on substrate 101.

In the pin junction photovoltaic element shown in FIG. 1(A), light is impinged from the side of the transparent electrode 106.

FIG. 1(B) is a schematic cross-sectional view of a second representative embodiment of the pin junction photovoltaic element according to the present invention.

In FIG. 1(B), there is shown a pin junction photovoltaic element 100 comprising transparent electrode 106, p-type semiconductor layer 105, i-type semiconductor layer 104, n-type semiconductor layer 103 and electrode 102 being disposed in this order on transmissive substrate 101. In the pin junction photovoltaic element shown in FIG. 1(B), light is impinged from the side of the transmissive substrate 101.

For any of the above pin junction photovoltaic elements shown in FIGS. 1(A) and FIG. 1(B), it is possible to transpose each of the n type semiconductor layer and the p-type semiconductor layer in accordance with the desired use requirements.

Figure 1C:
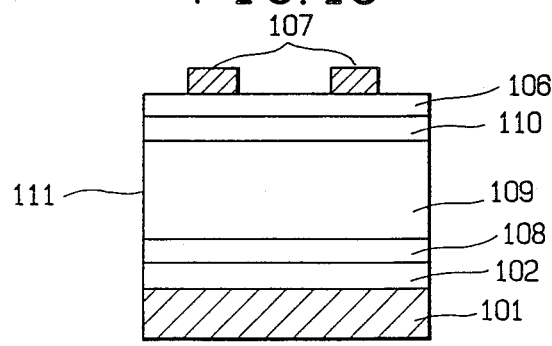

FIG. 1(C) is a schematic cross-sectional view of the known pin junction photovoltaic element for comparative purposes.

In FIG. 1(C), there is shown the known pin junction photovoltaic element 111 comprising electrode 102, n-type A-Si (amorphous silicon) semiconductor layer 108, i-type A-Si (amorphous silicon) semiconductor layer 109, p-type A-Si (amorphous silicon) semiconductor layer 110, transparent electrode 106 and collecting electrode 107 disposed in this order on substrate 101.

In the pin junction photovoltaic element shown in FIG. 1(C), light is impinged from the side of the transparent electrode 106.

Explanation will be made for the substrate, each constituent semiconductor layer and each constituent electrode in the pin junction photovoltaic element of the present invention.

Substrate

The substrate 101 used in the pin junction photovoltaic element according to the present invention may be of single crystal material or non-single crystal material. It may be electroconductive or electrically insulating, and it may be transparent or opaque. Usable as such substrate are, for example, Fe, Ni, Cr, Al, Mo, Au, Nb, Ta, V, Ti, Pt, and Pb and alloys thereof such as brass and stainless steel. Other than these, there can be mentioned films or sheets of synthetic resin such as polyester, polyethylene, polycarbonate, cellulose acetate, polypropylene, polyvinyl chloride, polyvinylidene chloride, polystyrene, polyamide, polyimide and the like, and glass or ceramics.

Examples of the substrate comprising a single crystal material are, for example, wafer-like shaped members obtained by slicing an appropriate single crystal of Si, Ge, C, NaCl, KCl, LiF, GaSb, In As, In Sb, GaP, MgO, $CaF_2$, $BaF_2$, $\alpha$-$Al_2O_3$ or the like. The surface of any of said wafer-like shaped members may be provided with an epitaxially grown layer of the same constituent(s) as the member or of a material whose lattice constant is close to that of the constituent(s) of the member.

The shape of the substrate may be optionally determined in accordance with the end use purpose. Examples are plate, belt, drum and suitable like shapes having a plane or uneven surface. The thickness of the substrate is properly determined so that the layer structure as the photovoltaic member can be formed as desired. In the case where flexibility is required for the photovoltaic element to be prepared, it can be made as thin as possible within a range capable of sufficiently providing the functions as the substrate. However, the thickness of the substrate is usually not less than 10 microns from the view points of its manufacturing and handling and its strength.

Electrodes

In the photovoltaic element according to the present invention, appropriate electrodes are used in accordance with the configuration of the photovoltaic element to be prepared. As such electrodes, there can be mentioned the lower electrode, upper electrode (transparent electrode) and collecting electrode. Said upper electrode denotes the one to be placed at the side on which light is impinged, and said lower electrode denotes the one to be placed opposite to the upper electrode through the semiconductor layers to be arranged between the two electrodes.

These electrodes will be explained in the following.

(i) Lower electrode

For the pin junction photovoltaic element according to the present invention, the side through which light is impinged is determined depending upon whether there is used a transmissive member or an opaque member as the substrate 101.

In this connection, the position where the lower electrode 102 is to be placed is properly determined by the kind the substrate 101 to be used. For example, in the case where an opaque member such as a metal member is used as the substrate 101, light for the generation of a photoelectromotive force is impinged from the side of the transparent electrode 106.

Now, in the case where the pin junction photovoltaic element is of the configuration as shown in FIG. 1(A), the lower electrode 102 is desired to be placed between the substrate 101 and the n-type semiconductor layer 103. In this case, if the substrate 101 is the one which comprises a electroconductive member, it can function also as the lower electrode. However, in the case where the substrate 101 is electroconductive but is of a high sheet resistance the lower electrode may be disposed as a low-resistance electrode serving to output a current or in order to heighten the reflectivity of the incident light at the surface of the substrate 101 so as to make it utilized more efficiently.

In the case of FIG. 1(B), there is used a transmissive member as the substrate 101 and light is impinged from the side of the substrate 101. In this connection, the lower electrode 102 serving to output a current is placed on the surface of the top semiconductor layer above the substrate 101. However, in the case where there is used an electrically insulating member as the substrate 101 as in the case of FIG. 1(B), the lower electrode 102 serving to output a current is placed between the substrate 101 and the n-type semiconductor layer 103.

The electrode 102 may be a metallic thin film of a metal selected from the group consisting of Ag, Au, Pt, Ni, Cr, Cu, Al, Ti, Zn, Mo and W. Said metallic thin film may be properly formed by way of the known vacuum deposition technique, electron-beam deposition technique or reactive sputtering technique. However, due consideration should be given that the metallic thin film to be thus formed is not a resistive component for the photovoltaic element. In this respect, the metallic thin film constituting the electrode 102 preferably has a sheet resistance of 50 $\Omega$ or less, more preferably, 10 $\Omega$ or less.

In the alternative, it is possible to place a diffusion preventive layer comprising an electroconductive material such as zinc oxide between the lower electrode 102 and the n-type semiconductor layer 103. (This is not shown in FIGS. 1(a) and 1(B).

In the case where such diffusion preventive layer is used as mentioned above, the following advantages will be expected: (a) it prevents the metal elements constituting the elements constituting the electrode 102 from diffusing into the n-type semiconductor layer 103; (b) being provided with a certain resistance value, it prevents the occurrence of shorts, which would otherwise occur between the lower electrode 102 and the transparent electrode 106 through the semiconductor layers arranged between them due to pinholes and the like; and (c) it serves to generate multiple interferences with the thin film and confine the light as impinged within the photovoltaic element.

(ii) Upper electrode (transparent electrode)

The transparent electrode 106 is desired to have a light transmittance of more than 85% so that it serves to make the semiconductor layer efficiently absorb sunlight or fluorescent light. In addition to this, it is desired to have a sheet resistance of 100 Ω or less from the viewpoint of preventing the internal resistance of the photovoltaic element from becoming great thereby impairing the performance.

In view of the above, the transparent electrode 106 is desired to comprise a thin film of a metal oxide selected from the group consisting of $SnO_2$, $In_2O_3$, ZnO, CdO, $Cd_2SnO_2$ and ITO ($In_2O_3 + SnO_2$) or a semitransparent thin film of a metal selected from the group consisting of Au, Al and Cu.

The transparent electrode 106 is disposed on the p-type semiconductor layer 105 in the case of the photovoltaic element shown in FIG. 1(A), and it is disposed on the substrate 101 in the case of the photovoltaic element shown in FIG. 1(B).

In any of these cases, it is necessary to constitute the transparent electrode 106 with a thin film member selected from the foregoing which is good in adhesion with the layer or the substrate.

The transparent electrode 106 comprising such thin film may be formed by way of the known resistance heating deposition technique, electron-beam heating deposition technique, reactive sputtering technique or spraying technique.

(iii) Collecting electrode

The collecting electrode 107 in the photovoltaic element according to the present invention is disposed on the transparent electrode 106 for the purpose of reducing the surface resistance of said transparent electrode.

The collecting electrode 107 is desired to comprise a metallic thin film of Ag, Cr, Ni, Al, Ag, Au, Ti, Pt, Cu, Mo, W or an alloy of these metals. It is possible for the collecting electrode 107 to be constituted with a member comprising or stacked plurality of such metallic thin films.

The shape and the area of the collecting electrode 107 are properly designed so that a sufficient quantity of light can be received by the semiconductor layer.

Specifically as for the shape, it is desired to be such that extends uniformly all over the light receiving face of the photovoltaic element. As for the area, it is desired to cover 15% or less of said light receiving face in a preferred embodiment or a 10% or less in a more preferred embodiment.

The member of constituting the collecting electrode 107 preferably has a sheet resistance of 50 Ω or less, more preferably, 10 Ω or less.

p-type semiconductor layer, i-type semiconductor layer and n-type semiconductor layer The pin junction photovoltaic element according to the present invention is characterized by constituting the i-type semiconductor layer with the foregoing ZnSe:H deposited film or the foregoing $ZnSe_{1-x}Te_x$:H deposited film and because of this, it surpasses the known pin junction photovoltaic elements.

This is clarified by the experimentally obtained results described in the following.

As semiconductor materials capable of photoelectric conversion of short-wavelength light having high energy, there are known semiconductive compounds comprising Group II and Group VI elements of the Periodic Table such as ZnS, ZnSe, ZnTe, CdS, CdSe and ZnO (these compounds will be hereinafter called "Group II-VI compound"), each having a comparatively wide band gap. However, each of these Group II-VI compounds is insufficient in desired electrical properties when it is used as the i-type semiconductor layer in a pin junction photovoltaic element and because of this, it is difficult to obtain a desirable pin junction photovoltaic element with the use of any of these Group II-VI compounds as the i-type semiconductor layer thereof. In addition, for these Group II-VI compounds, it is difficult to provide p-type or n-type semiconductor films by doping them with a dopant of p-type or n type. Further in addition, it is extremely difficult to obtain a p-type semiconductor film having a sufficiently wide band gap therefrom.

This situation can also be understood by the following results obtained through experiments conducted by the present inventors.

That is, the present inventors tried to prepare (a) a pin junction photovoltaic element using a known i-type ZnSe semiconductor film or a known i-type $ZnSe_{1-x}Te_x$ semiconductor film, an n-type semiconductor film and a p-type semiconductor film, and a (b) another pin junction photovoltaic element using the foregoing i-type ZnSe:H semiconductor film or the foregoing i-type $ZnSe_{1-x}Te_x$:H semiconductor film ($x \approx 0.8$) according to the present invention, an n-type semiconductor film and a p-type semiconductor film. The photovoltaic elements obtained were evaluated from the viewpoints of adhesion of the i-type semiconductor layer with other layer(s) and open-circuit voltage (Voc). They were also evaluated for these effects in the cases where there were used the foregoing p-type ZnSe:H:$M_p$ or $ZnSe_{1-x}Te_x$:H:$M_p$ semiconductor film or/and the foregoing n-type ZnSe:H:Mn or $ZnSe_{1-x}Te_x$:H:Mn semiconductor films according to the present invention.

In every experiment, there was prepared a pin junction photovoltaic element of the configuration shown in FIG. 1(B). There were used a quartz glass plate as the substrate 101, a ITO thin film formed by the reactive sputtering method as the transparent electrode 106, and a Ag thin film formed by the known electron-beam heating method as the electrode 102. As for the known i-type ZnSe and $ZnSe_{1-x}Te_x$ semiconductor films, the known n-type nSe, ZnS and ZnO semiconductor films and the known p-type Znte and CdTe semiconductor films, were respectively formed by the known reactive sputtering method.

As for the i-type ZnSe:H and $ZnSe_{1-x}Te_x$:H semiconductor films, the n-type ZnSe:H and $ZnSe_{1-x}Te_x$:H:MN semiconductor films, and the p-type ZnSe:H:$M_p$ and $ZnSe_{1-x}Te_x$:H:$M_p$ semiconductor films according to the present invention were prepared in accordance with the method according to the present invention which will be later described.

As the n-type and p-type dopants in the above n-type and p-type semiconductor films, those mentioned in Tables 6(A) and 6(B) were used.

The evaluation results obtained are as shown in Tables 6(A) and 6(B).

As Tables 6(A) and 6(B) illustrate, it is understood that the pin junction photovoltaic elements in which the known i-type Group II-VI semiconductor films were used are mostly not practically useable, except for one case which is fairly good. On the other hand, it is understood that any of the pin junction photovoltaic elements in which the i-type ZnSe:H semiconductor film or the i-type ZnSe$_{1-x}$Te$_x$:H semiconductor film according to the present invention is used, is satisfactory in all the evaluation items. And particularly for the pin junction photovoltaic elements in which in addition to said i-type semiconductor films, the p-type ZnSe:H:M$_p$ or ZnSe$_{1-x}$Te$_x$:H:M$_p$ semiconductor films and/or the n-type ZnSe:H:Mn or ZnSe$_{1-x}$Te$_x$:H:Mn semiconductor films were used, they are all excellent in all the evaluation items.

In view of the above and also in view of the results in the aforementioned Experiments A through K, it is recognized that the pin junction photovoltaic element in which the i-type semiconductor layer is constituted with the foregoing ZnSe:H film or ZnSe$_{1-x}$Te$_x$:H film having excellent electrical and mechanical properties surpasses the known pin junction photovoltaic element in every respect and exhibits an improved photoelectric conversion efficiency. Now, as for the preparation of the pin junction photovoltaic element according to the present invention, it is desired to continuously carry out the formation process of the n-type semiconductor layer, the formation process of the i-type semiconductor layer and the formation process of the p-type semiconductor layer. To be more specific in this respect, the three processes are continuously carried out in the same film deposition apparatus. Alternatively, they are separately carried out in respective deposition apparatuses continuously connected through gate valves. In this case, the formation of the n-type semiconductor layer on a substrate is conducted in a first film deposition apparatus, then the resulting coated substrate is transferred into a second film deposition apparatus under vacuum conditions and the i-type semiconductor layer is formed on the previously formed n-type semiconductor layer therein, and the resulting laminate is transferred into a third film deposition apparatus under vacuum conditions and the p-type semiconductor layer is formed on the previously formed n-type semiconductor layer. In the meantime, any of the foregoing semiconductor films according to the present invention i.e. the i-type ZnSe:H and ZnSe$_{1-x}$Te$_x$:H semiconductor films, the p-type ZnSe:H:M$_p$ and ZnSe$_{1-x}$Te$_x$:H:M$_p$ semiconductor films and the n-type ZnSe:H:Mn and ZnSe$_{1-x}$Te$_x$:H:Mn semiconductor films may be effectively prepared in accordance with one of the following three processes (1) through (3).

(1) A process for preparing a functional deposited film comprised of ZnSe:H or ZnSe$_{1x}$Te$_x$:H which comprises the steps of introducing a Se-containing raw material gas and hydrogen gas (H$_2$), or further a Te-containing raw material gas into an activation space independent of the film-forming space, applying activation energy to these gases to form a Se-containing precursor and hydrogen radicals in an atomic state, or further including a Te-containing precursor, introducing said precursor(s) and hydrogen radicals into the film-forming space, simultaneously introducing a Zn-containing raw material gas into said film-forming space, and causing said gases to chemically react with each other in the space surrounding the surface of the substrate being maintained at elevated temperature in said film-forming space.

(2) A process for preparing a functional deposited film comprised of ZnSe:H or ZnSe$_{1-x}$Te$_x$:H which comprises the steps of introducing a Se-containing raw material gas, hydrogen gas (H$_2$), and a Zn-containing gas, or further a Te-containing raw material gas into the film-forming space in which a substrate is arranged and mixing said gases, applying a high-frequency power to a cathode installed in said film-forming space to thereby produce plasma in the reaction space of the film-forming space, and causing said gases to chemically react with one another through decomposition, polymerization, radicalization, and ionization.

(3) A process for preparing a functional deposited film comprised of ZnSe:H or ZnSe$_{1-x}$Te$_x$:H which comprises the steps of introducing Ar gas and H$_2$ gas into the film-forming space in which a substrate is arranged and a cathode is arranged opposite to said substrate while leaving a certain distance between them, said cathode being provided on the surface thereof with a target of polycrystal ZnSe or polycrystal ZnSe$_{1-x}$Te$_x$, applying a high-frequency power to said cathode to thereby perform the sputtering of said polycrystal ZnSe or polycrystal ZnSe$_{1-x}$Te$_x$ and form a plasma atmosphere environment in said film-forming space, and causing Se and Zn (and also Te) in the atomic state emitted from the target and hydrogen in the atomic state formed by the plasma exitation of the H$_2$ gas to chemically react with one other in the space surrounding the surface of the substrate.

The functional deposited film prepared by any of the above-mentioned three processes (1) to (3) may be given semiconductor characteristics by the introduction of a dopant. Particularly, it is possible to introduce a p-type dopant into the ZnSe:H film or ZnSe$_{1-x}$Te$_x$:H film. This makes it possible to provide a ZnSe:H:M$_p$ film or ZnSe$_{1-x}$Te$_x$:H:M$_p$ film having the p-type conductivity. The doping in this case may be accomplished by introducing a gas containing a p-type dopant, alone or in combination with hydrogen gas, into the film-forming space. Needless to say, it is also possible to prepare an n-type semiconductor from the ZnSe:H film or ZnSe$_{1-x}$Te$_x$ H film by using a gas containing an n-type dopant in the same manner as in the preparation of p-type semiconductor film.

The above-mentioned processes (1) to (3) of the present invention will be described in more detail in the following.

Processes (1) and (2)

As the raw material to introduce Zn ("raw material A" for short), an easily gasifiable alkyl zinc compound represented by the formula: R-Zn (where R denotes an alkyl residue having 1 to 4 carbon atoms) is used. Typical examples of the alkyl zinc compound include dimethyl zinc (DMZn) and diethyl zinc (DEZn). Being liquid at room temperature, these organozinc compounds are gasified by bubbling with an inert gas carrier such as Ar and He at the time of their use.

As the raw material to introduce Se ("raw material B" for short), a gaseous or easily gasifiable hydrogen selenide (H$_2$Se), selenium halide, or alkyl selenium compound represented by the formula: R'-Se (where R' denotes an alkyl residue having 1 to 4 carbon atoms) is used. Preferred examples of the selenium halide include selenium hexafluoride. Preferred examples of the alkyl selenium compound include dimethyl selenium (DMSe) and diethyl selenium (DESe).

As the raw material to introduce Te, a gaseous or easily gasifiable hydrogen telluride (H$_2$Te), tellurium halide, or alkyl tellurium compound represented by the formula: R'-Te (where R' denotes an alkyl residue having 1 to 4 carbon atoms) is used. Preferred examples of the tellurium halide include tellurium hexafluoride. Preferred examples of the alkyl tellurium compound include dimethyl tellurium (DMTe) and diethyl tellurium (DETe).

Incidentally, the raw materials to introduce Se and Te are collectively referred to as "raw material B" hereinafter.

Among the compounds to be the raw material B, those which are not gaseous but liquid or solid at room temperature are gasified at the time of their use by bubbling with an inert carrier gas such as Ar and He, or by sublimation with heating.

In the preparation of the ZnSe:H film or ZnSe$_{1-x}$Te$_x$:H film by the process (1) or (2), H$_2$ gas is purposely used.

According to a preferred embodiment of the process (1), the gaseous raw material B and H$_2$ gas in combination are introduced into an activation space, where they are excited with the action of an activation energy to form active species. In the case of using non-gaseous raw material B, the activation space may be constructed such that the non-gaseous raw material B is gasified by the aid of aforesaid inert gas or H$_2$ gas and the gas thus formed is excited with the action of an activation energy.

Needless to say, in the process (1), it is possible to introduce H$_2$ gas alone into a separate activation space independent of said activation space, where the H$_2$ gas is excited with the action of an activation energy.

The above activation energy may be discharge energy, thermal energy, or light energy, or a combination thereof.

The excitation of the raw material B may be accomplished by the aid of a proper catalyst as well as the activation energy.

The above-mentioned process (1) or (2) of the present invention may be practiced in the following manner to prepare the p-type or n-type ZnSe:H:M film or the p-type or n-type ZnSe$_{1-x}$Te$_x$:H:M film. That is, a gaseous raw material to provide a p-type dopant or n-type dopant ("p-type dopant raw material" or "n-type dopant raw material" for short) is introduced, alone, or together with the gaseous raw material A or the gaseous raw material B, or together with H$_2$ gas.

As the p-type dopant raw material, a gaseous or easily gasifiable compound is used. Examples of the p-type dopant raw material include organolithium compounds such as propyl lithium (LiC$_3$H$_7$) and sec-butyl lithium (Li(sec-C$_4$H$_9$)) which are liquid at room temperature; and inorganic lithium compounds such as lithium sulfide (Li$_2$S) and lithium nitride (Li$_3$N) which are solid at room temperature. Additional preferred examples include AsH$_3$, PH$_3$, P$_2$H$_4$, AsF$_3$, AsCl$_3$, PF$_5$, PF$_3$, PCl$_3$, SbH$_3$, and SbF$_3$.

The n-type dopant raw material, like the p-type dopant raw material, may be a member selected from those compounds which are gaseous at room temperature or easily gasifiable. Preferred examples of such compounds include trimethyl aluminum (Al(CH$_3$)$_3$), triethyl aluminum (Al(C$_2$H$_5$)$_3$), trimethyl gallium (Ga(CH$_3$)$_3$), triethyl gallium (Ga(C$_2$H$_5$)$_3$), trimethyl indium (In(CH$_3$)$_3$), triethyl indium (In(C$_2$H$_5$)$_3$), diborane (B$_2$H$_6$), monosilane (SiH$_4$), disilane (Si$_2$H$_6$), monogermane (GeH$_4$), tin hydride (SnH$_4$), methane (CH$_4$), ethane (C$_2$H$_6$), ethylene (C$_2$H$_4$), acetylene (C$_2$H$_2$), fluorine (F$_2$), and chlorine (Cl$_2$).

In the case where the p-type or n-type dopant raw material is liquid at room temperature, it is gasified at the time of use by bubbling with an inert gas such as Ar or He or H$_2$ gas as a carrier gas. In the case where the p-type or n-type dopant raw material is solid at room temperature, it is gasified at the time of use by sublimation with heating by the aid of a carrier gas such as Ar and He in a sublimation furnace.

In the case where the p-type or n-type ZnSe:H:M film or the p-type or n-type ZnSe$_{1-x}$Te$_x$:H:M film is prepared by the above-mentioned process (1), the dopant raw material is preferably introduced into the activation space together with the gaseous raw material B and H$_2$ gas.

The above-mentioned process (1) or (2) of the present invention may be practiced in the following manner to prepare the ZnSe:H film or ZnSe$_{1-x}$Te$_x$:H film, the p-type or n-type ZnSe:H:M film, or the p-type or n-type ZnSe$_{1-x}$Te$_x$:H:M film. That is, the substrate is maintained preferably at a temperature of 50° to 600° C., more preferably at a temperature of 50° to 500° C., and most preferably, at a temperature of 100° to 400° C. during the film formation process. So long as the substrate temperature is in the range of 50° to 600° C., usually there is obtained a deposited film in which crystal grain domains and non-crystal grain domains coexist, wherein the amount of hydrogen radicals or the flow rate of H$_2$ gas is changed during the film formation process.

One of the important film forming factors in the above-mentioned process (1) and (2) is the inner pressure of the film-forming space upon forming the desired film.

And it is preferably from $1 \times 10^{-4}$ to 50 Torr, more preferably from $5 \times 10^{-3}$ to 10 Torr, and most preferably, from $1 \times 10^{-3}$ to 5 Torr. In practice, the gaseous raw material A, the gaseous raw material B and hydrogen gas (H$_2$), and the gaseous dopant (p-type or n-type) raw material in cases where it is used, are introduced while being controlled through respective mass flow controllers at respective flow rates predetermined by the kind of the semiconductor film to be prepared and while maintaining the inner pressure of the film-forming space at a value in the above range.

In the case of the process (1), the gaseous raw material A and the gaseous raw material B and the hydrogen radicals in atomic state are introduced into the film-forming space at a predetermined ratio. Said ratio, that is, the ratio of the sum of the flow rates for the two gaseous raw materials versus the flow rate of the hydrogen radicals, is properly determined by the kinds of the two raw materials to be used and also the characteristics desired for the film to be prepared. However, in general, it is preferably from 1:10 to 1:10$^4$, and more preferably, from 1:25 to 1:10$^3$.

Likewise, in the case of the process (2), the ratio of the sum of the flow rate for the gaseous raw material A and the flow rate for the gaseous raw material B versus the flow rate for the hydrogen gas (H$_2$) is determined by the interrelations among the high frequency power to be applied, the inner pressure of the film-forming space and the amount of hydrogen atoms to be incorporated into the film to be prepared. However, in general, it is preferably from 1:20 to 1:5$\times 10^4$, and more preferably, from 1:30 to 1:5$\times 10^3$.

PROCESS (3)

This process is designed to prepare the above-mentioned ZnSe:H film or ZnSe$_{1-x}$Te$_x$:H film, the p-type or n-type ZnSe:H:M film, or the p-type or n-type ZnSe$_{1-x}$Te$_x$:H:M film by means of sputtering, as mentioned above.

The target to be used is typically polycrystal ZnSe or polycrystal ZnSe$_{1-x}$Te$_x$ containing Se and Te in a desired ratio. It may also be possible to use two targets of Zn and Se, two targets of ZnSe and ZnTe, or three targets of Zn, Se, and Te. In the case where the sputtering is performed by the application of high-frequency power to the target, it is preferable to form a gas atmosphere composed of H$_2$ gas and Ar gas and/or He gas.

In the case of preparing the p-type or n-type ZnSe:H:M film, or the p-type or n-type ZnSe$_{1-x}$Te$_x$:H:M film in accordance with the process (3), the above sputtering is performed in a gas atmosphere composed of H$_2$ gas and Ar gas and/or He gas and also the foregoing gaseous p-type or n-type dopant raw material.

Figure 3:
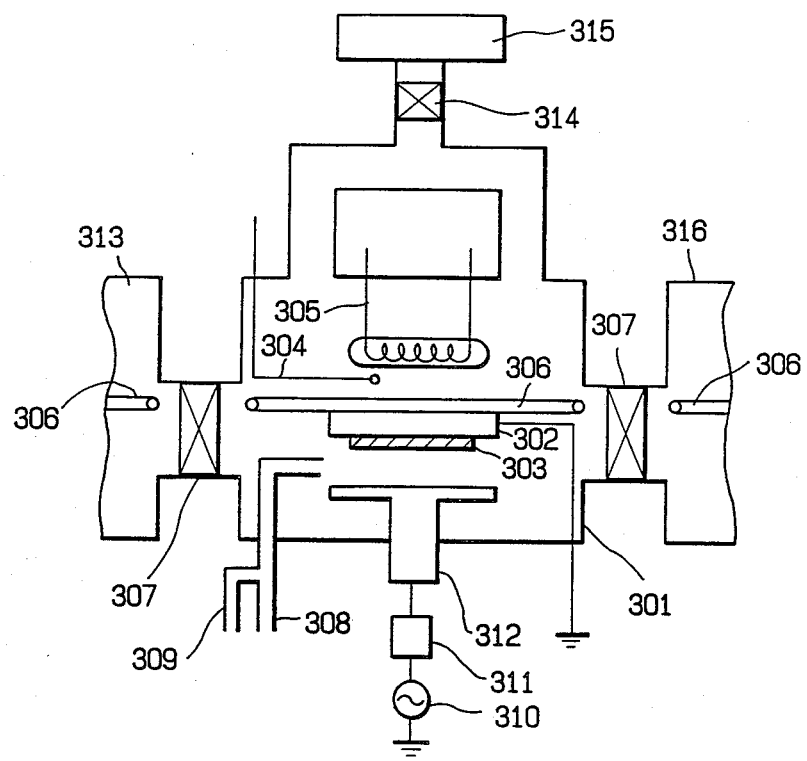
FIG. 3 is a schematic diagram showing the apparatus for forming a deposited film according to process (2) of the present invention.
Figure 4:
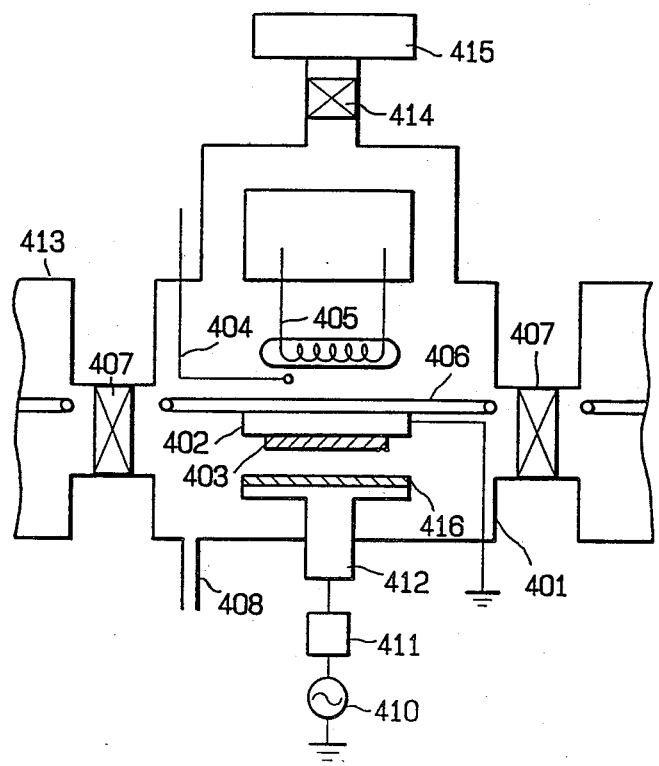
FIG. 4 is a schematic diagram showing the apparatus for forming a deposited film according to process (3) of the present invention.

In the production of the ZnSe:H film or ZnSe$_{1-x}$Te$_x$:H film, the p-type or n-type ZnSe:H:M film, or the p-type or n-type ZnSe$_{1-x}$Te$_x$:H:M film according to process (3), the important film-forming conditions include the target-to-substrate distance, the high-frequency power, the substrate temperature, the inner pressure, and the gas flow rate. The target-to-substrate distance may vary depending on the construction and scale of the equipment used. In general, it is preferably from 20 to 100 mm, and more preferably, from 40 to 80 nm. The high-frequency power may vary depending on the type and size of the target. In general, it is preferably from 0.3 to 7 W/cm$^2$, and most preferably, from 0.8 to 4 W/cm$^2$. As for the substrate temperature, it is adjusted to the same range as in the above-mentioned process (1) or (2). As for the inner pressure at the time of forming the film, it is preferably from $1 \times 10^{-5}$ to $1 \times 10^{-1}$ Torr, and more preferably, from $1 \times 10^{-4}$ to $1 \times 10^{-2}$ Torr. The H$_2$ gas and Ar gas and/or He gas and the gaseous p-type or n-type dopant raw material are controlled in relation to the amounts of Zn and Se (or also the amount of Te) in the atomic state which are emitted from the target during the sputtering. The respective flow rates of the above gases are controlled by mass flow controllers such that the gas atmosphere in the reaction zone of the film-forming space contains a prescribed amount of hydrogen atoms (H) or a prescribed sum of hydrogen atoms (H) and dopant (M) (or H+M). In this case, the film-forming space is evacuated such that the above-mentioned internal pressure is maintained. And it is desired to establish a certain ratio between the sum of Zn and Se (and also Te) in atomic state and the amount of hydrogen atoms (H) or the sum of hydrogen atoms (H) and dopant (M) (H+M). It is preferably from 10$^2$:1 to 1:10$^3$, more preferably from 10:1 to 1:10$^2$, and most preferably, from 5:1 to 1:50. Any of the above-mentioned processes (1) to (3) may be practiced using a suitable apparatus. Typical examples of such apparatus are shown in FIGS. 2 to 4.

FIG. 2 schematically shows a preferred example of the apparatus suitable to practice the process (1) of the present invention. In FIG. 2, there is shown a film forming chamber 201 in which is installed a substrate holder 202. There is shown a substrate 203 which is fixed onto the substrate holder 202. The substrate 203 is heated by radiation from an infrared heater 205, while being monitored by a temperature monitor 204. The substrate holder 202 is transferred to the other film forming chamber 213 or a load lock chamber 212 through a gate valve 207 by a substrate transfer unit 206. Raw material gas (A) is introduced into the film forming chamber 201 through the gas inlet pipe (A) 208. Raw material gas (B) and hydrogen gas are introduced through the gas inlet pipe (B) 209. The gases are activated in an activation region 210 by an activation means 211, and then introduced into the film forming chamber 201.

The activation means may be any means to decompose, polymerize, radicalize, or ionize raw material gases (A) and (B) and hydrogen gas by the aid of electric energy of direct current, high-frequency, or microwave, or by the aid of light energy, or heat energy, or by the aid of catalyst, to thereby promote the reactions among the raw material gases (A) and (B) and hydrogen gas and also promote the film-forming reactions on the surface of the substrate.

The gases in the film forming chamber are exhausted through a valve 214 by an exhaust pump 215, so that the pressure in the film forming chamber is kept at a prescribed level.

Explanation will be made of an example of the preparation of the ZnSe:H film of the present invention using the apparatus shown in FIG. 2.

At first, Se-containing raw material gas (B) such as DESe and hydrogen gas are fed through the gas inlet pipe 209. The gases are activated in the activation region 210 with the action of activation energy supplied by the activating means 211. Thus there are formed Se-containing precursor and hydrogen radicals in atomic state.

On the other hand, the Zn-containing raw material gas (A) such as DEZn entering through the other gas inlet pipe 208 is introduced into the film forming chamber 201 without being excited by the activating means because the opening of the gas inlet pipe 208 is located downstream being apart from the activation region 210. In the film forming chamber, the Zn-containing raw material gas (A) reacts with hydrogen radicals to form a Zn-containing precursor.

Upon introduction into the film-forming chamber, the Se-containing precursor, Zn-containing precursor, and hydrogen radicals react with one another to form a ZnSe:H film containing a desired amount of hydrogen atoms.

It is considered that hydrogen radicals take part also in the reaction for film deposition on the substrate surface. That is, the hydrogen radicals function to remove unnecessary alkyl groups from the deposited film and also to terminate dangling bonds in the ZeSe thin film and they are incorporated into the film. The activation energy in the activating region can be brought to the film-forming chamber for example by increasing the quantity of the activation energy supplied by the activating means in case where necessary to promote the reaction of the Zn-containing raw material gas with hydrogen radicals and the reaction of the Zn-containing precursor with the Se-containing precursor in the reaction chamber and also to increase the amount of hydrogen radicals to be supplied. The amount of hydrogen atoms (H) to be contained in the ZnSe:H film as obtained can be controlled by adjusting the flow rate of hydrogen gas introduced as a raw material gas, the quantity of activation energy to be supplied, the inner pressure in the film-forming chamber, the distance between the activation region 210 and the opening of the gas inlet pipe 208, and the substrate temperature. The deposited film can be made p-type or n-type by adding the above-mentioned dopant raw material to the raw material gas (A) or raw material gas (B). In the case of preparing $ZnSe_{1-x}Te_x$:H film, the raw material gas (B) is introduced together with a Te-containing raw material gas such as DETe into the system.

FIG. 3 schematically shows a preferred example of the apparatus used to practice the process (2) of the present invention. When this apparatus is in operation, raw material gas (A) is introduced through the gas inlet pipe 308, and raw material gas (B) and hydrogen gas are introduced through the gas inlet pipe 309. These gases are eventually mixed and they are reacted while being decomposed, polymerized, radicalized, and ionized in plasma generated by high-frequency power applied to the cathode 312 from the high-frequency source 310 through the matching circuit 311 to thereby form a ZnSe:H thin film or a $ZnSe_{1-x}Te_x$:H film on the substrate 303. In the case of forming said $ZnSe_{1-x}Te_x$:H film, the raw material gas (A) is mixed with a Te-containing raw material gas. By feeding the foregoing dopant raw material in the above case, the resulting deposited film may be made p-type or n-type.

FIG. 4 schematically shows a preferred example of the apparatus suitable to practice the process (3) of the present invention. In FIG. 4, there is shown a cathode 412, onto which is attached a target 416 of ZnSe polycrystal or $ZnSe_{1-x}Te_x$ polycrystal. Ar gas and $H_2$ gas are introduced through the gas inlet 408 and they are ionized by plasma generated by high-frequency power applied to the cathode 412. The resulting Ar ions and H ions contribute to the sputtering of the target 416. Thus a ZnSe:H thin film or a $ZnSe_{1-x}Te_x$:H film is deposited on the substrate 403. By mixing the Ar gas and $H_2$ gas with the above-mentioned dopant raw material, the resulting deposited film may be made p-type or n-type.

DESCRIPTION OF THE PREFERRED EMBODIMENTS

The photovoltaic element of the present invention will be described in more detail with reference to the following examples, which are not intended to restrict the scope of the invention.

EXAMPLE 1

A pin junction photovoltaic element with the configuration shown in FIG. 1(A) was prepared using the deposited film forming apparatus shown in FIG. 2, in accordance with the above-mentioned process (1).

At first, a stainless steel substrate 101 of 50 mm by 50 mm in size was placed in a known sputtering apparatus (not shown). The sputtering apparatus was evacuated to $10^{-5}$ Torr or below. On the substrate was deposited an Ag thin film of about 1000 Å in thickness as the lower electrode 102 by sputtering Ag in argon. The substrate was removed from the sputtering apparatus and then fixed, with the lower electrode 102 facing downward, onto the substrate holder 202 on the substrate transfer unit 206 installed in the load lock chamber 212. The load lock chamber 212 was evacuated to $10^{-5}$ Torr or below by means of a vacuum pump (not shown). During evacuation, the film-forming chamber 201 was evacuated to $10^{-5}$ Torr or below by means of the vacuum pump 215. When the pressures in the two chambers became almost balanced, the two chambers were opened and the substrate transfer unit 206 was moved to the film forming chamber 201.

The substrate was then heated to about 200° C. by actuating electric heater 205.

Thereafter, liquid DESe in Dewar's bottle 223 was gasified by bubbling it with Ar gas from gas reservoir 217 to generate Ar gas saturated with DESe. At that time, the flow rate of said Ar gas was controlled to 15 SCCM by means of mass flow controller 219.

The resultant Ar gas saturated with DESe was successively transported into the gas inlet pipe 209 while the flow rate of DESe was controlled to $1.5 \times 10^{-5}$ mol/min. At the same time, $H_2$ gas from gas reservoir 216 was introduced into the gas inlet pipe 209 while its flow rate was controlled to 15 SCCM by means of mass flow controller 218. Concurrently, DEZn in Dewar's bottle 224 and TEAl in Dewar's bottle 225 were introduced into the gas inlet pipe 208 at respective flow rates of $1.0 \times 10^{-6}$ mol/min and $3.0 \times 10^{-9}$ mol/min in the same manner as in the case of said DESe. In each of these two cases, the flow rate of Ar gas was controlled to 5 SCCM.

In the, the above respective flow rates for said DESe, DEZn and TEAl were set up by controlling the respective temperatures of constant temperature waters 235, 236 and 237 contained in constant temperature water baths 227, 228 and 229 in which the Dewar's bottles 223, 224 and 225 were placed by means of electric heaters 231, 232 and 233 in said water baths 227, 228 and 229 to thereby adjust the respective temperatures of the starting raw liquids for said DESe, DEZn and TEAl to desired temperatures.

With the exhaust valve 214 properly opened, the inner pressure of the film-forming chamber 201 was kept at 0.5 Torr. Film-forming was started by applying microwave power (200 W) from the microwave generator 211. After 2 minutes, there was formed an n-type ZnSe:H:Al film 103 on the substrate 101. The application of microwave power and the introduction of gases were suspended, and the film-forming chamber 201 was evacuated to $10^{-5}$ Torr or below by the vacuum pump 215.

The above procedures were repeated, except that the introduction of TEAl was not conducted, to thereby deposit an i-type ZnSe:H film 104 on the previously formed n-type ZnSe:H:Al film 103. The film-forming was continued for 50 minutes.

Then, there was deposited a p-type ZnSe:H:Li film 105 on the previously formed i-type ZnSe:H film 104 by repeating the procedures for the formation of said i-type ZnSe:H film except that liquid $LiC_3H_7$ in Dewar's bottle 226 was gasified by bubbling it with Ar gas from the gas reservoir 217 to generate Ar gas saturated with $LiC_3H_7$, which was transported into the gas inlet pipe 208 at a flow rate of $1.0 \times 10^{-9}$ mol/min for the $LiC_3H_7$. The flow rate of said Ar gas in this case was controlled to 5 SCCM. And the film-forming was continued for 20 minutes.

The above film-forming conditions are shown in Table 7.

Thereafter, the substrate transfer unit 206 was moved to the load lock chamber 212 through the gate valve 207. After cooling therein, the substrate 101 on which were deposited the n-type, i-type and p-type semiconductor layers was taken out. Then, the substrate was placed in a known vacuum deposition apparatus, which was evacuated to $10^{-5}$ Torr or below. On the foregoing p-type ZnSe:H:Li semiconductor layer 105 on the substrate 101 was deposited an ITO thin film of about 700 Å in thickness in an oxygen atmosphere with about $1\times10^{-3}$ Torr. The source of deposition was a 1:1 (by weight) mixture of In and Sn placed in a crucible which was heated by the resistance heating method. The substrate temperature was 175° C. In this way the transparent electrode 106 was formed. After cooling, the substrate was removed. With a permalloy mask placed on the transparent electrode 106, the substrate was placed in another known vacuum deposition apparatus, which was evacuated to $1\times10^{-5}$ Torr or below. A Ag film of about 1.0 μm in thickness was deposited by the resistance heating method to form the comb-shaped collecting electrode 107. Thus there was obtained sample No. 1.

The characteristic properties of Sample No. 1 as a solar cell were evaluated in the following manner.

The open-circuit voltage (Voc) which is produced when the transparent electrode 106 is irradiated with AM-1 light (100 mW/cm$^2$) was measured. The output which is produced when the transparent electrode 106 is irradiated with AM-1 light through a 400-nm interference filter was measured. The change Δη in conversion efficiency that takes place after irradiation with AM-1 light for 10 hours was measured.

The results of measurements were as shown in Table 16.

Other than the foregoing, there were provided a silicon single crystal wafer with a SiO$_2$ film formed thereon by the known thermal oxidation technique, and a quartz glass plate. And there were deposited a ZnSe:H:Al film as the aforesaid n-type semiconductive layer, a ZnSe:H film as the aforesaid i-type semiconductor layer and a ZnSe:H:Li film as the aforesaid p-type semiconductor layer respectively on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 16.

EXAMPLE 2

A pin junction photovoltaic element with the configuration shown in FIG. 1(A) was prepared using the film-forming apparatus shown in FIG. 3, in accordance with the above-mentioned process (2).

On a stainless steel substrate 101 (303 in FIG. 3) was deposited an Ag thin film as the lower electrode 102 in the same manner as in Example 1. The substrate 303 was fixed onto the substrate holder 302. While the inner pressure in the film-forming chamber 301 was kept at $10^{-5}$ Torr or below, the substrate 303 was heated to about 300° C. by means of infrared heater 305. The raw material gas A and raw material gas shown in the column "n-type" of Table 8 were introduced into the film-forming chamber 301 through the gas inlet pipes 308 and 309 respectively, under the conditions shown in the column "n-type" of Table 8.

With the exhaust valve 314 properly opened, the inner pressure of the film-forming chamber 301 was kept at 1.0 Torr. Film-forming was started by applying high-frequency power (50 W) from the high-frequency (13.56 MHz) generator 310. (The high-frequency generator 310 is connected to the cathode 312 through the matching circuit 311.) After discharging for 6 minutes, there was deposited an n-type ZnSe:H:Al film 103. The application of high-frequency power and the introduction of the gases were suspended, and the film-forming chamber 301 was evacuated to $10^{-5}$ Torr or below. Then, the raw material gases A and B shown in the column "i-type" of Table 8 were introduced into the film-forming chamber 301.

With the inner pressure kept at 1.0 Torr, high-frequency power (50 W) was applied from the high-frequency source 310. After discharging for 30 minutes under the film-forming conditions shown in the column "i-type" of Table 8, there was deposited an i-type ZnSe:H film 104 on the previously formed n-type ZnSe:Al film 103.

Then, the above procedures were repeated, except that there were used the raw material gases A and B shown in the column "p-type" of Table 8 and the respective flow rates of said raw material gases were controlled to those mentioned in the column "p-type" of Table 8, to thereby deposit a p-type ZnSe:H:Li film 105 on the previously formed i-type ZnSe:H film 104.

The substrate with the deposited films was removed from the film-forming chamber. On the deposited p-type film was formed an ITO film of about 700 Å in thickness as the transparent electrode 106 in the same manner as in Example 1. On the ITO film was formed an Ag thin film as the collecting electrode 107. Thus there was obtained Sample No. 2. The characteristic properties of Sample No. 2 as a solar cell were evaluated in the same manner as in Example 1. As a result, there were obtained the results shown in Table 16.

Other than the foregoing, there were provided a silicon single crystal wafer with a SiO$_2$ film formed thereon by the known thermal oxidation technique, and a quartz glass plate. And there were deposited an n-type ZnSe:H:Al film as the aforesaid n-type semiconductor layer, an i-type ZnSe:H film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 16.

EXAMPLE 3

A pin junction photovoltaic element with the configuration shown in FIG. 1(A) was prepared using the apparatus shown in FIG. 4, in accordance with the abovementioned process (3).

On a stainless steel substrate 101 (403 in FIG. 4) was deposited the lower electrode 102 comprising Ag in the same manner as in Example 1. The substrate was fixed onto the substrate holder 402 on the substrate transfer unit 406 and transferred into the film-forming chamber 401. The inner pressure in the film-forming chamber 401 was kept at $10^{-5}$ Torr or below. A ZnSe polycrystal target 416 was placed on cathode 412. The substrate 403 was heated to about 200° C. by means of infrared heater 405. The raw material gases shown in the column "n-type" of Table 9 were introduced at the respective flow rates shown therein into the film-forming chamber 401 through the gas inlet pipe 401.

With the exhaust valve 414 properly opened, the inner pressure of the film-forming chamber 401 was kept at 0.05 Torr. Film-forming was started by applying high-frequency power (300 W). After discharging for 10 minutes, there was deposited an n-type ZnSe:H:Al film 103. The discharging and the introduction of the gases were suspended.

The film-forming chamber was evacuated to $10^{-5}$ Torr or below, and the raw material gas shown in the column "i-type" of Table 9 was introduced at the flow rate shown therein into the film-forming chamber. After discharging with a 300 W of high-frequency power and with a vacuum of 0.05 Torr for 30 minutes, there was deposited an i-type ZnSe:H film 104 on the previously formed n-type ZnSe:H:Al film 103.

Thereafter, the above procedures were repeated, except that the raw material gases shown in Table 9 were introduced at the respective flow rates shown therein, to thereby deposit a p-type ZnSe:H:Li film 105 on the previously formed i-type ZnSe:H film 104.

On the foregoing p-type ZnSe:H:Li film was formed an ITO film of about 700 Å in thickness as the transparent electrode 106 and a Ag film as the collecting electrode 107. Thus there was obtained Sample No. 3. The characteristic properties of Sample No. 3 as a solar cell were evaluated. The results obtained were as shown in Table 16.

Other than the foregoing, there were provided a silicon single crystal wafer with a $SiO_2$ film formed thereon by the known thermal oxidation technique, and a quartz glass plate. And there were deposited an n-type ZnSe:H:Al film as the aforesaid n-type semiconductor layer, an i-type ZnSe:H film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 16.

EXAMPLE 4

In the preparation of the pin junction photovoltaic element of Examples 1 to 3, the n-type, i-type and p-type semiconductor layers were all prepared in the same manner utilizing the same film-forming chamber. However, the manners for forming these layers may be different one from the other.

This example illustrates the preparation of a pin junction photovoltaic element in the case where the formations of the n-type and p-type semiconductor layers were carried out in a manner different from the manner for the formation of the i-type semiconductor layer.

In this example, as the film-forming apparatus, there was used the apparatus shown in FIG. 3 in which the film-forming chamber 316 comprises the same film-forming chamber 201 as shown in FIG. 2.

At first, on a stainless steel substrate 101 (303 in FIG. 3) was deposited an Ag thin film of 3000 Å in thickness as the lower electrode 102. The substrate was fixed onto the substrate holder 302 on the substrate transfer unit 306 in the film-forming chamber 301. On the substrate was deposited an n-type ZnSe:H:Al film 103 by repeating the procedures for the formation of the n-type ZnSe:H:Al film in Example 2. The film-forming chamber 301 was evacuated to $10^{-5}$ Torr or below, and the substrate transfer unit 306 was moved into the second film-forming chamber 316 through the gate valve 307. Subsequently, on the n-type ZnSe:H:Al film was deposited an i-type ZnSe:H film 104 by repeating the procedures for the formation of the i-type ZnSe:H film in Example 1.

Then, the substrate transfer unit 306 was returned into the first film-forming chamber 301 through the gate valve 307. The procedures for the formation of the p-type ZnSe:H:Li film in Example 2 were repeated to thereby deposited a p-type ZnSe:H:Li film 105 on the previously formed i-type ZnSe:H film.

On the thus formed p-type ZnSe:H:Li film 105 were formed a transparent electrode 106 comprising an ITO thin film then a collecting electrode 107 comprising a Ag thin film respectively in the same manner as in Example 1.

Thus there was obtained Sample No. 4.

The characteristic properties of Sample No. 4 as a solar cell were evaluated.

The results obtained were as shown in Table 17.

Other than the foregoing, there were provided a silicon single crystal wafer with a $SiO_2$ film formed thereon by the known thermal oxidation technique, and a quartz glass plate. And there were deposited an n-type ZnSe:H:Al film as the aforesaid n-type semiconductor layer, an i-type ZnSe:H film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 17.

EXAMPLE 5

In this example, there were prepared a variety of pin junction photovoltaic elements (Sample Nos. 5 to 13) with the configuration shown in FIG. 1(A), respectively having the n-type semiconductor layer comprising an n-type ZnS:Al film, the i-type semiconductor layer comprising an i-type ZnSe:H film and the p-type semiconductor layer comprising a p-type ZnSe:H:Li film.

In the preparation of each sample, there was used a stainless steel of 50 mm × 50 mm in size as the substrate 101, and on which was formed a Ag thin film as the lower electrode 102 in the same manner as in Example 1. Thereafter, there were successively formed an n-type ZnS:Al film as the n-type semiconductor layer 103, an i-type ZnSe:H film as the i-type semiconductor layer 104 and a p-type ZnSe:H:Li film as the p-type semiconductor layer 105.

The preparation of the n-type semiconductor layer 103 for each sample was carried out by the corresponding preparation method 4, 5 or 6 shown in Table 10.

The preparation of the i-type semiconductor layer 104 for each sample was carried out by the preparation method 1 (method for the formation of the i-type ZnSe:H film in Example 1), the preparation method 2 (method for the formation of the i-type ZnSe:H film in Example 2) or the preparation method 3 (method for the formation of the i-type ZnSe:H film in Example 3).

The preparation of the p-type semiconductor layer 105 for each sample was carried out by the preparation method 1 (method for the formation of the p-type ZnSe:H:Li film in Example 1), the preparation method 2 (method for the formation of the p-type ZnSe:H:Li film in Example 2) or the preparation method 3 (method for the formation of the p-type ZnSe:H:Li film in Example 3).

Then, there were successively formed a ITO thin film as the transparent electrode 106 and a comb-shaped Ag thin film as the collecting electrode 107 respectively in the same manner as in Example 1.

In this way, there were obtained photovoltaic element samples Nos. 5 to 13.

The characteristic properties of each of these samples as a solar cell were evaluated in the same evaluation manner as in Example 1.

The results obtained were as shown in Table 18.

Other than the foregoing, there were provided a silicon single crystal wafer with a $SiO_2$ film formed thereon by the known thermal oxidation technique, and a quartz glass plate. And there were deposited an n-type ZnS:Al film as the aforesaid n-type semiconductor layer, an i-type ZnSe:H film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films in the preparation of each of the foregoing photovoltaic element samples Nos. 5 to 13.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 18.

EXAMPLE 6

In this example, there were prepared a variety of pin junction photovoltaic elements (Sample Nos. 14 to 22) with the configuration shown in FIG. 1(A), respectively having the n-type semiconductor layer comprising an n-type ZnO:Al film, the i-type semiconductor layer comprising an i-type ZnSe:H film and the p-type semiconductor layer comprising a p-type ZnSe:H:Li film.

In the preparation of each sample, there was used a stainless steel of 50 mm × 50 mm in size as the substrate 101, and on which was formed a Ag thin film as the lower electrode 102 in the same manner as in Example 1. Thereafter, there were successively formed an n-type ZnO:Al film as the n-type semiconductor layer 103, an i-type ZnSe:H film as the i-type semiconductor layer 104 and a p-type ZnSe:H:Li film as the p-type semiconductor layer 105.

The preparation of the n-type semiconductor layer 103 for each sample was carried out by the corresponding preparation method 7, 8 or 9 shown in Table 11.

The preparation of the i-type semiconductor layer 104 for each sample was carried out by the preparation method 1 (method for the formation of the i-type ZnSe:H film in Example 1), the preparation method 2 (method for the formation of the i-type ZnSe:H film in Example 2) or the preparation method 3 (method for the formation of the i-type ZnSe:H film in Example 3).

The preparation of the p-type semiconductor layer 105 for each sample was carried out by the preparation method 1 (method for the formation of the p-type ZnSe:H:Li film in Example 1), the preparation method 2 (method for the formation of the p-type ZnSe:H:Li film in Example 2) or the preparation method 3 (method for the formation of the p-type ZnSe:H:Li film in Example 3).

Then, there were successively formed a ITO thin film as the transparent electrode 106 and a comb-shaped Ag thin film as the collecting electrode 107 respectively in the same manner as in Example 1.

In this way, there were obtained photovoltaic element samples Nos. 14 to 22.

The characteristic properties of each of these samples as a solar cell were evaluated in the same evaluation manner as in Example 1.

The results obtained were as shown in Table 19.

Other than the foregoing, there were provided a silicon single crystal wafer with a $SiO_2$ film formed thereon by the known thermal oxidation technique, and a quartz glass plate. And there were deposited an n-type ZnO:Al film as the aforesaid n-type semiconductor layer, an i-type ZnSe:H film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films in the preparation of each of the foregoing photovoltaic element samples Nos. 14 to 22.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 19.

EXAMPLE 7

In this example, there were prepared a variety of pin junction photovoltaic elements (Sample Nos. 23 to 31) with the configuration shown in FIG. 1(A), respectively having the n-type semiconductor layer comprising an n-type ZnSe:Al film, the i-type semiconductor layer comprising an i-type ZnSe:H film and the p-type semiconductor layer comprising a p-type ZnSe:H:Li film.

In the preparation of each sample, there was used a stainless steel of 50 mm × 50 mm in size as the substrate 101, and on which was formed a Ag thin film as the lower electrode 102 in the same manner as in Example 1. Thereafter, there were successively formed an n-type ZnSe:Al film as the n-type semiconductor layer 103, an i-type ZnSe:H film as the i-type semiconductor layer 104 and a p-type ZnSe:H:Li film as the p-type semiconductor layer 105.

The preparation of the n-type semiconductor layer 103 for each sample was carried out by the corresponding preparation method 10, 11 or 12 shown in Table 12.

The preparation of the i-type semiconductor layer 104 for each sample was carried out by the preparation method 1(method for the formation of the i-type ZnSe:H film in Example 1), the preparation method 2 (method for the formation of the i-type ZnSe:H film in Example 2) or the preparation method 3 (method for the formation of the i-type ZnSe:H film in Example 3).

The preparation of the p-type semiconductor layer 105 for each sample was carried out by the preparation method 1 (method for the formation of the p-type ZnSe:H:Li film in Example 1), the preparation method 2 (method for the formation of the p-type ZnSe:HLi film in Example 2) or the preparation method 3 (method for the formation of the p-type ZnSe:H:Li film in Example 3).

Then, there were successively formed an ITO thin film as the transparent electrode 106 and a comb-shaped Ag thin film as the collecting electrode 107 respectively in the same manner as in Example 1.

In this way, there were obtained photovoltaic element samples Nos. 23 to 31.

The characteristic properties of each of these samples as a solar cell were evaluated in the same evaluation manner as in Example 1.

The results obtained were as shown in Table 20.

Other than the foregoing, there were provided a silicon single crystal wafer with a $SiO_2$ film formed thereon by the known thermal oxidation technique, and a quartz glass plate. And there were deposited an n-type ZnSe:Al film as the aforesaid n-type semiconductor layer, an i-type ZnSe:H film as the aforesaid i-type semiconductor layer and a p-type ZnSe:H:Li film as the aforesaid p-type semiconductor layer respectively on said silicon single crystal wafer and also on said quartz glass place by repeating the aforesaid respective procedures for the formation of these films in the preparation of each of the foregoing photovoltaic element samples Nos. 23 to 31.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 20.

EXAMPLE 8

In this example, there were prepared a variety of pin junction photovoltaic elements (Sample Nos. 32 to 40) with the configuration shown in FIG. 1(A), respectively having the n-type semiconductor layer comprising an n-type ZnSe:H:Al film, the i-type semiconductor layer comprising an i-type ZnSe:H film and the p-type semiconductor layer comprising a p-type ZnTe:Li film.

In the preparation of each sample, there was used a stainless steel of 50 mm×50 mm in size as the substrate 101, and on which was formed a Ag thin film as the lower electrode 102 in the same manner as in Example 1. Thereafter, there were successively formed an n-type ZnSe:H:Al film as the n-type semiconductor layer 103, an i-type ZnSe:H film as the i-type semiconductor layer 104 and a p-type ZnTe:Li film as the p-type semiconductor layer 105.

The preparation of the n-type semiconductor layer 103 for each sample was carried out by the preparation method 1 (method for the formation of the n-type ZnSe:H:Al film in Example 1) the preparation method 2 (method for the formation of the n-type ZnSe:H:Al film in Example 2) or the preparation method 3 (method for the formation of the n-type ZnSe:H:Al film in Example 3).

The preparation of the i-type semiconductor layer 104 for each sample was carried out by the preparation method 1(method for the formation of the i-type ZnSe:H film in Example 1), the preparation method 2 (method for the formation of the i-type ZnSe:H film in Example 2) or the preparation method 3 (method for the formation of the i-type ZnSe:H film in Example 3).

The preparation of the p-type semiconductor layer 105 for each sample was carried out by the preparation method 13, 14 or 15 shown in Table 13.

Then, there were successively formed an ITO thin film as the transparent electrode 106 and a comb-shaped Ag thin film as the collecting electrode 107 respectively in the same manner as in Example 1.

In this way, there were obtained photovoltaic element samples Nos. 32 to 40.

The characteristic properties of each of these samples as a solar cell were evaluated in the same evaluation manner as in Example 1.

The results obtained were as shown in Table 21.

Other than the foregoing, there were provided a silicon single crystal wafer with a $SiO_2$ film formed thereon by the known thermal oxidation technique, and a quartz glass plate. And there were deposited an n-type ZnSe:H:Al film as the aforesaid n-type semiconductor layer, an i-type ZnSe:H film as the aforesaid i-type semiconductor layer and a p-type ZnTe:Li film as the aforesaid p-type semiconductor layer respectively on said silicon single crystal wafer and also on said quartz glass place by repeating the aforesaid respective procedures for the formation of these films in the preparation of each of the foregoing photovoltaic element samples Nos. 32 to 40.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 21.

EXAMPLE 9

In this example, there were prepared a variety of pin junction photovoltaic elements with the configuration shown in FIG. 1(B)[Sample Nos. 41 to 44], having the p-type semiconductor layer 105 comprising a ZnSe:H:Li film, the i-type semiconductor layer 104 comprising a ZnSe:H film and the n-type semiconductor layer 103 comprising a member selected from the group consisting of ZnSe:H:Al film, ZnS:Al film, ZnO:Al film and ZnSe:Al film.

In the preparation of each sample, there was used a glass plate (Corning's glass No. 7059 of Corning Glass Co., U.S.A.) of 50 mm×50 mm in size as the substrate 101, and on which was formed an ITO thin film of 500 Å in thickness as the transparent electrode 106 in accordance with the known reactive sputtering method. Thereafter there was formed a p-type ZnSe:H:Li film as the p-type semiconductor layer 105 by repeating the procedures for the formation of the p-type ZnSe:H:Li film in Example 1. Successively there was formed an i-type ZnSe:H film as the i-type semiconductor layer 104 by repeating the procedures for the formation of the ZnSe:H film in Example 1. Then, there was formed the above-mentioned n-type film as the n-type semiconductor layer 103 in accordance with the foregoing preparation method 1, 4, 7 or 10. This situation is shown in Table 14.

Thereafter, there was formed a Ag thin film of about 500 Å in thickness as the electrode 102 in accordance with the known electron-beam deposition method.

In this way, there were obtained photovoltaic element samples Nos. 41 to 44.

The characteristic properties of each of these samples as a solar cell were evaluated in the same evaluation manner as in Example 1.

The results obtained were as shown in Table 22.

Other than the foregoing, there were provided a silicon single crystal wafer with a $SiO_2$ film formed thereon by the known thermal oxidation technique, and a quartz glass plate. And on the surface of each of them, there was deposited a film of each constituent layer for each photovoltaic element sample by repeating the corresponding procedures for the formation thereof.

The resultant deposited films were examined for the content of hydrogen atoms (H) and the proportion of crystal grain domains per unit volume in accordance with the procedures of examining them, which were employed in the foregoing Experiments.

The results obtained were as shown in Table 22.

Further, using the aforesaid glass plate with an ITO thin film thereon as the transparent electrode 106, there was formed a p-type ZnTe:Li film as the p-type semiconductor layer 105 in the same manner as in Example 8, and there were successively formed an i-type ZnSe:H film as the i-type semiconductor layer 104 and an n-type ZnSe:H:Al film as the n-type semiconductor layer 103, respectively in the same manner as in Example 1. Then, there was formed a Ag thin film as the electrode 102 on the previously formed n-type semiconductor layer 103 to thereby obtain another photovoltaic element sample (Sample No. 45).

The same evaluations as made for Samples Nos. 41 to 44 were made on the resultant Sample No. 45. As a result, there were obtained the results as shown in Table 22.

COMPARATIVE EXAMPLE 1

In this comparative example, there were prepared three kinds of pin junction photovoltaic element samples (Sample Nos. 46 to 48) by repeating the procedures of Example 1 except that the flow rate of $H_2$ gas in the case of forming an i-type ZnSe:H film as the i-type semiconductor layer 104 was controlled to a value shown in Table 15 in each case, in order to investigate any change in the photovoltaic element's characteristics upon the flow rate of said $H_2$ gas for incorporating hydrogen atoms (H) into the i-type ZnSe:H film.

The characteristic properties of each of the resultant photovoltaic samples Nos. 46 to 48 as a solar cell were evaluated in the same evaluation manner as in Example 1.

The results obtained were as shown in Table 23. Other than the foregoing, there were provided a silicon single crystal wafer with a $SiO_2$ film formed thereon by the known thermal oxidation technique, and a quartz glass plate. And on the surface of each of them, there was deposited a film of each constituent layer for each photovoltaic element sample by repeating the corresponding procedures for the formation thereof.

The resultant deposited films were examined for the content of hydrogen atoms (H) and the proportion of crystal grain domains per unit volume in accordance with the procedures of examining them, which were employed in the foregoing Experiments.

The results obtained were as shown in Table 23.

COMPARATIVE EXAMPLE 2

There was prepared a pin junction photovoltaic element of A-Si:H basis with the configuration shown in FIG. 1(C) in accordance with the glow discharge method using the apparatus shown in FIG. 3.

On a stainless steel plate of 50 mm×50 mm in size as the substrate 101 (303 in FIG. 3), a Ag thin film of about 1000 Å in thickness was deposited as the electrode 102 by the known sputtering method.

The resultant laminate was fixed, with the electrode 102 facing downward, onto the substrate holder 302. The film-forming chamber 301 was evacuated to $10^{-5}$ Torr or below, and it was kept at 250° C. by means of the heater 305. Into the film-forming chamber 301, were introduced $SiH_4$ gas, $H_2$ gas, and $PH_3$ gas (diluted to 1% with $H_2$ gas) through the gas inlet 308 from the corresponding gas reservoirs (not shown) at respective flow rates of 30 sccm, 40 sccm, and 10 sccm. While the inner pressure of the film-forming chamber 301 was kept at 0.5 Torr, discharging was performed by the application of a high-frequency power (50 W) for 3 minutes. Thus there was formed an n-type A-Si:H:P film to be the n-type semiconductor layer 108. The application of high-frequency power and the introduction of said gasses were suspended, and the film-forming chamber 301 was evacuated to $10^{-5}$ Torr or below. Into the film-forming chamber 301, were introduced $SiH_4$ gas and $H_2$ gas from the corresponding gas reservoirs at respective flow rates of 30 sccm and 40 sccm. Discharging was performed at 0.5 Torr, with 70 W, and for 60 minutes, in the same manner as mentioned above. Thus there was formed an i-type A-Si:H film to be the i-type semiconductor layer 109. The discharging and the introduction of the gasses were suspended, and the film-forming chamber 301 was evacuated to $10^{-5}$ Torr or below. Into the film-forming chamber 301, were introduced $SiH_4$ gas, $H_2$ gas, and $B_2H_6$ gas (diluted to 1% with $H_2$ gas) from the corresponding gas reservoirs at respective flow rates of 30 sccm, 200 sccm, and 20 sccm. Discharging was performed at 0.6 Torr, with high-frequency 50 W, and for 2 minutes. Thus there was formed a p-type a-Si:H:B film to be the p-type semiconductor layer 110. Then, the resultant sample was taken out from the film-forming chamber 301. And on this sample were formed the ITO electrode 105 and the Ag collecting electrode 106 in the same manner as in Example 1. Thus there was obtained a pin junction A-Si photovoltaic element sample (Sample No. 49). The photovoltaic characteristics of this sample were evaluated in the same evaluation manner as in Example 1. The results obtained were as shown in Table 23.

Observations on the Evaluation Results Shown in Tables 16 to 23

In the aforesaid Tables 16 to 23, with respect to characteristic properties required for a pin junction photovoltaic element, there are indicated the following evaluation items: (a) open-circuit voltage (Voc) which is generated when the element is irradiated with AM-1 light (100 mW/cm$^2$), (b) the relative value of the output which is generated when the element is irradiated with AM-1 light through a 400-nm interference filter versus the output which is generated when the A-Si pin -junction photovoltaic element prepared in Comparative Example 2 is irradiated through the interference filter, and (c) the change in photoelectric conversion efficiency that takes place after continuous irradiation with AM-1 light for 10 hours: the change is expressed by $\Delta\eta/\eta_o$, where $\Delta\eta$ is the amount of change in photoelectric conversion efficiency and $\eta_o$ is the initial photoelectric conversion efficiency.

In said Tables 16 to 23, there are also shown the content of hydrogen atoms (H) and the proportion of crystal grain domains per unit volume in the i-type ZnSe:H film, which were measured to see if the i-type ZnSe:H film constituting the photovoltaic element meets the requirements for the content of hydrogen atoms (H) and the proportion of crystal grain domains per unit volume specified in the present invention.

The evaluation results indicate the following. That is, (i) each of the constituent semiconductor layers for the pin junction photovoltaic elements obtained in Examples 1 to 4 i.e. the p-type ZnSe:H:Li films, the i-type ZnSe:H films and the n-type ZnSe:H:Al films contains the specific amount of hydrogen atoms and has the specific proportion of crystal grain domains per unit volume, (ii) each of said pin junction photovoltaic elements has a desired pin junction of said p-type, i-type and n-type semiconductor films and it generates a high open-circuit voltage, (iii) each of said pin junction photovoltaic elements generates a higher output than the conventional A-Si based pin junction photovoltaic element when irradiated with AM-1 light through a 400 nm interference filter, and (iv) each of said pin junction photovoltaic elements exhibits a desired and stable photoelectric conversion efficiency even after continuous irradiation with AM-1 light for a long period of time: this means it has a desired resistance against light-induced fatigue.

In Example 5, there was prepared a pin junction photovoltaic element comprising an n-type ZnS:Al film, an i-type ZnSe:H film and a p-type ZnSe:Li film formed on a stainless steel substrate. It was comparable to those obtained in Examples 1 to 4.

In Example 6, there was prepared a pin junction photovoltaic element comprising an n-type ZnO:Al film, an i type ZnSe:H film and a p-type ZnSe:H:Li film formed on a stainless steel substrate. It was comparable to those obtained in Examples 1 to 4.

In Example 7, there was prepared a pin junction photovoltaic element comprising an n-type ZnSe:Al film, an i-type ZnSe:H film and a p-type ZnSe:H:Li film formed on a stainless steel substrate. It was comparable to those obtained in Examples 1 to 4.

In Example 8, there was prepared a pin junction photovoltaic element comprising an n-type ZnSe:H:Al film, an i-type ZnSe:H film and a p-type ZnTe:Li film on a stainless steel substrate. It was comparable to those obtained in Examples 1 to 4.

In Example 9, using a glass plate as the substrate, there were prepared a variety of pin junction photovoltaic elements in which the p-type semiconductor layer was comprised of a member selected from a p-type ZnTe:Li film and a p-type ZnSe:H:Li film, the i-type semiconductor layer being comprised of an i-type ZnSe:H film according to the present invention, and the n-type semiconductor layer being comprised of a member selected from the group consisting of a ZnSe:H:Li film according to the present invention, ZnS:Al film a ZnO:Al film or a ZnSe:Al film.

Each of the resultant pin junction photovoltaic element samples was comparable to those obtained in Examples 1 to 4.

In Comparative Example 1, there were prepared a plurality of pin junction photovoltaic elements in the same manner as in Example 1, except that the flow rates of $H_2$ gas to be introduced into the film-forming chamber were changed during the formation of their i-type semiconductor layers. And comparative examinations with respect to photovoltaic element's characteristics were made on the resultant pin junction photovoltaic elements. The results indicate that those pin junction photovoltaic elements having an i-type ZnSe:H semiconductor layer in which the content of hydrogen atoms (H) was outside the specific range according to the present invention and the proportion of crystal grain domains per unit volume outside the specific range according to the present invention are all inferior to any of the pin junction photovoltaic elements obtained in Examples 1 to 9 in any of the evaluation items.

In Comparative Example 2, a conventional A-si pin junction photovoltaic element was prepared as a standard against which the photovoltaic element of the present invention is compared. The evaluation results indicate that it is of a lower open-circuit voltage and is poor in resistance against light-induced fatigue.

EXAMPLE 10

A pin junction photovoltaic element with the configuration shown in FIG. 1(A) was prepared using the deposited film forming apparatus shown in FIG. 2, in accordance with above-mentioned process (1).

Firstly, a stainless steel of 50 mm by 50 mm in size as the substrate 101 (203 in FIG. 2) was placed in a shown sputtering apparatus (not shown). The sputtering apparatus was evacuated to $10^{-5}$ Torr or below. On the substrate 101 was deposited Ag thin film of about 1000 Å in thickness as the lower electrode 102 by sputtering Ag in argon. The substrate was removed from the sputtering apparatus and then fixed, with the lower electrode 102 facing downward, onto the substrate holder 202 on the substrate transfer unit 206 installed in the load lock chamber 212. The load lock chamber 212 was evacuated to $10^{-5}$ Torr or below by means of a vacuum pump (not shown). During this stage, the film-forming chamber 201 was evacuated to $10^{-5}$ Torr or below by means of the vacuum pump 215. When the pressures in the two chambers became almost balanced, the two chambers were opened and the substrate transfer unit 206 was moved to the film forming chamber 201.

The substrate was then heated to about 200° C. by actuating electric heater 205.

Thereafter, liquid DESe in Dewar's bottle 223 and liquid DETe in 224 were gasified by bubbling them respectively with He gas from gas reservoir 217 to generate He gas saturated with DESe and He gas saturated with DETe. At that time, the respective flow rates of said He gas were controlled to 7.5 SCCM by means of mass flow controller 219.

The resultant He gas saturated with DESe and He gas saturated with DETe were successively transported into the gas inlet pipe 209 while the respective flow rates of DESe and DETe were controlled to $3.0 \times 10^{-6}$ mol/min. and $8 \times 10^{-6}$ mol/min. respectively. At the same time, $H_2$ gas from gas reservoir 216 was introduced into the gas inlet pipe 209 while its flow rate was controlled to 15 SCCM by means of mass flow controller 218. Concurrently, DEZn in Dewar's bottle 225 and TEAl in Dewar's bottle 226 were introduced into the gas inlet pipe 208 at respective flow rates of $1.0 \times 10^{-5}$ mol/min. and $3.0 \times 10^{-9}$ mol/min. in the same manner as in the cases of said DESe and said DETe. In each of these two cases, the flow rate of He gas was controlled to 5 SCCM.

In the above, the above respective flow rates for said DESe, DETe, DEZn and TEAl were set up respectively by controlling the respective temperatures of constant temperature waters 235, 236, 237 and 238 contained in constant temperature water baths 227, 228, 229 and 230 in which the Dewar's bottles 223, 224, 225 and 226 were placed, by means of electric heaters 231, 232, 233 and 234 in said water baths 227, 228, 229 and 230 to thereby adjust the respective temperatures of the starting raw liquids for said DESe, DETe, DEZn and TEAl to desired temperatures.

With the exhaust valve 214 properly opened, the inner pressure of the film-forming chamber 201 was kept at 0.5 Torr. Film-forming was started by applying microwave power (200 W) from the microwave generator 211. After 2 minutes, there was formed an n-type ZnSe$_{1-x}$Te$_x$:H:Al film 103 on the substrate 101. The application of microwave power and the introduction of the gases were suspended, and the film-forming chamber 201 was evacuated to 10$^{-5}$ Torr or below by the vacuum pump 215.

The above procedures were repeated, except that the introduction of TEAl was not conducted, to thereby deposit an i-type ZnSe$_{1-x}$Te$_x$:H film 104 on the previously formed n-type film 103. The film-forming was continued for 50 minutes.

Then, there was deposited a p-type ZnSe$_{1-x}$Te$_x$:H:Li film 105 on the previously formed i-type film 104 by repeating the procedures for the formation of said i-type film, except that liquid LiC$_3$H$_7$ in another Dewar's bottle (not shown) was gasified by bubbling it with He gas from the gas reservoir 217 to generate He gas saturated with LiC$_3$H$_7$, which was successively transported into the gas inlet pipe 208 at a flow rate of $1.0 \times 10^{-9}$ mol/min. for the LiC$_3$H$_7$. The flow rate of said He gas in this case was controlled to 5 SCCM. And the film-forming was continued for 20 minutes.

The above film-forming conditions are shown in Table 24.

Thereafter, the substrate transfer unit 206 was moved to the load lock chamber 212 through the gate valve 207. After cooling therein, the substrate 101 on which were deposited the n-type, i-type and p-type semiconductor layers was taken out. Then, the substrate was placed in a know vacuum deposition apparatus, which was evacuated to 10$^{-5}$ Torr or below. On the foregoing p-type semiconductor layer 105 on the substrate 101 was deposited an ITO thin film of about 700 Å in thickness in an oxygen atmosphere with about $1 \times 10^{-3}$ Torr. The source of deposition was a 1:1 (by weight) mixture of In and Sn placed in a crucible which was heated by the resistance heating method. The substrate temperature was 175° C. In this way the transparent electrode 106 was formed. After cooling, the substrate was removed. With a permalloy mask placed on the transparent electrode 106, the substrate was placed in another known vacuum deposition apparatus, which was evacuated to $1 \times 10^{-5}$ Torr or below. A Ag film of about 1.0 μm in thickness was deposited by the resistance heating method to form the comb-shaped collecting electrode 107. Thus there was obtained sample No. 50.

The characteristic properties of Sample No. 50 as a solar cell were evaluated in the following manner.

The open-circuit voltage (Voc) which is produced when the transparent electrode 106 is irradiated with AM-1.5 light (100 mW/cm$^2$) was measured. The output which is generated when the transparent electrode 106 is irradiated with AM-1.5 light through a 450-nm interference filter was measured. The change Δη in conversion efficiency that takes place after irradiation with AM-1.5 light for 10 hours was measured.

The results of measurements were as shown in Table 35.

Other than the foregoing, there were provided a silicon single crystal wafer with a SiO$_2$ film formed thereon by the known thermal oxidation technique, and a quartz glass plate. And there were deposited a ZnSe$_{1-x}$Te$_x$:H:Al film as the aforesaid n-type semiconductive layer, a ZnSe$_{1-x}$Te$_x$:H film as the aforesaid i-type semiconductor layer and a ZnSe$_{1-x}$Te$_x$:H:Li film as the aforesaid p-type semiconductor layer respectively and separately on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 35.

EXAMPLE 11

A pin junction photovoltaic element with the configuration shown in FIG. 1(A) was prepared using the film-forming apparatus shown in FIG. 3, in accordance with the above-mentioned process (2).

On a stainless steel substrate 101 (303 in FIG. 3) was deposited an Ag thin film as the lower electrode 102 in the same manner as in Example 10. The substrate 303 was fixed onto the substrate holder 302. While the inner pressure in the film-forming chamber 301 was kept at 10$^{-5}$ Torr or below, the substrate 303 was heated to about 300° C. by means of infrared heater 305. The raw material gas A and raw material gas B shown in the column "n-type" of Table 25 were introduced into the film-forming chamber 301 through the gas inlet pipes 308 and 309 respectively, under the conditions shown in the column "n-type" of Table 25.

With the exhaust valve 314 properly opened, the inner pressure of the film-forming chamber 301 was kept at 1.0 Torr. Film-forming was started by applying high-frequency power (50 W) from the high frequency (13.56 MHz) generator 310. (The high-frequency generator 310 is connected to the cathode 312 through the matching circuit 311.) After discharging for 30 minutes, there was deposited an n-type ZnSe$_{1-x}$Te$_x$:H:Al film 103. The application of high-frequency power and the introduction of the gases were suspended, and the film-forming chamber 301 was evacuated to 10$^{-5}$ Torr or below. Then, the raw material gases A and B shown in the column "i-type" of Table 25 were introduced into the film-forming chamber 301.

With the inner pressure kept at 1.0 Torr, high-frequency power (50 W) was applied from the high-frequency source 310. After discharging for 30 minutes under the film-forming conditions shown in the column "i-type" of Table 25, there was deposited an i-type ZnSe$_{1-x}$Te$_x$:H film 104 on the previously formed n-type film 103.

Then, the above procedures were repeated for 2 minutes, except that there were used the raw material gases A and B shown in the column "p-type" of Table 25 and the respective flow rates of said raw material gases were controlled to those mentioned in the column "p-type" of Table 25, to thereby deposit a p-type ZnSe$_{1-x}$Te$_x$:H:Li film 105 on the previously formed i-type film 104. The substrate with the deposited films was removed from the film forming chamber. On the deposited p-type film 105 was formed an ITO film of about 700 Å in thickness as the transparent electrode 106 in the same manner as in Example 10. On the ITO film was formed an Ag thin film as the collecting electrode 107. Thus there was obtained Sample No. 51. The characteristic properties of Sample No. 51 as a solar cell were evaluated in the same manner as in Example 10. As a result, there were obtained the results shown in Table 35.

Other than the foregoing, there were provided a silicon single crystal wafer with a SiO$_2$ film formed thereon by the known thermal oxidation technique, and a quartz glass plate. And there were deposited an n-type ZnSe$_{1-x}$Te$_x$:H:Al film as the aforesaid n-type semiconductor layer, an i-type ZnSe$_{1-x}$Te$_x$:H film as the aforesaid i-type semiconductor layer and a p-type ZnSe$_{1-x}$Te$_x$:H:Li film as the aforesaid p-type semiconductor layer respectively and separately on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 35.

EXAMPLE 12

A pin junction photovoltaic element with the configuration shown in FIG. 1(A) was prepared using the apparatus shown in FIG. 4, in accordance with the abovementioned process (3).

On a stainless steel substrate 101 (403 in FIG. 4) was deposited the lower electrode 102 comprising Ag in the same manner as in Example 1. The substrate was fixed onto the substrate holder 402 on the substrate transfer unit 406 and transferred into the film-forming chamber 401. The inner pressure in the film-forming chamber 401 was kept at 10$^{-5}$ Torr or below. A ZnSe$_{1-x}$Te$_x$ polycrystal target 416 was placed on cathode 412. The substrate 403 was heated to about 200° C. by means of infrared heater 405. The raw material gases shown in the column "n-type" of Table 26 were introduced at the respective flow rates shown therein into the film-forming chamber 401 through the gas inlet pipe 401.

With the exhaust valve 414 properly opened, the inner pressure of the film-forming chamber 401 was kept at 0.05 Torr. Film-forming was started by applying high-frequency power (300 W). After discharging for 3 minutes, there was deposited an n-type ZnSez$_{1-x}$Te$_x$:H:Al film 103. The discharging and the introduction of the gases were suspended.

The film-forming chamber was evacuated to 10$^{-5}$ Torr or below, and the raw material gas shown in the column "i-type" of Table 26 was introduced at the flow rate shown therein into the film-forming chamber. After discharging with 300 W of high-frequency power and a vacuum of 0.05 Torr for 60 minutes, there was deposited an i-type ZnSe$_{1-x}$Te$_x$:H film 104 on the previously formed n-type film 103.

Thereafter, the above procedures were repeated, except that the raw material gases shown in Table 26 were introduced at the respective flow rates shown therein, to thereby deposit a p-type ZnSe$_{1-x}$Te$_x$:H:Li film 105 on the previously formed i-type film 104.

On the foregoing p-type film was formed an ITO film of about 700 Å in thickness as the transparent electrode 106 and a Ag film as the collecting electrode 106. Thus there was obtained Sample No. 52. The characteristic properties of Sample No. 52 as a solar cell were evaluated.

The results obtained were as shown in Table 35.

Other than the foregoing, there were provided a silicon single crystal wafer with a SiO$_2$ film formed thereon by the known thermal oxidation technique, and a quartz glass plate. And there were deposited an n-type ZnSe$_{1-x}$Te$_x$:H:Al film as the aforesaid n-type semiconductor layer, an i-type ZnSe$_{1-x}$Te$_x$:H film as the aforesaid i-type semiconductor layer and a p-type ZnSe$_{1-x}$Te$_x$:H:Li film as the aforesaid p-type semiconductor layer respectively and separately on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 35.

EXAMPLE 13

If the preparation of the pin junction photovoltaic element in any case of Examples 10 to 12, the p-type, i-type and p-type semiconductor layers were all prepared respectively in the same manner utilizing the same film-forming chamber. However, the manners for forming these layers may be different one from the other.

This example illustrates the preparation of a pin junction photovoltaic element in the case where the formations of the n-type and p-type semiconductor layers were carried out in a manner different from the manner for the formation of the i-type semiconductor layer.

In this example, as the film-forming apparatus, there was used the apparatus shown in FIG. 3 in which the film-forming chamber 316 comprises the same film-forming chamber 201 as shown in FIG. 2.

At first, on a stainless steel substrate 101 (303 in FIG. 3) was deposited Ag thin film of about 3000 Å in thickness as the lower electrode 102. The substrate was fixed onto the substrate holder 302 on the substrate transfer unit 306 in the film-forming chamber 301. On the substrate was deposited n-type ZnSe$_{1-x}$Te$_x$:H:Al film 103 by repeating the procedures for the formation of the n-tye ZnSe$_{1-x}$Te$_x$:H:Al film in Example 2. The film-forming chamber 301 was evacuated to 10$^{-5}$ Torr or below, and the substrate transfer unit 306 was moved into the second film-forming chamber 316 through the gate valve 307. Subsequently, on the n-type ZnSe$_{1-x}$Te$_x$:H:Al film was deposited an i-type ZnSe$_{1-x}$Te$_x$:H film 104 by repeating the procedures for the formation of the i-type ZnSe$_{1-x}$Te$_x$:H film in Example 1.

Then, the substrate transfer unit 306 was returned into the first film-forming chamber 301 through the gate valve 307. The procedures for the formation of the p-type ZnSe$_{1-x}$Te$_x$:H:Li film in Example 2 were repeated to thereby deposit a p-type ZnSe$_{1-x}$Te$_x$:H:Li film 105 on the previously formed i-type ZnSe$_{1-x}$Te$_x$:H film.

On the thus formed p-type ZnSe$_{1-x}$Te$_x$:H:Li film 105 were formed a transparent electrode 106 comprising an ITO thin film and then a collecting electrode 107 comprising a Ag thin film in the same manner as in Example 10.

Thus there was obtained Sample No. 53.

The characteristic properties of Sample No. 53 as a solar cell were evaluated in the same evaluation manner as in Example 10.

The results obtained were as shown in Table 36.

Other than the foregoing, there were provided a silicon single crystal wafer with a SiO$_2$ film formed thereon by the known thermal oxidation technique, and a quartz, glass plate. And there were deposited an n-type ZnSe$_{1-x}$Te$_x$:H:Al film as the aforesaid n-type semiconductor layer, an i-type ZnSe$_{1-x}$Te$_x$:H film as the aforesaid i-type semiconductor layer and a p-type ZnSe$_{1-x}$Te$_x$:H:Li film as the aforesaid p-type semiconductor layer respectively and separately on said silicon single crystal wafer and also on said quartz glass place by repeating the aforesaid respective procedures for the formation of these films.

The resultant deposited films were examined for the content of hydrogen atoms (H) and the proportion of crystal grain domains per unit volume in accordance with the procedures of examining them which were employed in the foregoing Experiments.

The results obtained were as shown in Table 36.

EXAMPLE 14

In this example, there were prepared a variety of pin junction photovoltaic elements (Sample Nos. 54 to 62) with the configuration shown in FIG. 1(A), respectively having the n-type semiconductor layer comprising an n-type ZnS:Al film, the i-type semiconductor layer comprising an i-type ZnSe$_{1-x}$Te$_x$:H film and the p-type semiconductor layer comprising a p-type ZnSe$_{1-x}$Te$_x$:H:Li film.

In the preparation of each sample, there was used a stainless steel of 50 mm × 50 mm in size as the substrate 101, and on which was formed a Ag thin film as the lower electrode 102 in the same manner as in Example 1. Thereafter, there were successively formed an n-type ZnS:Al film as the n-type semiconductor layer 103, an i-type ZnSe$_{1-x}$Te$_x$:H film as the i-type semiconductor layer 104 and a p-type ZnSe$_{1-x}$Te$_x$:H:Li film as the p-type semiconductor layer 105.

The preparation of the n-type semiconductor layer 103 for each sample was carried out by the corresponding preparation method 19, 20 or 21 shown in Table 27.

The preparation of the i-type semiconductor layer 104 for each sample was carried out by the preparation method 16 (method for the formation of the i-type ZnSe$_{1-x}$Te$_x$:H film in Example 10), the preparation method 17 (method for the formation of the i-type ZnSe$_{1-x}$Te$_x$:H film in Example 11) or the preparation method 18 (method for the formation of the i-type ZnSe$_{1-x}$Te$_x$:H film in Example 12).

The preparation of the p-type semiconductor layer 105 for each sample was carried out by the preparation method 16 (method for the formation of the p-type ZnSe$_{1-x}$Te$_x$:H:Li film in Example 10), the preparation method 17 (method for the formation of the p-type ZnSe$_{1-x}$Te$_x$H:Li film in Example 11) or the preparation method 18 (method for the formation of the p-type ZnSe$_{1-x}$Te$_x$:H:Li film in Example 12).

Then, there were successively formed a ITO thin film as the transparent electrode 106 and a comb-shaped Ag thin film as the collecting electrode 107 respectively in the same manner as in Example 10.

In this way, there were obtained photovoltaic element samples Nos. 54 to 62.

The characteristic properties of each of these samples as a solar cell were evaluated in the same evaluation manner as in Example 10.

The results obtained were as shown in Table 37.

Other than the foregoing, there were provide a silicon single crystal wafer with a SiO$_2$ film formed thereon by the known thermal oxidation technique, and a quartz glass plate. And there were deposited an n-type ZnS:Al film as the aforesaid n-type semiconductor layer, an i-type ZnSe$_{1-x}$Te$_x$H film as the aforesaid i-type semiconductor layer and a p-type ZnSe$_{1-x}$Te$_x$:H:Li film as the aforesaid p-type semiconductor layer respectively and separately on said silicon single crystal wafer and also on said quartz glass place by repeating the aforesaid respective procedures for the formation of these films in the preparation of each of the foregoing photovoltaic element samples Nos. 54 to 62.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 37.

EXAMPLE 15

In this example, there were prepared a variety of pin junction photovoltaic elements (Sample Nos. 63 to 71) with the configuration shown in FIG. 1(A), respectively having the n-type semiconductor layer comprising an n-type ZnO:Al film, the i-type semiconductor layer comprising an i-type ZnSe$_{1-x}$Te$_x$:H film and the p-type semiconductor layer comprising a p-type ZnSe$_{1-x}$Te$_x$:H:Li film.

In the preparation of each sample, there was used a stainless steel of 50 mm × 50 mm in size as the substrate 101, and on which was formed a Ag thin film as the lower electrode 102 in the same manner as in Example 10. Thereafter, there were successively formed an n-type ZnO:Al film as the n-type semiconductor layer 103, an i-type ZnSe$_{1-x}$Te$_x$:H film as the i-type semiconductor layer 104 and a p-type ZnSe$_{1-x}$Te$_x$:H:Li film as the p-type semiconductor layer 105.

The preparation of the n-type semiconductor layer 103 for each sample was carried out by the corresponding preparation method 22, 23 or 24 shown in Table 28.

The preparation of the i-type semiconductor layer 104 for each sample was carried out by the preparation method 16 (method for the formation of the i-type ZnSe$_{1-x}$Te$_x$:H film in Example 10), the preparation method 17 (method for the formation of the i-type ZnSe$_{1-x}$Te$_x$:H film in Example 11) or the preparation method 18 (method for the formation of the i-type ZnSe$_{1-x}$Te$_x$:H film in Example 12).

The preparation of the p-type semiconductor layer 105 for each sample was carried out by the preparation method 16 (method for the formation of the p-type ZnSe$_{1-x}$Te$_x$:H:Li film in Example 10), the preparation method 17 (method for the formation of the p-type ZnSe$_{1-x}$Te$_x$:H:Li film in Example 11) or the preparation method 18 (method for the formation of the p-type ZnSe$_{1-x}$Te$_x$:H:Li film in Example 12).

Then, there were successively formed an ITO thin film as the transparent electrode 106 and a comb-shaped Ag thin film as the collecting electrode 107 respectively in the same manner as in Example 10.

In this way, there were obtained photovoltaic element samples Nos. 63 to 71.

The characteristic properties of each of these samples as a solar cell were evaluated in the same evaluation manner as in Example 10.

The results obtained were as shown in Table 38.

Other than the foregoing, there were provided a silicon single crystal wafer with a SiO$_2$ film formed thereon by the known thermal oxidation technique, and a quartz glass plate. And there were deposited an n-type ZnO:Al film as the aforesaid n-type semiconductor layer, an i-type $ZnSe_{1-x}Te_x$:H film as the aforesaid i-type semiconductor layer and a p-type $ZnSe_{1-x}Te_x$:H:Li film as the aforesaid p-type semiconductor layer respectively and separately on said silicon single crystal wafer and also on said quartz glass place by repeating the aforesaid respective procedures for the formation of these films in the preparation of each of the foregoing photovoltaic element samples nos. 63 to 71.

The respective resultant deposited films were examined for the content of hydrogen atoms (H) and the proportion of crystal grain domains per unit volume in accordance with the procedures of examining them which were employed in the foregoing Experiments.

The results obtained were as shown in table 38.

EXAMPLE 6

In this example, there were prepared a variety of pin junction photovoltaic elements (Sample Nos. 72 to 80) with the configuration shown in FIG. 1(A), respectively having the n-type semiconductor layer comprising an n-type $ZnSe_{1-x}Te_x$:H:Al film, the i-type semiconductor layer comprising an i-type $ZnSe_{1-x}Te_x$:H film and the p-type semiconductor layer comprising a p-type ZnTe:Li film.

In the preparation of each sample, there was used a stainless steel of 50 mm × 50 mm in size as the substrate 101, and on which was formed a Ag thin film as the lower electrode 102 in the same manner as in Example 10. Thereafter, there were successively formed and n-type $ZnSe_{1-x}$:H:Al film as the n-type semiconductor layer 103, an i-type ZnSe:H film as the i-type semiconductor layer 104 and a p-type ZnSe:H:Li film as the p-type semiconductor layer 105.

The preparation of the n-type semiconductor layer 103 for each sample was carried out by the preparation method 16 (method for the formation of the n-type $ZnSe_{1-x}Te_x$:H:Al film in Example 10), the preparation method 17 (method for the formation of the n-type $ZnSe_{1-x}Te_x$:H:Al film in Example 11) or the preparation method 18 (method for the formation of the n-type $ZnSe_{1-x}Te_x$:H:Al film in Example 12).

The preparation of the i-type semiconductor layer 104 for each sample was carried out by the preparation method 16 (method for the formation of the i-type $ZnSe_{1-x}Te_x$:H film in Example 10), the preparation method 17 (method for the formation of the i-type $ZnSe_{1-x}Te_x$:H film in Example 11) or the preparation method 18 (method for the formation of the i-type $ZnSe_{1-x}Te_x$:H film in Example 12).

The preparation of the p-type semiconductor layer 105 for each sample was carried out by the corresponding preparation method 25, 26 or 27 shown in Table 29. Then, there were successively formed an ITO film as the transparent electrode 106 and a comb-shaped Ag thin film as the collecting electrode 107 respectively in the same manner as in Example 10.

In this way, there were obtained photovoltaic element samples Nos. 72 to 80.

The characteristic properties of each of these samples as a solar cell were evaluated in the same evaluation manner as in Example 10.

The results obtained were as shown in Table 39.

Other than the foregoing, there were provided a silicon single crystal wafer with a $SiO_2$ film formed thereon by the known thermal oxidation technique, and a quartz glass plate. And there were deposited an n-type $ZnSe_{1-x}Te_x$:H:Al film as the aforesaid n-type semiconductor layer, an i-type $ZnSe_{1-x}Te_x$:H film as the aforesaid i-type semiconductor layer and a p-type ZnTe:Li film as the aforesaid p-type semiconductor layer respectively and separately on said silicon single crystal wafer and also on said quartz glass place by repeating the aforesaid respective procedures for the formation of these films in the preparation of each of the foregoing photovoltaic element samples Nos. 72 to 80.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 39.

EXAMPLE 17

In this example, there were prepared a variety of pin junction photovoltaic elements (Sample Nos. 81 to 89) with the configuration shown in FIG. 1(A), respectively having the n-type semiconductor layer comprising an n-type $ZnSe_{1-x}Te_x$:H:Al film, the i-type semiconductor layer comprising an i-type $ZnSe_{1-x}Te_x$:H film and the p-type semiconductor layer comprising a p-type ZnSe:Li film.

In the preparation of each sample, there was used a stainless steel of 50 mm × 50 mm in size as the substrate 101, and on which was formed a Ag thin film as the lower electrode 102 in the same manner as in Example 1. Thereafter, there were successively formed an n-type $ZnSe_{1-x}Te_x$:H:Al film as the n-type semiconductor layer 103, an i-type $ZnSe_{1-x}Te$:H film as the i-type semiconductor layer 104 and a p-type ZnSe:Li film as the p-type semiconductor layer 105.

The preparation of the n-type semiconductor layer 103 for each sample was carried out by the preparation method 16 (method for the formation of the n-type $ZnSe_{1-x}Te_x$:H:Al film in Example 10), the prepraration method 17 (method for the formation of the n-type $ZnSe_{1-x}Te_x$:H:Al film in Example 11) or the preparation method 18 (method for the formation of the n-type $ZnSe_{1-x}Te_x$:H:Al film in Example 12).

The preparation of the i-type semiconductor layer 104 for each sample was carried out by the preparation method 16 (method for the formation of the i-type $ZnSe_{1-x}Te_x$:H film in Example 10), the preparation method 17 (method for the formation of the i-type $ZnSe_{1-x}Te_x$:H film in Example 11) or the preparation method 18 (method for the formation of the i-type $ZnSe_{1-x}Te_x$:H film in Example 12).

The preparation of the p-type semiconductor layer 105 for each sample was carried out by the preparation method 28, 29 or 30 shown in Table 30.

Then, there were successively formed a ITO thin film as the transparent electrode 106 and a comb-shaped Ag thin film as the collecting electrode 107 respectively in the same manner as in Example 10.

In this way, there were obtained photovoltaic element samples Nos. 81 to 89.

The characteristic properties of each of these samples as a solar cell were evaluated in the same evaluation manner as in Example 10.

The results obtained were as shown in Table 40.

Other than the foregoing, there were provided a silicon single crystal wafer with a $SiO_2$ film formed thereon by the known thermal oxidation technique, and a quartz glass plate. And there were deposited an n-type $ZnSe_{1-x}Te_x$:H:Al film as the aforesaid n-type semiconductor layer, an i-type $ZnSe_{1-x}Te_x$:H film as the aforesaid i-type semiconductor layer and a p-type ZnSe:H:Li film as the aforesaid p-type semiconductor layer respectively and separately on said silicon single crystal wafer and also on said quartz glass place by repeating the aforesaid respective procedures for the formation of these films in the preparation of each of the foregoing photovoltaic element samples Nos. 81 to 89.

The respective resultant deposited films were examined for the content of hydrogen atoms (H) and the proportion of crystal grain domains per unit volume in accordance with the procedures of examining them which were employed in the foregoing Experiments.

The results obtained were as shown in Table 40.

EXAMPLE 18

In this example, there were prepared a variety of pin junction photovoltaic elements with the configuration shown in FIG. 1(B) [Sample Nos. 90 to 92,] having the p-type semiconductor layer 105 comprising a $ZnSe_{1-x}Te_x$:H:Li film, the i-type semiconductor layer 104 comprising a $ZnSe_{1-x}Te_x$:H film and the n-type semiconductor layer 103 comprising a member selected from the group consisting of $ZnSe_{1-x}Te_x$:H:Al film, ZnS:Al film and ZnO:Al film.

In the preparation of each sample, there was used a glass plate (Corning's glass No. 7059 of Corning Glass Co. U.S.A.) of 50 mm×50 mm in size as the substrate 101, and on which was formed an ITO thin film of 500 Å in thickness as the transparent electrode 106 in accordance with the known reactive sputtering method. Thereafter there was formed a p-type ZnSe:H:Li film as the p-type semiconductor layer 105 by repeating the procedures for the formation of the p-type $ZnSe_{1-x}Te_x$:H:Li film in Example 10. Successively there was formed an i-type $ZnSe_{1-x}Te_x$:H film as the i-type semiconductor layer 104 by repeating the procedures for the formation of the $ZnSe_{1-x}Te_x$:H film in Example 10. Then, there was formed the above-mentioned n-type film as the n-type semiconductor layer 103 in accordance with the foregoing preparation method 16, 19 or 22. This situation is shown in Table 31.

Thereafter, there was formed a Ag thin film of about 500 Å in thickness as the electrode 102 in accordance with the known electron-beam deposition method.

In this way, there were obtained photovoltaic element samples Nos. 90 to 92.

The characteristic properties of each of these samples as a solar cell were evaluated in the same evaluation manner as in Example 10.

The results obtained were as shown in Table 41.

Other than the foregoing, there were provided a silicon single crystal wafer with a $SiO_2$ film formed thereon by the known thermal oxidation technique, and a quartz glass plate. And on the surface of each of them, there was deposited a film of each constituent layer for each photovoltaic element sample by repeating the corresponding procedures for the formation thereof.

The resultant deposited films were examined for the content of hydrogen atoms (H) and the proportion of crystal grain domains per unit volume in accordance with the procedures of examining them, which were employed in the foregoing Experiments.

The results obtained were as shown in Table 41.

Further, using a stainless steel plate with an ITO thin film thereon as the transparent electrode 106, there were prepared two kinds of photovoltaic elements with the configuration shown in FIG. 1(B) [Sample Nos. 93 and 94].

As shown in Table 32, the p-type semiconductor layer 105 is comprised of a p-type ZnTe:Li film for Sample No. 93 and it is comprised of a ZnSe:H:Li film for Sample No. 94.

And these p-type semiconductor films were formed respectively in accordance with the preparation method 25 or 28 as shown in Table 32.

Then, there were successively formed an i-type $ZnSe_{1-x}Te_x$:H film as the i-type semiconductor layer 104 and an n-type $ZnSe_{1-x}Te_x$:H:Al film as the n-type semiconductor layer 103, respectively in the same manner as in Example 10. Then, there was formed a Ag thin film as the electrode 102 on the previously formed n-type semiconductor layer 103 to thereby obtain a photovoltaic element sample.

In this way there were prepared two photovoltaic element samples (Sample Nos. 93 and 94).

The same evaluations as made for Samples Nos. 90 to 92 were made on the resultant Samples Nos. 93 and 94. The results obtained are shown in Table 41.

Comparative Example 3

In this comparative example, there were prepared three kinds of pin junction photovoltaic element samples (Sample Nos. 95 to 97) by repeating the procedures of Example 10 except that the flow rate of $H_2$ gas in the case of forming an i-type $ZnSe_{1-x}Te_x$:H film as the i-type semiconductor layer 104 was controlled to a value shown in Table 33 in each case, in order to investigate any change in the photovoltaic element's characteristics upon the flow rate of said $H_2$ gas for incorporating hydrogen atoms (H) into the i-type ZnSe:H film.

The characteristic properties of each of the resultant photovoltaic samples Nos. 95 to 97 as a solar cell were evaluated in the same evaluation manner as in Example 10.

The results obtained were as shown in Table 42.

COMPARATIVE EXAMPLE 4

In this comparative example, there were prepared three kinds of pin junction photovoltaic element samples (Sample Nos. 98 to 100 ) by repeating the procedures of Example 10 except that the flow rates of DESe gas and DETe gas in the case of forming an i-type $ZnSe_{1-x}Te_x$:H film as the i-type semiconductor layer 104 were changed as shown in Table 34 in each case, in order to investigate any change in the photovoltaic element's characteristics upon changes in the film-forming conditions.

The characteristic properties of each of the resultant photovoltaic samples Nos. 98 to 100 as a solar cell were evaluated in the same evaluation manner as in Example 10.

The results obtained were as shown in Table 42.

COMPARATIVE EXAMPLE 5

There was prepared a pin junction photovoltaic element of A-Si:H basis with the configuration shown in FIG. 1(C) in accordance with the glow discharge method using the apparatus shown in FIG. 3.

On a stainless steel plate of 50 mm×50 mm in size as the substrate 101 (303 in FIG. 3), was deposited a Ag thin film of about 1000 Å in thickness as the electrode 102 by the known sputtering method.

The resultant laminate was fixed, with the electrode 102 facing downward, onto the substrate holder 302.

The film-forming chamber 301 was evacuated to $10^{-5}$ Torr or below, and it was kept at 250° C. by means of the heater 305. Into the film forming chamber 301, were introduced SiH$_4$ gas, H$_2$ gas, and PH$_3$ gas (diluted to 1% with H$_2$ gas) through the gas inlet 308 from the corresponding gas reservoirs (not shown) at respective flow rates of 30 sccm, 40 sccm, and 10 sccm. While the inner pressure of the film-forming chamber 301 was kept at 0.5 Torr, discharging was performed by the application of high-frequency power (50 W) for 3 minutes. Thus there was formed an n-type A-Si:H:P film as the n-type semiconductor layer 108. The application of high frequency power and the introduction of said gasses were suspended, and the film-forming chamber 301 was evacuated to $10^{-5}$ Torr or below. Into the film-forming chamber 301, were introduced SiH$_4$ gas and H$_2$ gas from the corresponding gas reservoirs at respective flow rates of 30 sccm and 40 sccm. Discharging was performed at 0.5 Torr, with 70 W, and for 60 minutes, in the same manner as mentioned above. Thus there was formed an i-type A-Si:H film as the i-type semiconductor layer 109. The discharging and the introduction of the gasses were suspended, and the film forming chamber 301 was evacuated to $10^{-5}$ Torr or below. Into the film-forming chamber 301, were introduced SiH$_4$ gas, H$_2$ gas and B$_2$H$_6$ gas (diluted to 1% with H$_2$ gas) from the corresponding gas reservoirs at respective flow rates of 30 sccm, 200 sccm, and 20 sccm. Discharging was performed at 0.6 Torr, with high-frequency 50 W, and for 2 minutes. Thus there was formed a p-type a-Si:H:B film as the p-type semiconductor layer 110. Then, the resultant sample was taken out from the film-forming chamber 301. And on this sample were formed the ITO electrode 105 and the Ag collecting electrode 106 in the same manner as in Example 10. Thus there was obtained a pin junction A-Si photovoltaic element sample (Sample No. 101). The photovoltaic characteristics of this sample were evaluated in the same evaluation manner as in Example 10. The results obtained were as shown in Table 42.

Observations on the Evaluation Results Shown in Tables 35 to 42

In the aforesaid Tables 35 to 42, with respect to characteristic properties required for a pin junction photovoltaic element, there are indicated the following evaluation items: (a) open-circuit voltage (Voc) which is generated when the element is irradiated with AM-1.5 light (100 mW/cm$^2$), (b) the relative value of the output which is generated when the element is irradiated with AM-1.5 light through a 450 nm interference filter versus the output which is generated when the A-Si pin-junction photovoltaic element prepared in Comparative Example 5 is irradiated through the interference filter, and (c) the change in photoelectric conversion efficiency that takes place after continuous irradiation with AM-1 light for 10 hours: the change is expressed by $\Delta\eta/\eta_o$, where $\eta_{72}$ is the amount of change in photoelectric conversion efficiency and $\eta_o$ is the initial photoelectric conversion efficiency.

In said Table 35 to 42, there are also shown the content of hydrogen atoms (H) and the proportion of crystal grain domains per unit volume in the i-type ZnSe$_{1-x}$Te$_x$:H film, which were measured to see if said i-type film constituting the photovoltaic element meets the requirements for the content of hydrogen atoms (H) and the proportion of crystal grain domains per unit volume specified in the present invention.

The evaluation results indicate the following:

That is, (i) each of the constituent semiconductor layers for the pin junction photovoltaic elements obtained in Examples 10 to 13 i.e. the p-type ZnSe$_{1-x}$Te:H:Li films the i-type ZnSe$_{1-x}$Te$_x$:H films and the n-type ZnSe$_{1-x}$Te$_x$:H:Al films contains the specific amount of hydrogen atoms and has the specific proportion of crystal grain domains per unit volume, (ii) each of said pin junction photovoltaic elements has a desired pin junction of said p-type, i-type and n-type semiconductor films and it generates a high open-circuit voltage, (iii) each of said pin junction photovoltaic elements generates a higher output than the conventional A-Si base pin junction photovoltaic element when irradiated with AM-1.5 light through a 450 nm interference filter, and (iv) each any of said pin junction photovoltaic elements exhibits a desired and stable photoelectric conversion efficiency even after continuous irradiation with AM-1.5 light for a long period of time: this means it has a desired resistance against light-induced fatigue.

In Example 14, there was prepared a pin junction photovoltaic element comprising an n-type ZnS:Al film, an i-type ZnSe$_{1-x}$Te$_x$:H film and a p-type ZnSe$_{1-x}$Te$_x$:H:Li film formed on a stainless steel substrate. It was comparable to those obtained in Examples 10 to 13.

In Example 15, there was prepared a pin junction photovoltaic element comprising an n-type ZnO:Al film, an i-type ZnSe$_{1-x}$Te$_x$:H film and a p-type ZnSe$_{1-x}$Te$_x$:H:Li film formed on a stainless steel substrate. It was comparable to those obtained in Examples 10 to 13.

In Example 16, there was prepared a pin junction photovoltaic element comprising an n-type ZnSe$_{1-x}$Te$_x$:H:Al film, an i-type ZnSe$_{1-x}$Te$_x$:H film and a p-type ZnTe:Li film formed on a stainless steel substrate. It was comparable to those obtained in Examples 10 to 13.

In Example 17, there was prepared a pin junction photovoltaic element comprising an n-type ZnSe$_{1-x}$Te$_x$:H:Al film, an i-type ZnSe$_{1-x}$Te$_x$:H film and a p-type ZnSe:Li film formed on a stainless steel substrate. It was comparable to those obtained in Examples 10 to 13.

In Example 18, using a glass plate as the substrate, there were prepared a variety of pin junction photovoltaic elements in which the p-type semiconductor layer comprises a p-type ZnSe$_{1-x}$Te$_x$:H:Li film according to the present invention, the i-type semiconductor layer comprises an i-type ZnSe$_{1-x}$Te$_x$:H film according to the present invention, and the n-type semiconductor layer comprises an n-type ZnSe$_{1-x}$Te$_x$:H:Al film according to the present invention, an n-type ZnS:Al film or an n-type ZnO:Al film.

Likewise, using a stainless steel plate as the substrate, there were prepared a variety of pin junction photovoltaic elements in which the p-type semiconductor layer comprises a p-type ZnTe:Li film or a p-type ZnSe:H:Li film, the i-type semiconductor layer comprises an i-type ZnSe$_{1-x}$Te$_x$:H film according to the present invention and the n-type semiconductor layer comprises an n-type ZnSe$_{1-x}$Te$_x$:H:Al film according to the present invention.

Each of the resultant pin junction photovoltaic element samples was comparable to those obtained in Examples 10 to 13.

In comparative Example 3, there were prepared a plurality of pin junction photovoltaic elements in the same manner as in Example 10, except that the flow rates H$_2$ gas introduced into the film-forming chamber were changed during the formation of their i-type semiconductor layers. And comparative examinations with respect to the photovoltaic element's characteristics were made on the resultant pin junction photovoltaic elements. The results indicate that those pin junction photovoltaic elements having an i-type $ZnSe_{l-x}Te_x$:H semiconductor layer in which the content of hydrogen atoms (H) is outside the specific range according to the present invention and the proportion of crystal grain domains per unit volume is outside the specific range according to the present invention are all inferior to each of the pin junction photovoltaic elements obtained in Examples 10 to 18 in any of the evaluation items.

In Comparative Example 4, there were prepared a plurality of pin junction photovoltaic elements in the same way as in Example 10, except that the flow rates of the DESe gas and the DETe gas introduced into the film-forming chamber were changed during the formation of their i-type semiconductor layers. And comparative examinations with respect to the photovoltaic element's characteristics were made on the resultant pin junction photovoltaic elements. The results indicate that those pin junction photovoltaic elements having an i-type $ZnSe_{1-x}Te_x$:H semiconductor layer in which the content of hydrogen atoms (H) was outside the specific range according to the present invention and the proportion of crystal grain domains per unit volume was outside the specific range according to the present invention are all inferior to each of the pin junction photovoltaic elements obtained in Examples 10 to 18 in any of the evaluation items.

In Comparative Example t, a conventional A-Si pin junction photovoltaic element was prepared as a standard with which the photovoltaic element of the present invention is compared. The evaluation results indicate that it is of a lower open-circuit voltage and is poor in resistance against light-induced fatigue.

TABLE 1

| | | |
|---|---|---|
| substrate temperature | | 200° C. |
| raw material gas (A) | DEZn | $10 \times 10^{-6}$ mol/min |
| | He | 10 sccm |
| | DESe | $1.5 \times 10^{-5}$ mol/min |
| raw material gas (B) | He | 15 sccm |
| | H$_2$* | 1.5 sccm ~ 1 slm |
| inner pressure | | 0.5 Torr |
| power of activation energy | | 200 W (microwave of 2.45 GHz) |
| distance between activation chamber and liberation hole for gas from gas feed pipe | | 5 cm |

*flow rate of the H$_2$ gas

| Sample | | |
|---|---|---|
| | No. 1 | 0.1 sccm |
| | No. 2 | 0.3 sccm |
| | No. 3 | 1 sccm |
| | No. 4 | 3 sccm |
| | No. 5 | 5 sccm |
| | No. 6 | 10 sccm |
| | No. 7 | 15 sccm |
| | No. 8 | 20 sccm |
| | No. 9 | 30 sccm |
| | No. 10 | 100 sccm |
| | No. 11 | 300 sccm |
| | No. 12 | 1 slm |

Note:
DEZn: (C$_2$H$_4$)$_2$Zn
DESe: (C$_2$H$_4$)$_2$Se

TABLE 2

| | composition (atomic %) | |
|---|---|---|
| Sample No. | Zn | Se |
| 1 | 47 | 52 |
| 2 | 51 | 48 |
| 3 | 48 | 50 |
| 4 | 45 | 53 |
| 5 | 51 | 46 |
| 6 | 51 | 46 |
| 7 | 49 | 48 |
| 8 | 50 | 47 |
| 9 | 48 | 48 |
| 10 | 46 | 50 |
| 11 | 51 | 47 |
| 12 | 49 | 48 |

TABLE 3

| | | |
|---|---|---|
| substrate temperature | | 200° C. |
| raw material gas (A) | DEZn | $10 \times 10^{-6}$ mol/min |
| | He | 10 sccm |
| | DESe | $3.0 \times 10^{-6}$ mol/min |
| raw material gas (B) | DETe | $8.0 \times 10^{-6}$ mol/min |
| | He | 15 sccm |
| | H$_2$* | 1.5 sccm ~ 1 slm |
| inner pressure | | 0.5 Torr |
| power of activation energy | | 200 W (microwave of 2.45 GHz) |
| distance between activation chamber and liberation hole for gas from gas feed pipe | | 5 cm |

*flow rate of the H$_2$ gas

| Sample | | |
|---|---|---|
| | No. 1 | 0.1 sccm |
| | No. 2 | 0.3 sccm |
| | No. 3 | 1 sccm |
| | No. 4 | 3 sccm |
| | No. 5 | 5 sccm |
| | No. 6 | 10 sccm |
| | No. 7 | 15 sccm |
| | No. 8 | 20 sccm |
| | No. 9 | 30 sccm |
| | No. 10 | 100 sccm |
| | No. 11 | 300 sccm |
| | No. 12 | 1 slm |

Note:
DEZn: (C$_2$H$_4$)$_2$Zn
DESe: (C$_2$H$_4$)$_2$Se
DETe: (C$_2$H$_4$)$_2$Te

TABLE 4

| | composition (atomic %) | | |
|---|---|---|---|
| Sample No. | Zn | Se | Te |
| 1 | 48 | 10 | 42 |
| 2 | 52 | 9 | 39 |
| 3 | 50 | 11 | 39 |
| 4 | 47 | 11 | 42 |
| 5 | 54 | 10 | 36 |
| 6 | 53 | 9 | 37 |
| 7 | 52 | 9 | 39 |
| 8 | 53 | 10 | 37 |
| 9 | 52 | 10 | 38 |
| 10 | 49 | 11 | 40 |
| 11 | 53 | 9 | 38 |
| 12 | 51 | 10 | 39 |

TABLE 5

| | | |
|---|---|---|
| substrate temperature | | 200° C. |
| raw material gas (A) | DEZn | $1.0 \times 10^{-6}$ mol/min |
| | He | 10 sccm |
| | LiC$_3$H$_7$ | $1.0 \times 10^{-10}$ mol/min |
| | DESe** | $0 \sim 1.5 \times 10^{-5}$ mol/min |
| raw material gas (B) | DETe** | $0 \sim 1.0 \times 10^{-5}$ mol/min |
| | He | 15 sccm |
| | H$_2$* | 1.5 sccm ~ 1 slm |
| inner pressure | | 0.5 Torr |

TABLE 5-continued

| | | |
|---|---|---|
| power of activation energy | 200 W (microwave of 2.45 GHz) | |
| distance between activation chamber and liberation hole for gas from gas feed pipe | 5 cm | |

*flow rate of the $H_2$ gas:

| Sample | | |
|---|---|---|
| No. 1-N | 0.1 | sccm |
| No. 2-N | 0.3 | sccm |
| No. 3-N | 1 | sccm |
| No. 4-N | 3 | sccm |
| No. 5-N | 5 | sccm |
| No. 6-N | 10 | sccm |
| No. 7-N | 15 | sccm |
| No. 8-N | 20 | sccm |
| No. 9-N | 30 | sccm |
| No. 10-N | 100 | sccm |
| No. 11-N | 300 | sccm |

TABLE 5-continued

| | | |
|---|---|---|
| No. 12-N | 1 slm | |

**amounts of DESe and DETe to be introduced

| | Sample No. | DESe (mol/min) | DETe (mol/min) |
|---|---|---|---|
| adjustments of the amounts of DESe and DETe to be introduced were made by changing respective set temperatures of the corresponding bubblers | L-1 | $1.5 \times 10^{-5}$ | 0 |
| | L-2 | $1.35 \times 10^{-5}$ | $1 \times 10^{-6}$ |
| | L-3 | $1.2 \times 10^{-5}$ | $1 \times 10^{-6}$ |
| | L-4 | $1.05 \times 10^{-5}$ | $1 \times 10^{-6}$ |
| | L-5 | $9.0 \times 10^{-5}$ | $1 \times 10^{-6}$ |
| | L-6 | $7.5 \times 10^{-5}$ | $1 \times 10^{-6}$ |
| | L-7 | $6.0 \times 10^{-5}$ | $1 \times 10^{-6}$ |
| | L-8 | $4.5 \times 10^{-5}$ | $1 \times 10^{-6}$ |
| | L-9 | $3.0 \times 10^{-5}$ | $1 \times 10^{-6}$ |
| | L-10 | $1.5 \times 10^{-5}$ | $1 \times 10^{-6}$ |
| | L-11 | 0 | $1 \times 10^{-5}$ |

TABLE 6(A)

| semiconductor film (1) (dopant) | semiconductor film (2) | semiconductor film (3) (dopant) | adhesion | open-circuit voltage [Voc] | total evaluation |
|---|---|---|---|---|---|
| present invention I | | | | | |
| p-type CdTe | i-type ZnSe:H | n-type ZnSe(Br) | ○ | ○ | ○ |
| p-type ZnTe | i-type ZnSe:H | n-type ZnSe(Br) | ○ | ○ | ○ |
| p-type ZnTe | i-type ZnSe:H | n-type ZnS (Al) | ○ | ○ | ○ |
| p-type ZnTe | i-type ZnSe:H | n-type ZnO (In) | ○ | ○ | ○ |
| present invention II | | | | | |
| p-type ZnSe:H(Li) | i-type ZnSe:H | n-type ZnSe (Br) | ⊚ | ⊚ | ⊚ |
| p-type ZnTe | i-type ZnSe:H | n-type ZnSe:H(Al) | ○ | ⊚ | ○ |
| p-type ZnSe: (Li) | i-type ZnSe:H | n-type ZnSe:H(Al) | ⊚ | ⊚ | ⊚ |
| comparison | | | | | |
| p-type CdTe | i-type ZnSe | n-type ZnSe(Br) | ○ | X | Δ |
| p-type ZnTe | i-type ZnSe | n-type ZnSe(Br) | ○ | X | Δ |
| p-type ZnTe | i-type ZnSe | n-type ZnS (Al) | ○ | X | Δ |
| p-type ZnTe | i-type ZnSe | n-type ZnO (In) | Δ | X | X |

Note
⊚: excellent
○: good
Δ: practically acceptable
X: practically not acceptable

TABLE 6(B)

| semiconductor film (1) (dopant) | semiconductor film (2) | semiconductor film (3) (dopant) | adhesion | open-circuit voltage [Voc] | total evaluation |
|---|---|---|---|---|---|
| present invention I | | | | | |
| p-type CdTe (Li) | i-type $ZnSe_{0.2}Te_{0.8}$:H | n-type ZnSe (Br) | ○ | ○ | ○ |
| p-type ZnTe (Li) | i-type $ZnSe_{0.2}Te_{0.8}$:H | n-type ZnSe (Br) | ○ | ○ | ○ |
| p-type ZnTe (Li) | i-type $ZnSe_{0.2}Te_{0.8}$:H | n-type ZnS (Al) | ○ | ○ | ○ |
| p-type ZnTe (Li) | i-type $ZnSe_{0.2}Te_{0.8}$:H | n-type ZnO (In) | ○ | ○ | ○ |
| present invention II | | | | | |
| p-type $ZnSe_{0.2}Te_{0.8}$:H (Li) | i-type $ZnSe_{0.2}Te_{0.8}$:H | n-type ZnSe (Br) | ○ | ⊚ | ○ |
| p-type $ZnSe_{0.2}Te_{0.8}$ (Li) | i-type $ZnSe_{0.2}Te_{0.8}$:H | n-type $ZnSe_{0.2}Te_{0.8}$:H (Al) | ⊚ | ○ | ○ |
| p-type $ZnSe_{0.2}Te_{0.8}$:H (Li) | i-type $ZnSe_{0.2}Te_{0.8}$:H | n-type $ZnSe_{0.2}Te_{0.8}$:H (Al) | ⊚ | ⊚ | ⊚ |
| comparison | | | | | |
| p-type CdTe (Li) | i-type $ZnSe_{0.2}Te_{0.8}$ | n-type ZnSe (Br) | Δ | X | X |
| p-type ZnTe (Li) | i-type $ZnSe_{0.2}Te_{0.8}$ | n-type ZnSe (Br) | ○ | X | Δ |
| p-type ZnTe (Li) | i-type $ZnSe_{0.2}Te_{0.8}$ | n-type ZnS (Al) | ○ | Δ | ○ |
| p-type ZnTe (Li) | i-type $ZnSe_{0.2}Te_{0.8}$ | n-type ZnO (In) | ○ | X | Δ |

Note
⊚: excellent
○: good
Δ: practically acceptable
X: practically not acceptable

TABLE 7

Conditions for the preparation of ZnSe:H(:M) film
(hereinafter referred to as "preparation method 1")

| | type of gas | n-type | i-type | p-type |
|---|---|---|---|---|
| A | DEZn | $1.0 \times 10^{-6}$ mol/min | $1.0 \times 10^{-6}$ mol/min | $1.0 \times 10^{-6}$ mol/min |
| | Ar | 10 sccm | 5 sccm | 10 sccm |
| | TEAl | $3.0 \times 10^{-9}$ mol/min | — | — |
| | $LiC_3H_7$ | — | — | $1.0 \times 10^{-9}$ mol/min |
| B | DESe | $1.5 \times 10^{-5}$ mol/min | $1.5 \times 10^{-5}$ mol/min | $1.5 \times 10^{-5}$ mol/min |

TABLE 7-continued

Conditions for the preparation of ZnSe:H(:M) film
(hereinafter referred to as "preparation method 1")

| type of gas | n-type | i-type | p-type |
|---|---|---|---|
| Ar | 15 sccm | 15 sccm | 15 sccm |
| $H_2$ | 15 sccm | 15 sccm | 15 sccm |

TABLE 8

Conditions for the preparation of ZnSe:H(:M) film
(hereinafter referred to as "preparation method 2")

| | type of gas | n-type | i-type | p-type |
|---|---|---|---|---|
| A | DEZn | $1.0 \times 10^{-6}$ mol/min | $1.0 \times 10^{-6}$ mol/min | $1.0 \times 10^{-6}$ mol/min |
| | Ar | 10 sccm | 5 sccm | 10 sccm |
| | TEAl | $5.0 \times 10^{-9}$ mol/min | — | — |
| | $LiC_3H_7$ | — | — | $1.5 \times 10^{-9}$ mol/min |
| B | DESe | $1.5 \times 10^{-5}$ mol/min | $1.5 \times 10^{-5}$ mol/min | $1.5 \times 10^{-5}$ mol/min |
| | Ar | 15 sccm | 15 sccm | 15 sccm |
| | $H_2$ | 15 sccm | 15 sccm | 15 sccm |

TABLE 9

Conditions for the preparation of ZnSe:H(:M) film
(hereinafter referred to as "preparation method 3")

| type of gas | n-type | i-type | p-type |
|---|---|---|---|
| Ar | 10 sccm | 10 sccm | 10 sccm |
| TEAl | $5.0 \times 10^{-9}$ mol/min | — | — |
| $LiC_3H_7$ | — | — | $1.5 \times 10^{-9}$ mol/min |
| $H_2$ gas | 15 sccm | 15 sccm | 15 sccm |

TABLE 10

Conditions for the preparation of n-type ZnS:Al film

| preparation method | raw material gas | | flow rate | inner pressure of film forming chamber | discharging power | film formation period |
|---|---|---|---|---|---|---|
| 4 | A | DEZn | $1.0 \times 10^{-6}$ mol/min | | | |
| | | Ar | 10 sccm | | | |
| | | TEAl | $3 \times 10^{-9}$ mol/min | 0.5 Torr | 200 W | 2 minutes |
| | B | $H_2S$ | $5.0 \times 10^{-6}$ mol/min | | | |
| | | Ar | 15 sccm | | | |
| 5 | A | DEZn | $1.0 \times 10^{-6}$ mol/min | | | |
| | | Ar | 10 sccm | | | |
| | | TEAl | $5 \times 10^{-9}$ mol/min | 1.0 Torr | 50 W | 2 minutes |
| | B | $H_2S$ | $5.0 \times 10^{-6}$ mol/min | | | |
| | | Ar | 15 sccm | | | |
| 6 | Target: ZnS | — | | 0.05 Torr | 300 W | 3 minutes |
| | A | TEAl | $5 \times 10^{-9}$ mol/min | | | |
| | | Ar | 10 sccm | | | |

TABLE 11

Conditions for the preparation of n-type ZnO:Al film

| preparation method | raw material gas | | flow rate | inner pressure of film forming chamber | discharging power | film formation period |
|---|---|---|---|---|---|---|
| 7 | A | DEZn | $1.0 \times 10^{-6}$ mol/min | | | |
| | | Ar | 10 sccm | | | |
| | | TEAl | $3.0 \times 10^{-9}$ mol/min | 0.5 Torr | 200 W | 3 minutes |
| | B | $H_2O$ | $5.0 \times 10^{-6}$ mol/min | | | |
| | | Ar | 15 sccm | | | |
| 8 | A | SEZn | $1.0 \times 10^{-6}$ mol/min | | | |
| | | Ar | 10 sccm | | | |
| | | TEAl | $3.0 \times 10^{-9}$ mol/min | 1.0 Torr | 50 W | 3 minutes |
| | B | $H_2O$ | $5.0 \times 10^{-6}$ mol/min | | | |
| | | Ar | 15 sccm | | | |
| 9 | Target: ZnO | — | | 0.05 Torr | 300 W | 4 minutes |
| | A | TEAl | $5.0 \times 10^{-9}$ mol/min | | | |
| | | Ar | 10 sccm | | | |

TABLE 12

Conditions for the preparation of n-type ZnSe:Al film

| preparation method | raw material gas | | flow rate | inner pressure of film forming chamber | discharging power | film formation period |
|---|---|---|---|---|---|---|
| 10 | A | DEZn | $1.0 \times 10^{-6}$ mol/min | | | |
| | | Ar | 10 sccm | | | |
| | | TEAl | $3.0 \times 10^{-9}$ mol/min | 0.5 Torr | 200 W | 2 minutes |
| | B | DESe | $1.5 \times 10^{-5}$ mol/min | | | |
| | | Ar | 15 sccm | | | |
| 11 | A | DEZn | $1.0 \times 10^{-6}$ mol/min | | | |
| | | Ar | 10 sccm | | | |
| | | TEAl | $5.0 \times 10^{-9}$ mol/min | 1.0 Torr | 50 W | 2 minutes |
| | B | DESe | $1.5 \times 10^{-6}$ mol/min | | | |
| | | Ar | 15 sccm | | | |
| 12 | | Target: ZnSe | — | 0.05 Torr | 300 W | 3 minutes |
| | A | TEAl | $5.0 \times 10^{-9}$ mol/min | | | |
| | | Ar | 10 sccm | | | |

TABLE 13

Conditions for the preparation of p-type ZnTe:Li film

| preparation method | raw material gas | | flow rate | inner pressure of film forming chamber | discharging power | film formation period |
|---|---|---|---|---|---|---|
| 13 | A | DEZn | $1.0 \times 10^{-6}$ mol/min | | | |
| | | Ar | 10 sccm | | | |
| | | $LiC_3H_7$ | $1.0 \times 10^{-9}$ mol/min | 0.5 Torr | 200 W | 2 minutes |
| | B | DETe | $1.5 \times 10^{-5}$ mol/min | | | |
| | | Ar | 15 sccm | | | |
| 14 | A | DEZn | $1.0 \times 10^{-6}$ mol/min | | | |
| | | Ar | 10 sccm | | | |
| | | $LiC_3H_7$ | $1.5 \times 10^{-9}$ mol/min | 1.0 Torr | 50 W | 2 minutes |
| | B | DETe | $1.5 \times 10^{-5}$ mol/min | | | |
| | | Ar | 15 sccm | | | |
| 15 | | Target: ZnTe | — | 0.05 Torr | 300 W | 3 minutes |
| | A | $LiC_3H_7$ | $1.5 \times 10^{-9}$ mol/min | | | |
| | | Ar | 10 sccm | | | |

TABLE 14

| Sample No. | preparation method | n-type semiconductor layer |
|---|---|---|
| 41 | 1 | ZnSe:H:Al |
| 42 | 4 | ZnS:Al |
| 43 | 7 | ZnO:Al |
| 44 | 10 | ZnSe:Al |

TABLE 15

Conditions for the preparation of i-type ZnSe:H film

| raw material gas | | Sample No. 46 flow rate | Sample No. 47 flow rate | Sample No. 48 flow rate |
|---|---|---|---|---|
| A | DEZn | $1.0 \times 10^{-6}$ mol/min | $1.0 \times 10^{-6}$ mol/min | $1.0 \times 10^{-6}$ mol/min |
| | Ar | 10 sccm | 10 sccm | 10 sccm |
| | DESe | $1.5 \times 10^{-5}$ mol/min | $1.5 \times 10^{-5}$ mol/min | $1.5 \times 10^{-5}$ mol/min |
| B | Ar | 15 sccm | 15 sccm | 15 sccm |
| | $H_2$ | 1 sccm | 3 sccm | 300 sccm |

TABLE 16

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta_0$ %] |
|---|---|---|---|---|---|---|---|
| 1 | p-type layer | 1 | 2.2 | 73 | 1.4 | 4.8 | 2 |
| | i-type layer | 1 | 2.4 | 75 | | | |
| | n-type layer | 1 | 2.5 | 77 | | | |
| 2 | p-type layer | 2 | 2.8 | 69 | 1.25 | 4.2 | 5 |
| | i-type layer | 2 | 3.0 | 71 | | | |
| | n-type layer | 2 | 3.1 | 73 | | | |
| 3 | p-type layer | 3 | 2.6 | 72 | 1.2 | 4.0 | 4 |
| | i-type layer | 3 | 2.6 | 73 | | | |

TABLE 16-continued

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta o$ %] |
|---|---|---|---|---|---|---|---|
| | n-type layer | 3 | 2.8 | 74 | | | |

TABLE 17

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta o$ %] |
|---|---|---|---|---|---|---|---|
| 4 | p-type layer | 2 | 2.8 | 69 | 1.35 | 4.5 | 2 |
| | i-type layer | 1 | 2.4 | 75 | | | |
| | n-type layer | 2 | 3.1 | 73 | | | |

TABLE 18

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta o$ %] |
|---|---|---|---|---|---|---|---|
| 5 | p-type layer | 1 | 2.2 | 73 | 1.2 | 3.2 | 3 |
| | i-type layer | 1 | 2.4 | 75 | | | |
| | n-type layer | 4 | — | — | | | |
| 6 | p-type layer | 1 | 2.2 | 73 | 1.15 | 3.0 | 3 |
| | i-type layer | 1 | 2.4 | 75 | | | |
| | n-type layer | 5 | — | — | | | |
| 7 | p-type layer | 1 | 2.2 | 73 | 1.1 | 3.1 | 4 |
| | i-type layer | 1 | 2.4 | 75 | 1.1 | 3.1 | 4 |
| | n-type layer | 6 | — | — | | | |
| 8 | p-type layer | 2 | 2.8 | 69 | 1.1 | 2.8 | 2 |
| | i-type layer | 2 | 3.0 | 71 | | | |
| | n-type layer | 4 | — | — | | | |
| 9 | p-type layer | 2 | 2.8 | 69 | 1.1 | 2.9 | 5 |
| | i-type layer | 2 | 3.0 | 71 | 1.1 | 2.9 | 5 |
| | n-type layer | 5 | — | — | | | |
| 10 | p-type layer | 2 | 2.8 | 69 | 1.05 | 2.5 | 1 |
| | i-type layer | 2 | 3.0 | 7.1 | | | |
| | n-type layer | 6 | — | — | | | |
| 11 | p-type layer | 3 | 2.6 | 72 | 1.15 | 2.6 | 3 |
| | i-type layer | 3 | 2.6 | 73 | | | |
| | n-type layer | 4 | — | — | | | |
| 12 | p-type layer | 3 | 2.6 | 72 | 1.05 | 2.8 | 6 |
| | i-type layer | 3 | 2.6 | 73 | | | |
| | n-type layer | 5 | — | — | | | |
| 13 | p-type layer | 3 | 2.6 | 72 | 1.0 | 2.4 | 7 |
| | i-type layer | 3 | 2.6 | 73 | | | |
| | n-type layer | 6 | — | — | | | |

TABLE 19

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta o$ %] |
|---|---|---|---|---|---|---|---|
| 14 | p-type layer | 1 | 2.2 | 73 | 1.2 | 3.5 | 3 |
| | i-type layer | 1 | 2.4 | 75 | | | |
| | n-type layer | 7 | — | — | | | |
| 15 | p-type layer | 1 | 2.2 | 73 | 1.3 | 3.2 | 2 |

TABLE 19-continued

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [Δη/ηo %] |
|---|---|---|---|---|---|---|---|
|    | i-type layer | 1 | 2.4 | 75 | | | |
|    | n-type layer | 8 | — | — | | | |
| 16 | p-type layer | 1 | 2.2 | 73 | 1.15 | 3.2 | 3 |
|    | i-type layer | 1 | 2.4 | 75 | | | |
|    | n-type layer | 9 | — | — | | | |
| 17 | p-type layer | 2 | 2.8 | 69 | 1.25 | 2.9 | 3 |
|    | i-type layer | 2 | 3.0 | 71 | | | |
|    | n-type layer | 7 | — | — | | | |
| 18 | p-type layer | 2 | 2.8 | 69 | 1.1 | 2.7 | 6 |
|    | i-type layer | 2 | 3.0 | 71 | | | |
|    | n-type layer | 8 | — | — | | | |
| 19 | p-type layer | 2 | 2.8 | 69 | 1.15 | 2.7 | 4 |
|    | i-type layer | 2 | 3.0 | 71 | | | |
|    | n-type layer | 9 | — | — | | | |
| 20 | p-type layer | 3 | 2.6 | 72 | 0.95 | 3.0 | 5 |
|    | i-type layer | 3 | 2.6 | 73 | | | |
|    | n-type layer | 7 | — | — | | | |
| 21 | p-type layer | 3 | 2.6 | 72 | 0.90 | 3.1 | 4 |
|    | i-type layer | 3 | 2.6 | 73 | | | |
|    | n-type layer | 8 | — | — | | | |
| 22 | p-type layer | 3 | 2.6 | 72 | 0.90 | 2.6 | 5 |
|    | i-type layer | 3 | 2.6 | 73 | | | |
|    | n-type layer | 9 | — | — | | | |

TABLE 20

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [Δη/ηo %] |
|---|---|---|---|---|---|---|---|
| 23 | p-type layer | 1 | 2.2 | 73 | 1.15 | 3.7 | 2 |
|    | i-type layer | 1 | 2.4 | 75 | | | |
|    | n-type layer | 10 | — | — | | | |
| 24 | p-type layer | 1 | 2.2 | 73 | 1.2 | 3.4 | 3 |
|    | i-type layer | 1 | 2.4 | 75 | | | |
|    | n-type layer | 11 | — | — | | | |
| 25 | p-type layer | 1 | 2.2 | 73 | 1.2 | 3.3 | 3 |
|    | i-type layer | 1 | 2.4 | 75 | | | |
|    | n-type layer | 12 | — | — | | | |
| 26 | p-type layer | 2 | 2.8 | 69 | 1.1 | 3.1 | 5 |
|    | i-type layer | 2 | 3.0 | 71 | | | |
|    | n-type layer | 10 | — | — | | | |
| 27 | p-type layer | 2 | 2.8 | 69 | 1.1 | 2.9 | 6 |
|    | i-type layer | 2 | 3.0 | 71 | | | |
|    | n-type layer | 11 | — | — | | | |
| 28 | p-type layer | 2 | 2.8 | 69 | 1.05 | 3.0 | 3 |
|    | i-type layer | 2 | 3.0 | 71 | | | |
|    | n-type layer | 12 | — | — | | | |
| 29 | p-type layer | 3 | 2.6 | 72 | 0.85 | 2.5 | 4 |
|    | i-type layer | 3 | 2.6 | 73 | | | |
|    | n-type layer | 10 | — | — | | | |
| 30 | p-type layer | 3 | 2.6 | 72 | 0.9 | 2.7 | 7 |
|    | i-type layer | 3 | 2.6 | 73 | | | |
|    | n-type layer | 11 | — | — | | | |
| 31 | p-type layer | 3 | 2.6 | 72 | 0.9 | 2.4 | 7 |
|    | i-type layer | 3 | 2.6 | 73 | | | |
|    | n-type layer | 12 | — | — | | | |

TABLE 21

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta_0$ %] |
|---|---|---|---|---|---|---|---|
| 32 | p-type layer | 13 | — | — | 1.0 | 2.1 | 4 |
|  | i-type layer | 1 | 2.4 | 75 |  |  |  |
|  | n-type layer | 1 | 2.5 | 77 |  |  |  |
| 33 | p-type layer | 14 | — | — | 0.95 | 1.8 | 5 |
|  | i-type layer | 1 | 2.4 | 75 |  |  |  |
|  | n-type layer | 1 | 2.5 | 77 |  |  |  |
| 34 | p-type layer | 15 | — | — | 0.85 | 1.7 | 6 |
|  | i-type layer | 1 | 2.4 | 75 |  |  |  |
|  | n-type layer | 1 | 2.5 | 77 |  |  |  |
| 35 | p-type layer | 13 | — | — | 1.05 | 2.4 | 3 |
|  | i-type layer | 2 | 3.0 | 71 |  |  |  |
|  | n-type layer | 2 | 3.1 | 73 |  |  |  |
| 36 | p-type layer | 14 | — | — | 0.85 | 2.3 | 7 |
|  | i-type layer | 2 | 3.0 | 71 |  |  |  |
|  | n-type layer | 2 | 3.1 | 73 |  |  |  |
| 37 | p-type layer | 15 | — | — | 0.9 | 1.8 | 9 |
|  | i-type layer | 2 | 3.0 | 71 |  |  |  |
|  | n-type layer | 2 | 3.1 | 73 |  |  |  |
| 38 | p-type layer | 13 | — | — | 0.95 | 1.7 | 4 |
|  | i-type layer | 3 | 2.6 | 73 |  |  |  |
|  | n-type layer | 3 | 2.8 | 74 |  |  |  |
| 39 | p-type layer | 14 | — | — | 0.85 | 1.5 | 3 |
|  | i-type layer | 3 | 2.6 | 73 |  |  |  |
|  | n-type layer | 3 | 2.8 | 74 |  |  |  |
| 40 | p-type layer | 15 | — | — | 0.8 | 1.4 | 8 |
|  | i-type layer | 3 | 2.6 | 73 |  |  |  |
|  | n-type layer | 3 | 2.8 | 74 |  |  |  |

TABLE 22

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta_0$ %] |
|---|---|---|---|---|---|---|---|
| 41 | n-type layer | 1 | 2.5 | 77 | 1.35 | 4.5 | 2 |
|  | i-type layer | 1 | 2.4 | 75 |  |  |  |
|  | p-type layer | 1 | 2.2 | 73 |  |  |  |
| 42 | n-type layer | 4 | — | — | 3.5 | 3.5 | 2 |
|  | i-type layer | 1 | 2.4 | 75 |  |  |  |
|  | p-type layer | 1 | 2.2 | 73 |  |  |  |
| 43 | n-type layer | 7 | — | — | 1.30 | 3.4 | 3 |
|  | i-type layer | 1 | 2.4 | 75 |  |  |  |
|  | p-type layer | 1 | 2.2 | 73 |  |  |  |
| 44 | n-type layer | 10 | 2.4 | 75 | 1.35 | 4.0 | 3 |
|  | i-type layer | 1 |  |  |  |  |  |
|  | p-type layer | 1 |  |  |  |  |  |
| 45 | n-type layer | 1 | 2.5 | 77 | 1.1 | 2.6 | 5 |
|  | i-type layer | 1 | 2.4 | 75 |  |  |  |
|  | p-type layer | 13 | — | — |  |  |  |

TABLE 23

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta_0$ %] |
|---|---|---|---|---|---|---|---|
| 46 | p-type layer | 1 | 2.2 | 73 | 0.3 | 0.2 | 0 |
|  | i-type layer | 1 | 0.3 | 92 |  |  |  |
|  | n-type layer | 1 | 2.5 | 77 |  |  |  |
| 47 | p-type layer | 1 | 2.2 | 73 | 0.7 | 0.7 | 2 |
|  | i-type layer | 1 | 0.7 | 89 |  |  |  |
|  | n-type layer | 1 | 2.5 | 77 |  |  |  |

TABLE 23-continued

| Sample No. | semiconductor layer | preparation method | hydrogen (H) content in ZnSe film [atomic %] | volume percentage of crystal grain [%] | open-circuit voltage under irradiation of AM-1 [volt] | output value under irradiation of AM-1 (using 400 nm interference filter) [relative value] | rate of change in conversion efficiency after irradiation of AM-1 for 10 hours [$\Delta\eta/\eta o$ %] |
|---|---|---|---|---|---|---|---|
| 48 | p-type layer | 1 | 2.2 | 73 | 0.9 | 1.5 | 7 |
| | i-type layer | 1 | 2.5 | 25 | | | |
| | n-type layer | 1 | 2.5 | 77 | | | |
| 49 | p-type layer | | | | 0.75 | 1 | 40 |
| | i-type layer | | | | | | |
| | n-type layer | | | | | | |

TABLE 24

Conditions for the preparation of $ZnSe_{1-x}Te_x$:H(:M) film
(hereinafter referred to as "preparation method 16")

| type of gas | | n-type | i-type | p-type |
|---|---|---|---|---|
| A | DEZn | $1.0 \times 10^{-6}$ mol/min | $1.0 \times 10^{-6}$ mol/min | $1.0 \times 10^{-6}$ mol/min |
| | He | 10 sccm | 5 sccm | 10 sccm |
| | $LiC_3H_7$ | — | — | $1.0 \times 10^{-9}$ mol/min |
| | DESe | $3.0 \times 10^{-6}$ mol/min | $3.0 \times 10^{-6}$ mol/min | $3.0 \times 10^{-6}$ mol/min |
| B | DETe | $8 \times 10^{-6}$ mol/min | $8 \times 10^{-6}$ mol/min | $8 \times 10^{-6}$ mol/min |
| | He | 15 sccm | 15 sccm | 15 sccm |
| | $H_2$ | 15 sccm | 15 sccm | 15 sccm |

TABLE 25

Conditions for the preparation of $ZnSe_{1-x}Te_x$:H(:M) film
(hereinafter referred to as "preparation method 17")

| type of gas | | n-type | i-type | p-type |
|---|---|---|---|---|
| A | DEZn | $1.0 \times 10^{-6}$ mol/min | $1.0 \times 10^{-6}$ mol/min | $1.0 \times 10^{-6}$ mol/min |
| | He | 10 sccm | 5 sccm | 10 sccm |
| | TEA 1 | $5.0 \times 10^{-9}$ mol/min | — | — |
| | $LiC_3H_7$ | — | — | $1.5 \times 10^{-9}$ mol/min |
| B | DESe | $3.0 \times 10^{-6}$ mol/min | $3.0 \times 10^{-6}$ mol/min | $3.0 \times 10^{-6}$ mol/min |
| | DETe | $8.0 \times 10^{-6}$ mol/min | $8.0 \times 10^{-6}$ mol/min | $8.0 \times 10^{-6}$ mol/min |
| | He | 15 sccm | 15 sccm | 15 sccm |
| | $H_2$ | 15 sccm | 15 sccm | 15 sccm |

TABLE 26

Conditions for the preparation of $ZnSe_{1-x}Te_x$:H(:M) film
(hereinafter referred to as "preparation method 18")

| type of gas | n-type | i-type | p-type |
|---|---|---|---|
| Ar | 10 sccm | 10 sccm | 10 sccm |
| TEA 1 | $5.0 \times 10^{-9}$ mol/min | — | — |
| $LiC_3H_7$ | — | — | $1.5 \times 10^{-9}$ mol/min |
| $H_2$ gas | 15 sccm | 15 sccm | 15 sccm |

TABLE 27

Conditions for the preparation of n-type ZnS:Al film

| preparation method | raw material gas | | flow rate | inner pressure of film forming chamber | discharging power | film formation period |
|---|---|---|---|---|---|---|
| 19 | A | DEZn | $1.0 \times 10^{-6}$ mol/min | 0.5 Torr | 200 W | 2 minutes |
| | | Ar | 10 sccm | | | |
| | | TEA 1 | $3 \times 10^{-9}$ mol/min | | | |
| | B | $H_2S$ | $5.0 \times 10^{-6}$ mol/min | | | |
| | | He | 15 sccm | | | |
| 20 | A | DEZn | $1.0 \times 10^{-6}$ mol/min | 1.0 Torr | 50 W | 2 minutes |
| | | He | 10 sccm | | | |
| | | TEA 1 | $5 \times 10^{-9}$ mol/min | | | |
| | B | $H_2S$ | $5.0 \times 10^{-6}$ mol/min | | | |
| | | He | 15 sccm | | | |
| 21 | Target: ZnS | | — | 0.05 Torr | 300 W | 3 minutes |
| | A | TEA 1 | $5 \times 10^{-9}$ mol/min | | | |
| | | Ar | 10 sccm | | | |

TABLE 28

Conditions for the preparation of n-type ZnO:A l film

| preparation method | raw material gas | | flow rate | inner pressure of film forming chamber | discharging power | film formation period |
|---|---|---|---|---|---|---|
| 22 | A | DEZn | $1.0 \times 10^{-6}$ mol/min | 0.5 Torr | 200 W | 3 minutes |
|  |  | He | 10 sccm |  |  |  |
|  |  | TEA l | $3.0 \times 10^{-9}$ mol/min |  |  |  |
|  | B | H$_2$O | $5.0 \times 10^{-6}$ mol/min |  |  |  |
|  |  | He | 15 sccm |  |  |  |
| 23 | A | DEZn | $1.0 \times 10^{-6}$ mol/min | 1.0 Torr | 50 W | 3 minutes |
|  |  | He | 10 sccm |  |  |  |
|  |  | TEA l | $3.0 \times 10^{-9}$ mol/min |  |  |  |
|  | B | H$_2$O | $5.0 \times 10^{-6}$ mol/min |  |  |  |
|  |  | He | 15 sccm |  |  |  |
| 24 | Target: ZnO | — |  | 0.05 Torr | 300 W | 4 minutes |
|  | A | TEA l | $5.0 \times 10^{-9}$ mol/min |  |  |  |
|  |  | Ar | 10 sccm |  |  |  |

TABLE 29

Conditions for the preparation of p-type ZnTe:Li film

| preparation method | raw material gas | | flow rate | Inner pressure of film forming chamber | discharging power | film formation period |
|---|---|---|---|---|---|---|
| 25 | A | DEZn | $1.0 \times 10^{-6}$ mol/min | 0.5 Torr | 200 W | 2 minutes |
|  |  | He | 10 sccm |  |  |  |
|  |  | LiC$_3$H$_7$ | $3.0 \times 10^{-9}$ mol/min |  |  |  |
|  | B | DETe | $1.5 \times 10^{-5}$ mol/min |  |  |  |
|  |  | He | 15 sccm |  |  |  |
|  | A | DEZn | $1.0 \times 10^{-6}$ mol/min | 1.0 Torr | 50 W | 2 minutes |
|  |  | He | 10 sccm |  |  |  |
|  |  | LiC$_3$H$_7$ | $3.0 \times 10^{-9}$ mol/min |  |  |  |
|  | B | DET3 | $1.5 \times 10^{-5}$ mol/min |  |  |  |
|  |  | He | 15 sccm |  |  |  |
| 27 | Target: ZnTe | — |  | 0.05 Torr | 300 W | 3 minutes |
|  | A | LiC$_3$H$_7$ |  | $1.5 \times 10^{-9}$ mol/min |  |  |
|  |  | Ar | 10 sccm |  |  |  |

TABLE 30

Conditions for the preparation of p-type ZnSe:H:Li film

| preparation method | raw material gas | | flow rate | inner pressure of film forming chamber | discharging power | film formation period |
|---|---|---|---|---|---|---|
|  | A | DEZn | $1.0 \times 10^{-6}$ mol/min |  |  |  |
|  |  | He | 10 sccm |  |  |  |
| 28 |  | LiC$_3$H$_7$ | $3.0 \times 10^{-9}$ mol/min | 0.5 Torr | 200 W | 2 minutes |
|  | B | DESe | $1.5 \times 10^{-5}$ mol/min |  |  |  |
|  |  | He | 15 sccm |  |  |  |
|  | A | DEZn | $1.0 \times 10^{-6}$ mol/min |  |  |  |
|  |  | He | 10 sccm |  |  |  |
| 29 |  | LiC$_3$H$_7$ | $3.0 \times 10^{-9}$ mol/min | 1.0 Torr | 50 W | 2 minutes |
|  | B | DESe | $1.5 \times 10^{-5}$ mol/min |  |  |  |
|  |  | He | 15 sccm |  |  |  |
|  | Target: ZnSe | — |  |  |  |  |
| 30 | A | LiC$_3$H$_7$ | $1.5 \times 10^{-9}$ mol/min | 0.05 Torr | 300 W | 3 minutes |
|  |  | Ar | 10 sccm |  |  |  |

TABLE 31

| Sample No. | preparation method | n-type semiconductor layer |
|---|---|---|
| 90 | 16 | ZnSe$_{1-x}$Te$_x$:H:Al |
| 91 | 19 | ZnS: Al |
| 92 | 22 | ZnO: Al |

TABLE 32

| Sample No. | preparation method | p-type semiconductor layer |
|---|---|---|
| 93 | 25 | ZnTe:Li |
| 94 | 28 | ZnSe:H:Li |

TABLE 33

Conditions for the preparation of i-type ZnSe:H:Li film

| raw material gas | | Sample No. 95 | Sample No. 96 | Sample No. 97 |
|---|---|---|---|---|
|  | | flow rate | | |
| A | DEZn | $1.0 \times 10^{-6}$ mol/min | $1.0 \times 10^{-6}$ mol/min | $1.0 \times 10^{-6}$ mol/min |
|  | He | 10 sccm | 10 sccm | 10 sccm |

TABLE 33-continued

Conditions for the preparation of i-type ZnSe:H:Li film

| | | flow rate | | |
|---|---|---|---|---|
| raw material gas | | Sample No. 95 | Sample No. 96 | Sample No. 97 |
| B | DESe | $3 \times 10^{-6}$ mol/min | $3 \times 10^{-6}$ mol/min | $3 \times 10^{-6}$ mol/min |
| | DETe | $8 \times 10^{-6}$ mol/min | $8 \times 10^{-6}$ mol/min | $8 \times 10^{-6}$ mol/min |
| | He | 15 sccm | 15 sccm | 15 sccm |
| | $H_2$ | 1 sccm | 3 sccm | 300 sccm |

TABLE 34

Conditions for the introduction of raw material gas at the time of forming i-type $ZnSe_{2-x}Te_x$ film

| | | flow rate | | |
|---|---|---|---|---|
| raw material gas | | Sample No. 98 | Sample No. 99 | Sample No. 100 |
| A | DEZn | $1.0 \times 10^{-6}$ mol/min | $1.0 \times 10^{-6}$ mol/min | $1.0 \times 10^{-6}$ mol/min |
| | He | 10 sccm | 10 sccm | 10 sccm |
| | DESe | $1.2 \times 10^{-5}$ mol/min | $7.5 \times 10^{-6}$ mol/min | 0 |
| B | DETe | $2 \times 10^{-6}$ mol/min | $5 \times 10^{-6}$ mol/min | $1.0 \times 10^{-5}$ mol/min |
| | He | 15 sccm | 15 sccm | 15 sccm |
| | $H_2$ | 15 sccm | 15 sccm | 15 sccm |

TABLE 35

| | | | characteristics | | | | |
|---|---|---|---|---|---|---|---|
| Sample No. | semiconductor layer | preparation method | hydrogen (H) content in $ZnSe_{1-x}Te_x$:H (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours [$\Delta\eta/\eta_o$ %] |
| 50 | p-type layer | 16 | 2.4 | 69 | | | |
| | i-type layer | 16 | 2.8 | 84 | 1.3 | 2.7 | 1 |
| | n-type layer | 16 | 3.1 | 73 | | | |
| 51 | p-type layer | 17 | 2.8 | 67 | | | |
| | i-type layer | 17 | 3.2 | 81 | 1.2 | 2.5 | 3 |
| | n-type layer | 17 | 3.6 | 70 | | | |
| 52 | p-type layer | 18 | 2.5 | 67 | | | |
| | i-type layer | 18 | 2.9 | 78 | 1.25 | 2.3 | 3 |
| | n-type layer | 18 | 3.3 | 69 | | | |

TABLE 36

| | | | characteristics | | | | |
|---|---|---|---|---|---|---|---|
| Sample No. | semiconductor layer | preparation method | hydrogen (H) content in $ZnSe_{1-x}Te_x$:H (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours [$\Delta\eta/\eta_o$ %] |
| 53 | p-type layer | 17 | 2.8 | 67 | | | |
| | i-type layer | 16 | 2.8 | 84 | 1.3 | 2.7 | 2 |
| | n-type layer | 17 | 3.6 | 70 | | | |

TABLE 37

| | | | characteristics | | | | |
|---|---|---|---|---|---|---|---|
| Sample No. | semiconductor layer | preparation method | hydrogen (H) content in $ZnSe_{1-x}Te_x$:H (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours [$\Delta\eta/\eta_o$ %] |
| 54 | p-type layer | 16 | 2.4 | 69 | | | |
| | i-type layer | 16 | 2.8 | 84 | 1.2 | 2.6 | 2 |
| | n-type layer | 19 | — | — | | | |
| 55 | p-type layer | 16 | 2.4 | 69 | | | |
| | i-type layer | 16 | 2.8 | 84 | 1.2 | 2.5 | 1 |
| | n-type layer | 20 | — | — | | | |
| 56 | p-type layer | 16 | 2.4 | 69 | | | |
| | i-type layer | 16 | 2.8 | 84 | 1.1 | 2.3 | 4 |
| | n-type layer | 21 | — | — | | | |

TABLE 37-continued

| | | | characteristics | | | | |
|---|---|---|---|---|---|---|---|
| Sample No. | semiconductor layer | preparation method | hydrogen (H) content in $ZnSe_{1-x}Te_x:H$ (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours [$\Delta\eta/\eta_o$ %] |
| 57 | p-type layer | 17 | 2.8 | 67 | | | |
| | i-type layer | 17 | 3.2 | 81 | 1.15 | 2.5 | 1 |
| | n-type layer | 19 | — | — | | | |
| 58 | p-type layer | 17 | 2.8 | 67 | | | |
| | i-type layer | 17 | 3.2 | 81 | 1.1 | 2.4 | 3 |
| | n-type layer | 20 | — | — | | | |
| 59 | p-type layer | 17 | 2.8 | 67 | | | |
| | i-type layer | 17 | 3.2 | 81 | 1.05 | 2.3 | 1 |
| | n-type layer | 21 | — | — | | | |
| 60 | p-type layer | 18 | 2.5 | 67 | | | |
| | i-type layer | 18 | 2.9 | 78 | 1.2 | 2.2 | 2 |
| | n-type layer | 19 | — | — | | | |
| 61 | p-type layer | 18 | 2.5 | 67 | | | |
| | i-type layer | 18 | 2.9 | 78 | 1.1 | 2.1 | 5 |
| | n-type layer | 20 | — | — | | | |
| 62 | p-type layer | 18 | 2.5 | 67 | | | |
| | i-type layer | 18 | 2.9 | 78 | 1.0 | 1.8 | 6 |
| | n-type layer | 21 | — | — | | | |

TABLE 38

| | | | characteristics | | | | |
|---|---|---|---|---|---|---|---|
| Sample No. | semiconductor layer | preparation method | hydrogen (H) content in $ZnSe_{1-x}Te_x:H$ (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours [$\Delta\eta/\eta_o$ %] |
| 63 | p-type layer | 16 | 2.4 | 69 | | | |
| | i-type layer | 16 | 2.8 | 84 | 1.25 | 2.5 | 3 |
| | n-type layer | 22 | — | — | | | |
| 64 | p-type layer | 16 | 2.4 | 69 | | | |
| | i-type layer | 16 | 2.8 | 84 | 1.25 | 2.6 | 3 |
| | n-type layer | 23 | — | — | | | |
| 65 | p-type layer | 16 | 2.4 | 69 | | | |
| | i-type layer | 16 | 2.8 | 84 | 1.15 | 2.3 | 5 |
| | n-type layer | 24 | — | — | | | |
| 66 | p-type layer | 17 | 2.8 | 67 | | | |
| | i-type layer | 17 | 3.2 | 81 | 1.15 | 2.4 | 2 |
| | n-type layer | 22 | — | — | | | |
| 67 | p-type layer | 17 | 2.8 | 67 | | | |
| | i-type layer | 17 | 3.2 | 81 | 1.05 | 2.2 | 5 |
| | n-type layer | 23 | — | — | | | |
| 68 | p-type layer | 17 | 2.8 | 67 | | | |
| | i-type layer | 17 | 3.2 | 81 | 1.1 | 2.0 | 7 |
| | n-type layer | 24 | — | — | | | |
| 69 | p-type layer | 18 | 2.5 | 67 | | | |
| | i-type layer | 18 | 2.9 | 78 | 1.0 | 1.9 | 3 |
| | n-type layer | 22 | — | — | | | |
| 70 | p-type layer | 18 | 2.5 | 67 | | | |
| | i-type layer | 18 | 2.9 | 78 | 1.05 | 2.0 | 7 |
| | n-type layer | 23 | — | — | | | |
| 71 | p-type layer | 18 | 2.5 | 67 | | | |
| | i-type layer | 18 | 2.9 | 78 | 0.95 | 2.0 | 7 |
| | n-type layer | 24 | — | — | | | |

TABLE 39

| | | | characteristics | | | | |
|---|---|---|---|---|---|---|---|
| Sample No. | semiconductor layer | preparation method | hydrogen (H) content in $ZnSe_{1-x}Te_x:H$ (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours [$\Delta\eta/\eta_o$ %] |
| 72 | p-type layer | 25 | — | — | | | |
| | i-type layer | 16 | 2.8 | 84 | 1.15 | 2.2 | 2 |
| | n-type layer | 16 | 3.1 | 73 | | | |

TABLE 39-continued

| Sample No. | semiconductor layer | preparation method | hydrogen (H) content in $ZnSe_{1-x}Te_x:H$ (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours $[\Delta\eta/\eta_o \%]$ |
|---|---|---|---|---|---|---|---|
| | p-type layer | 26 | — | — | | | |
| 73 | i-type layer | 16 | 2.8 | 84 | 1.2 | 2.4 | 1 |
| | n-type layer | 16 | 3.1 | 73 | | | |
| | p-type layer | 27 | — | — | | | |
| 74 | i-type layer | 16 | 2.8 | 84 | 1.05 | 2.0 | 2 |
| | n-type layer | 16 | 3.1 | 73 | | | |
| | p-type layer | 25 | — | — | | | |
| 75 | i-type layer | 17 | 3.2 | 81 | 1.1 | 2.3 | 2 |
| | n-type layer | 17 | 3.6 | 70 | | | |
| | p-type layer | 26 | — | — | | | |
| 76 | i-type layer | 17 | 3.2 | 81 | 1.1 | 2.4 | 1 |
| | n-type layer | 17 | 3.6 | 70 | | | |
| | p-type layer | 27 | — | — | | | |
| 77 | i-type layer | 17 | 3.2 | 81 | 1.0 | 2.2 | 3 |
| | n-type layer | 17 | 3.6 | 70 | | | |
| | p-type layer | 25 | — | — | | | |
| 78 | i-type layer | 18 | 2.9 | 78 | 0.95 | 1.7 | 3 |
| | n-type layer | 18 | 3.3 | 69 | | | |
| | p-type layer | 26 | — | — | | | |
| 79 | i-type layer | 18 | 2.9 | 78 | 0.9 | 1.4 | 3 |
| | n-type layer | 18 | 3.3 | 69 | | | |
| | p-type layer | 27 | — | — | | | |
| 80 | i-type layer | 18 | 2.9 | 78 | 0.85 | 1.3 | 4 |
| | n-type layer | 18 | 3.3 | 69 | | | |

TABLE 40

| Sample No. | semiconductor layer | preparation method | hydrogen (H) content in $ZnSe_{1-x}Te_x:H$ (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours $[\Delta\eta/\eta_o \%]$ |
|---|---|---|---|---|---|---|---|
| | p-type layer | 28 | — | — | | | |
| 81 | i-type layer | 16 | 2.8 | 84 | 1.4 | 3.2 | 2 |
| | n-type layer | 16 | 3.1 | 73 | | | |
| | p-type layer | 29 | — | — | | | |
| 82 | i-type layer | 16 | 2.8 | 84 | 1.3 | 3.0 | 2 |
| | n-type layer | 16 | 3.1 | 73 | | | |
| | p-type layer | 30 | — | — | | | |
| 83 | i-type layer | 16 | 2.8 | 84 | 1.25 | 2.8 | 1 |
| | n-type layer | 16 | 3.1 | 73 | | | |
| | p-type layer | 28 | — | — | | | |
| 84 | i-type layer | 17 | 3.2 | 81 | 1.3 | 3.2 | 3 |
| | n-type layer | 17 | 3.6 | 70 | | | |
| | p-type layer | 29 | — | — | | | |
| 85 | i-type layer | 17 | 3.2 | 81 | 1.2 | 2.9 | 4 |
| | n-type layer | 17 | 3.6 | 70 | | | |
| | p-type layer | 30 | — | — | | | |
| 86 | i-type layer | 17 | 3.2 | 81 | 1.15 | 2.8 | 2 |
| | n-type layer | 17 | 3.6 | 70 | | | |
| | p-type layer | 28 | — | — | | | |
| 87 | i-type layer | 18 | 2.9 | 78 | 1.15 | 2.3 | 3 |
| | n-type layer | 18 | 3.3 | 69 | | | |
| | p-type layer | 29 | — | — | | | |
| 88 | i-type layer | 18 | 2.9 | 78 | 1.05 | 2.4 | 4 |
| | n-type layer | 18 | 3.3 | 69 | | | |
| | p-type layer | 30 | — | — | | | |
| 89 | i-type layer | 18 | 2.9 | 78 | 1.0 | 1.9 | 3 |
| | n-type layer | 18 | 3.3 | 69 | | | |

TABLE 41

| Sample No. | semiconductor layer | preparation method | hydrogen (H) content in ZnSe$_{1-x}$Te$_x$:H (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours [Δη/η$_o$ %] |
|---|---|---|---|---|---|---|---|
| 90 | n-type layer | 16 | 3.1 | 73 | | | |
| | i-type layer | 16 | 2.8 | 84 | 1.2 | 2.6 | 1 |
| | p-type layer | 16 | 2.4 | 69 | | | |
| 91 | n-type layer | 19 | — | — | | | |
| | i-type layer | 16 | 2.8 | 84 | 1.2 | 2.5 | 2 |
| | p-type layer | 16 | 2.4 | 69 | | | |
| 92 | n-type layer | 22 | — | — | | | |
| | i-type layer | 16 | 2.8 | 84 | 1.15 | 2.4 | 1 |
| | p-type layer | 16 | 2.4 | 69 | | | |
| 93 | n-type layer | 16 | 3.1 | 73 | | | |
| | i-type layer | 16 | 2.8 | 84 | 1.05 | 2.3 | 3 |
| | p-type layer | 25 | — | — | | | |
| 94 | n-type layer | 16 | 3.1 | 73 | | | |
| | i-type layer | 16 | 2.8 | 84 | 1.3 | 2.9 | 2 |
| | p-type layer | 28 | — | — | | | |

TABLE 42

| Sample No. | semiconductor layer | preparation method | hydrogen (H) content in ZnSe$_{1-x}$Te$_x$:H (:M) film [atomic %] | volume percentage of crystal grain [%] | open-circuit voltage under irradiation of AM-1.5 [volt] | output value under irradiation of AM-1.5 (using 450 nm interference (filter) [relative value] | rate of change in conversion efficiency after irradiation of AM-1.5 for 10 hours [Δη/η$_o$ %] |
|---|---|---|---|---|---|---|---|
| 95 | p-type layer | 16 | 2.4 | 69 | | | |
| | i-type layer | 16 | 0.5 | 94 | 0.2 | 0.4 | 0 |
| | n-type layer | 16 | 3.1 | 73 | | | |
| 96 | p-type layer | 16 | 2.4 | 69 | | | |
| | i-type layer | 16 | 0.8 | 91 | 0.5 | 0.9 | 0 |
| | n-type layer | 16 | 3.1 | 13 | | | |
| 97 | p-type layer | 16 | 2.4 | 69 | | | |
| | i-type layer | 16 | 6.8 | 28 | 0.7 | 1.3 | 5 |
| | n-type layer | 16 | 3.1 | 73 | | | |
| 98 | p-type layer | 16 | 2.4 | 69 | | | |
| | i-type layer | 16 | 2.2 | 73 | 0.75 | 1.2 | 2 |
| | n-type layer | 16 | 3.1 | 73 | | | |
| 99 | p-type layer | 16 | 2.4 | 69 | | | |
| | i-type layer | 16 | 2.1 | 70 | 0.7 | 1.4 | 3 |
| | n-type layer | 16 | 3.1 | 73 | | | |
| 100 | p-type layer | 16 | 2.4 | 69 | | | |
| | i-type layer | 16 | 1.9 | 67 | 0.6 | 1.7 | 4 |
| | n-type layer | 16 | 3.1 | 73 | | | |
| 101 | p-type layer | 16 | — | — | | | |
| | i-type layer | 16 | — | — | 0.75 | 1 | 40 |
| | n-type layer | 16 | — | — | | | |

What we claim is:

1. An improved pin junction photovoltaic element which generates photoelectromotive force upon irradiation of light, having a junction of a p-type semiconductor layer, an i-type semiconductor layer and an n-type semiconductor layer, characterized in that at least said i-type semiconductor layer comprises a deposited film comprised of zinc atoms, selenium atoms and hydrogen atoms, said deposited film containing said hydrogen atoms in an amount of 1 to 4 atomic % and crystal grain domains in a proportion of 65 to 85 vol % per unit volume.

2. The pin junction voltaic element according to claim 1, wherein said p-type semiconductor layer or-/and said n-type semiconductor layer comprises a deposited film comprised of zinc atoms, selenium atoms, hydrogen atoms, and a dopant of p-type or n-type, said deposited film containing said hydrogen atoms in an amount of 1 to 4 atomic % and crystal grain domains in a proportion of 65 to 86 vol % per unit volume.

3. The pin junction photovoltaic element according to claim 2, wherein said p-type dopant is a member selected from the group consisting of Group I elements and Group V elements of the Periodic Table.

4. The pin junction photovoltaic element according to claim 3, wherein said member is lithium.

5. An improved pin junction photovoltaic element which generates photoelectromotive force upon irradiation of light, having a junction of a p-type semiconductor layer, an i-type semiconductor layer and an n-type semiconductor layer, characterized in that at least said i-type semiconductor layer comprises a deposited film comprised of zinc atoms, selenium atoms, tellurium atoms and hydrogen atoms the quantitative ratio of said selenium atoms to said tellurium atoms in said deposited film is in the range from 1:9 to 3:7 said deposited film containing said hydrogen atoms in an amount of 1 to 4 atomic % and crystal grain domains in a proportion of 65 to 85 vol % per unit volume.

6. The pin junction photovoltaic element according to claim 5, wherein said p-type semiconductor layer or/and said n-type semiconductor layer comprises a deposited film comprised of zinc atoms, selenium atoms, tellurium atoms, hydrogen atoms, and a dopant of p-type or n-type, the quantitative ratio of said selenium atoms to said tellurium atoms in said deposited film is in the range from 1:9 to 3:7, said deposited film containing said hydrogen atoms in an amount of 1 to 4 atomic % and crystal grain domains in a proportion of 65 to 85 vol % per unit volume.

7. The pin junction photovoltaic element according to claim 6, wherein said p-type dopant is a member selected from the group consisting of Group I elements and Group V elements of the Periodic Table.

8. The pin junction photovoltaic element according to claim 7, wherein said member is lithium.

* * * * *

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

Page 1 of 19

It is certified that error appears in the above-identified patent and that said Letters Patent is hereby corrected as shown below:

IN THE DRAWINGS

SHEET 12 OF 23

FIG. 12, "conduetivity" should read --conductivity--.

COLUMN 1

Line 59, "hense," should read --hence,--.

COLUMN 2

Line 16, "(Vox)" should read --(Voc)--.
    Line 50, "(where 0,x,1)." should read
           --(where $0<x<1$).--.

COLUMN 3

Line 19, "Pat. No. 4,226,88" should read
           --Pat. No. 4,226,898--.
    Line 30, "Li likewise" should read --Li, likewise--.
    Line 42, "does not" should read --does--.
    Line 46, "si" should read --is--.

COLUMN 4

Lines 20-21, "cl" should be deleted and
            "BRIEF DESCRIPTION OF THE DRAWINGS"
            should be centered as a heading.
    Line 51, "the" (first occurrence) should be deleted.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 5

Line 33, "crystal grains domains" should read --crystal grain domains--.

COLUMN 6

Line 16, "affored" should read --afforded--.
    Line 26, "layer," should read --layer--.
    Line 48, "pin junction" should read --a pin junction--.
    Line 52, "layer," should read --layer--.

COLUMN 7

Line 40, "wide" should read --side--.

COLUMN 8

Line 60, "t" should read --it--.

COLUMN 9

Line 18, "in" should read --in characteristics induced--.
    Line 19, Close up left margin.
    Line 57, "white circles ( )" should read --white circles (○)--.
    Line 60, "Black circles ( )" should read --Black circles (●)--.
    Line 62, "8 1 hours" should read --8 hours--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 10

Line 11, "that-films" should read --that films--.
Line 25, "bu" should read --but--.
Line 52, "intense," should read --intense--.

COLUMN 11

Line 60, "there into" should read --thereinto--.
Line 64, "$10^{-1}\Omega$-cm)." should read --$10^{-1}\Omega$-cm),--.

COLUMN 12

Line 68, "add" should read --and--.

COLUMN 13

Line 42, "$\Delta\sigma=\sigma/\sigma°$" should read --$\Delta\sigma=\sigma/\sigma o$--.
Line 50, "step (i)-(ii)" should read --step (1)-(ii)--.

COLUMN 14

Line 4, "above mentioned" should read
 --above-mentioned--.
Line 15, "have" should read --to have--.
Line 45, "(100 mW/cm2)" should read --(100 mW/cm$^2$)--.
Line 64, "non=-" should read --non- --.
Line 67, "non crystal" should read --non-crystal--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 15

Line 14, "contanining" should read --containing--.
Line 15, "crystal grain" should read --crystal grain boundaries or in the intercrystal space, with the dangling--.
Line 20, "does" should read --does not--.
Line 21, "Incidentially," should read --Incidentally,--.
Line 32, "(on quartz substrate)" should read --(on quartz substrate).--.
Line 63, "electron" should read --electrons--.

COLUMN 16

Line 15, "atom" should read --atoms--.

COLUMN 17

Line 17, "1.5 X $10_{-5}$X (1-x)" should read --1.5 X $10^{-5}$(1-x)--.
Line 18, "mo./min." should read --mol/min.-- and "1.0 X $10_{-5}$X x" should read --1.0 X $10^{-5}$xx--.
Line 28, "depositing" should read --deposition--.
Line 38, "of" should be deleted.

COLUMN 18

Line 5, "(1-X)" should read --(1-x)--.
Line 6, "1.0 X $10^{-5}$ Xx mol/min." should read --1.0 X $10^{-5}$xx mol/min.--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

Page 5 of 19

It is certified that error appears in the above-identified patent and that said Letters Patent is hereby corrected as shown below:

COLUMN 18

Line 30, "ZnSe$_{1-x}$Te$_x$H" should read --ZnSe$_{1-x}$Te$_x$:H--.
Line 36, "Experimental I: Observation" should read --Experiment I: Observations--.
Line 43, "(a)" should read --(A)--.
Line 57, "ZnSe$_{1-x}$Te$_x$H" should read --ZnSe$_{1-x}$Te$_x$:H--.
Line 59, "(1-x):s" should read --(1-x):x--.

COLUMN 19

Line 3, "ZnSe$_{1-x}$Te:H" should read --ZnSe$_{1-x}$Te$_x$:H--.
Line 12, "pendency" should read --dependency--.
Line 13, "ZnSe$_{1-x}$T$_e$:H" should read --ZnSe$_{1-x}$Te$_x$:H--.
Line 15, "ZnSe$_{1-x}$T$_e$:H" should read --ZnSe$_{1-x}$Te$_x$:H--.
Line 19, "ZnSe$_{1-x}$T$_e$:H" should read --ZnSe$_{1-x}$Te$_x$:H--.
Line 22, "ZnSe$_{1-x}$T$_e$:H" should read --ZnSe$_{1-x}$Te$_x$:H--.
Line 55, "ZnSe$_{1-x}$T$_e$:H" should read --ZnSe$_{1-x}$Te$_x$:H--.
Line 56, "ZnSe$_{1-x}$T$_e$:H:M films" should read --ZnSe$_{1-x}$Te$_x$:H:M films--.
Line 66, "T$_e$:H:Li films" should read --Te$_x$:H:Li films,--.
Line 67, "n-type ZnSe$_{1-x}$T$_e$:HA1 films, TEA1 [(C$_2$H$_{43}$A1]" should read --n-type ZnSe$_{1-x}$Te$_x$:H:Al films, TEA1 [(C$_2$H$_4$)$_3$Al]--.

COLUMN 20

Line 1, "ZnSe$_{1-x}$Te:H" should read --ZnSe$_{1-x}$Te$_x$:H--.
Line 2, "not" should be deleted.

UNITED STATES PATENT AND TRADEMARK OFFICE
CERTIFICATE OF CORRECTION

PATENT NO. : 4,888,062

DATED : December 19, 1989

INVENTOR(S) : KATSUMI NAKAGAWA, ET AL.

It is certified that error appears in the above-identified patent and that said Letters Patent is hereby corrected as shown below:

COLUMN 20

Line 16, "non doped $ZnSe_{1-x}T_e:H$ film" should read
--non-doped $ZnSe_{1-x}Te_x:H$ film--.

Line 17, "$ZnSe_{1-x}T_e:H:M$ film" should read
--$ZnSe_{1-x}Te_x:H:M$ film--.

Line 20, "$1.0 \times 10^{-5}X$ x mol/min." should read --$1.0 \times 10^{-5}$xx mol/min.--.

Line 65, "$ZnSe_{1-x}T_e:H$ film" should read
--$ZnSe:H$ film--.

Line 68, "1 to 4 atomic" should read
--1 to 4 atomic %--.

COLUMN 21

Line 9, "$ZnSe_{1-x}T_e:H$" should read --$ZnSe_{1-x}Te_x:H$--.

Line 11, "an" should read --and--.

Line 12, "se atoms" should read --Se atoms--.

Line 20, "terms in number" should read --in terms of number--.

Line 25, "$ZnSe_{1-x}T_e:H$" should read --$ZnSe_{1-x}Te_x:H$--.

Line 26, "re-" should read --is re- --.

Line 31, "$ZnSe_{1-x}T_e:H$" should read --$ZnSe_{1-x}Te_x:H$--.

Line 32, "there into" should read --thereinto--.

Line 36, "describe," should read --described,--.

Line 37, "$T_e:H$ films" should read --$Te_x:H$ films--.

Line 39, "there into." should read --thereinto.--.

Line 42, "$T_e:H:M_p$ film" should read --$Te_x:H:M_p$ film--.

Line 48, "$ZnSe_{1-x}T_e:H:M_p$" should read --$ZnSe_{1-x}Te_x:H:M_p$--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 21

Line 56, "$ZnSe_{1-x}T_e:H:M_p$" should read --$ZnSe_{1-x}Te_x:H:M_p$--.
    Line 63, "$ZnSe_{1-x}T_e:H:M_n$" should read --$ZnSe_{1-x}Te_x:H:M_n$--.
    Line 66, "$T_e:H:M_n$ films" should read --$Te_x:H:M_n$ films--.

COLUMN 22

Line 10, "$ZnSe_{1-x}T_e:H:M_n$" should read --$ZnSe_{1-x}Te_x:H:M_n$--.
    Line 22, "na" should read --an--.
    Line 24, "lattic" should read --lattice--.
    Line 34, "mismatch etc." should read --mismatch, etc.--.
    Line 37, "ZxSe:H," should read --ZnSe:H,-- and
    "$ZnSe_{1-x}T_e:H$" should read --$ZnSe_{1-x}Te_x:H$--.
    Line 38, "$ZnSe_{1-x}T_e:H:M_n$" should read --$ZnSe_{1-x}Te_x:H:M_n$--.
    Line 45, "$ZnSe_{1-x}T_e$ and $ZnSe_{1-x}T_e:H:M_n$" should read
    --ZnSe:M, $ZnSe_{1-x}Te_x$ and $ZnSe_{1-x}Te_x:M$ films
    particularly in--.
    Line 47, "$ZnSe_{1-x}T_e:H:M_p$" should read --$ZnSe_{1-x}Te_x:H:M_p$--.
    Line 63, "($\Delta p$)" should read --($\delta p$)--.

COLUMN 23

Line 23, "$ZnSe_{1-x}Te_x:H:M_p$" should read --$ZnSe_{1-x}Te_x:H$--.
    Line 34, "$ZnSe_{1-x}Te_x:H$" should read --$ZnSe_{1-x}Te_x:H:M$--.

COLUMN 24

Line 5, "effieciency" should read --efficiency--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 25

Line 60, "view points" should read --viewpoints-- and "handling" should read --handling convenience--.

COLUMN 26

Line 16, "kind" should read --kind of--.
    Line 26, "a" should read --an--.
    Line 65, "the elements constituting" should be deleted.

COLUMN 27

Line 45, "or" should read --a--.
    Line 56, "of" should be deleted.

COLUMN 28

Line 18, "n type." should read --n-type.--.
    Line 26, "ZnSe semiconductor film" should read --ZnSe:H semiconductor film--.
    Line 27, "$Te_x$ semiconductor film," should read ----$Te_x$:H semiconductor film,--.
    Line 28, "a (b)" should read --(b)--.
    Line 45, "a" should read --an--.
    Line 47, "a" should read --an--.
    Line 50, "n-type nSe," should read --n-type ZnSe,--.
    Line 51, "p-type Znte" should read --p-type ZnTe--.
    Line 56, "$Te_x$:H:MN" should read --$Te_x$:H:Mn--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 29

Line 52, "$ZnSe_{1x}Te_x:H$" should read --$ZnSe_{1-x}Te_x:H$--.

COLUMN 30

Line 40, "$ZnSe_{1-x}Te_xH$ film" should read --$ZnSe_{1-x}Te_x:H$ film--.

COLUMN 33

Line 33, "nm." should read --mm.--.

COLUMN 34

Line 52, "ZeSe thin film" should read --ZnSe thin film--.

COLUMN 36

Line 21, "In the, the above" should read --In the above, the--.
Line 26, "placed" should read --placed,--.

COLUMN 37

Line 9, "A" should read --An--.
Line 34, "place" should read --plate--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 38

Line 40, "place" should read --plate--.

COLUMN 39

Line 21, "a" should read --an--.
    Line 35, "place" should read --plate--.

COLUMN 40

Line 11, "deposited" should read --deposit--.
    Line 15, "film" should read --film,-- and "a" (second occurrence) should read --an--.
    Line 31, "place" should read --plate--.
    Line 51, "a" should read --an--.

COLUMN 41

Line 9, "a" should read --an--.
    Line 28, "place" should read --plate--.
    Line 50, "a" should read --an--.

COLUMN 42

Line 26, "place" should read --plate--.
    Line 48, "a" should read --an--.

UNITED STATES PATENT AND TRADEMARK OFFICE
CERTIFICATE OF CORRECTION

PATENT NO. : 4,888,062

DATED : December 19, 1989

INVENTOR(S) : KATSUMI NAKAGAWA, ET AL.

It is certified that error appears in the above-identified patent and that said Letters Patent is hereby corrected as shown below:

COLUMN 43

Line 1, "ZnSe:HLi" should read --ZnSe:H:Li--.
Line 24, "place" should read --plate--.
Line 46, "a" should read --an--.

COLUMN 44

Line 23, "place" should read --plate--.
Line 61, "a" should read --an--.

COLUMN 45

Line 23, "a" should read --an--.
Line 68, "a" should read --an--.

COLUMN 46

Line 35, "a-Si:H:B film" should read --A-Si:H:B film--.
Line 56, "pin -junc-" should read --pin junc- --.

COLUMN 47

Line 54, "ZnS:Al film" should read --a ZnS:Al film,--.

COLUMN 48

Line 8, "A-si pin" should read --A-Si pin--.
Line 21, "shown" should read --known--.
Line 37, "film forming" should read --film-forming--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

Page 12 of 19

It is certified that error appears in the above-identified patent and that said Letters Patent is hereby corrected as shown below:

COLUMN 49

Line 38, "know" should read --known--.
Line 51, "A" should read --An--.

COLUMN 50

Line 8, "place" should read --plate--.
Line 63, "film forming" should read --film-forming--.

COLUMN 51

Line 13, "place" should read --plate--.
Line 45, "n-type $ZnSez_{1-x}Te_x$:-" should read --n-type $ZnSe_{1-x}Te_x$:- --.

COLUMN 52

Line 10, "place" should read --plate--.
Line 21, "If" should read --In--.
Line 23, "p-type" should read --n-type--.
Line 44, "n-tye" should read --n-type--.
Line 62, "a" should read --an--.

COLUMN 53

Line 4, "quartz," should read --quartz--.
Line 10, "place" should read --plate--.
Line 31, "a" should read --an--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 53

Line 54, "$ZnSe_{1-x}Te_xH:Li$ film-- should read --$ZnSe_{1-x}Te_x:H:Li$ film--.
    Line 57, "a" should read --an--.
    Line 67, "provide" should read --provided--.

COLUMN 54

Line 4, "$ZnSe_{1-x}Te_xH$" should read --$ZnSe_{1-x}Te_x:H$--.
    Line 8, "place" should read --plate--.
    Line 30, "a" should read --an--.

COLUMN 55

Line 7, "place" should read --plate--.
    Line 29, "a" should read --an--.
    Line 31, "and" should read --an--.
    Line 32, "n-type $ZnSe_{1-x}:H:Al$ film" should read --n-type $ZnSe_{1-x}Te_x:H:Al$ film--.
    Line 55, "ITO film" should read --ITO thin film--.

COLUMN 56

Line 6, "place" should read --plate--.
    Line 28, "a" should read --an--.
    Line 38, "prepraration" should read --preparation--.
    Line 54, "a" should read --an--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

Page 14 of 19

It is certified that error appears in the above-identified patent and that said Letters Patent is hereby corrected as shown below:

COLUMN 57

Line 5, "place" should read --plate--.
Line 19, "92,]" should read --92],--.
Line 43, "a" should read --an--.

COLUMN 58

Line 14, "a" should read --an--.
Line 64, "a" should read --an--.

COLUMN 59

Line 3, "film forming" should read --film-forming--.
Line 12, "high fre-" should read --high-fre- --.
Line 31, "a-Si:H:B film" should read --A-Si:H:B film--.
Line 38, "evaluation" should be deleted.
Line 58, "$\eta$ 72" should read --$\Delta \eta$--.

COLUMN 60

Line 16, "any" should be deleted.
Line 68, "rates" should read --rates of--.

COLUMN 61

Line 6, "ZnSe$_{1-x}$Te$_x$:H" should read --ZnSe$_{1-x}$Te$_x$:H--.
Line 34, "Comparative Example t," should read --Comparative Example 5,--.

UNITED STATES PATENT AND TRADEMARK OFFICE
CERTIFICATE OF CORRECTION

PATENT NO. : 4,888,062

DATED : December 19, 1989

INVENTOR(S) : KATSUMI NAKAGAWA, ET AL.

It is certified that error appears in the above-identified patent and that said Letters Patent is hereby corrected as shown below:

COLUMN 63

TABLE 6(B), "○:excellent" should read --◎:excellent--.

COLUMN 65

TABLE 11, "SEZn" should read --DEZn--.

COLUMN 70

TABLE 18, "1.1  3.1  4    should      --1.1  2.8  2
          1.1  2.8  2    read           1.1  2.9  5--.
          1.1  2.9  5
          1.1  2.9  5"

and     "69   1.05   2.5   1
         7.1"                should read

--69   1.05   2.5   1
          71--.

COLUMN 75

TABLE 24, "He      10 sccm    5 sccm    10 sccm"
should read

--He      10 sccm         5 sccm    10 sccm
  TEA 1   $3.0 \times 10^{-9}$ mol/min    --        $1.0 \times 10^{-9}$ mol/min--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 77

TABLE 29, "A   DEZn     should  --A   DEZn
          He        read       He
          $LiC_3H_7$                 $LiC_3H_7$
  B   DET3              B   DETe
          He "                  He --.

and "Target: ZnTe          --        0.05 Torr
     A    $LiC_3H_7$              1.5 X $10^{-9}$ mol/min
         Ar                      10 sccm "

should read

--Target: ZnTe          --                0.05 Torr
   A    $LiC_3H_7$     1.5 X $10^{-9}$ mol/min
       Ar           10 sccm --.

COLUMN 79

TABLE 34, "$ZnSe_{2-x}Te_x$ film" should read
--$ZnSe_{1-x}Te_x$ film--.

COLUMN 80

TABLE 35, " 450 nm interference (filter)" should read

-- 450 nm interference filter)--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 80

TABLE 36,    " 450 nm inter-
                     ference (filter)"      should read -- 450 nm inter-
                 ference filter)--.

TABLE 37,    " 450 nm inter-
                     ference (filter)"      should read -- 450 nm inter-
                 ference filter)--.

COLUMN 82

TABLE 37-continued,

" 450 nm inter-
              ference (filter)"      should read

-- 450 nm inter-
                ference filter)--.

TABLE 39,    " 450 nm inter-
                     ference (filter)"      should read -- 450 nm inter-
                 ference filter)--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 84

TABLE 39-continued, " 450 nm interference (filter)"   should read   -- 450 nm interference filter)--.

TABLE 40,   " 450 nm interference (filter)"   should read   -- 450 nm interference filter)--.

COLUMN 86

TABLE 41,   " 450 nm interference (filter)"   should read   -- 450 nm interference filter)--.

TABLE 42,   " 450 nm interference (filter)"   should read   -- 450 nm interference filter)--.

UNITED STATES PATENT AND TRADEMARK OFFICE
CERTIFICATE OF CORRECTION

PATENT NO. : 4,888,062
DATED : December 19, 1989
INVENTOR(S) : KATSUMI NAKAGAWA, ET AL.

It is certified that error appears in the above-identified patent and that said Letters Patent is hereby corrected as shown below:

COLUMN 86

Line 66, "atoms the" should read --atoms; the--.
Line 68, "3:7 said" should read --3.7; said--.

Signed and Sealed this

Twenty-seventh Day of December, 1994

Attest:

BRUCE LEHMAN

Attesting Officer          Commissioner of Patents and Trademarks